(12) United States Patent
Lee et al.

(10) Patent No.: US 8,239,741 B2
(45) Date of Patent: Aug. 7, 2012

(54) TRANSMITTING/RECEIVING SYSTEM AND METHOD OF PROCESSING DATA IN THE TRANSMITTING/RECEIVING SYSTEM

(75) Inventors: Hyoung Gon Lee, Seoul (KR); In Hwan Choi, Seoul (KR); Kook Yeon Kwak, Gyeonggi-do (KR); Won Gyu Song, Seoul (KR); Byoung Gill Kim, Seoul (KR); Jin Woo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 716 days.

(21) Appl. No.: 12/417,528

(22) Filed: Apr. 2, 2009

(65) Prior Publication Data

US 2009/0271687 A1 Oct. 29, 2009

Related U.S. Application Data

(60) Provisional application No. 61/041,928, filed on Apr. 3, 2008.

(30) Foreign Application Priority Data

Jul. 4, 2008 (KR) .................. 10-2008-0065171

(51) Int. Cl.
*G06F 11/00* (2006.01)
(52) U.S. Cl. ........................ 714/784; 714/748

(58) Field of Classification Search ............. 714/748, 714/792, 784, 749–751, 759
See application file for complete search history.

(56) References Cited

U.S. PATENT DOCUMENTS

| | | | |
|---|---|---|---|
| 7,782,958 B2 * | 8/2010 | Lee et al. | 375/240.24 |
| 8,059,723 B2 * | 11/2011 | Lee et al. | 375/240.26 |
| 8,094,727 B2 * | 1/2012 | Hong et al. | 375/240.25 |

FOREIGN PATENT DOCUMENTS

WO 2008054044 5/2008

\* cited by examiner

*Primary Examiner* — Dieu-Minh Le
(74) *Attorney, Agent, or Firm* — Lee, Hong, Degerman, Kang & Waimey

(57) ABSTRACT

A digital broadcasting system and a data processing method of the same are disclosed. The receiving system includes a receiving unit, a demodulator, a block decoder, and an RS frame decoder. The receiving unit receives a broadcast signal including mobile service data divided into a plurality of output masses, signaling information associated with the mobile service data, and known data. The demodulator demodulates the received broadcast signal. The block decoder block-decodes the demodulated mobile service data of the plurality of output masses based upon the signaling information, thereby outputting the mobile service data of one output mass. And, the RS frame decoder configures an RS frame with the block-decoded and outputted mobile service data, and performs error-correction decoding on the corresponding mobile service data in RS frame units.

20 Claims, 37 Drawing Sheets

FIG. 21A

| SGN | Description |
|---|---|
| 0000 | Starting group number = 1 |
| 0001 | Starting group number = 2 |
| 0010 | Starting group number = 3 |
| 0011 | Starting group number = 4 |
| 0100 | Starting group number = 5 |
| 0101 | Starting group number = 6 |
| 0110 | Starting group number = 7 |
| 0111 | Starting group number = 8 |
| 1000 | Starting group number = 9 |
| 1001 | Starting group number = 10 |
| 1010 | Starting group number = 11 |
| 1011 | Starting group number = 12 |
| 1100 | Starting group number = 13 |
| 1101 | Starting group number = 14 |
| 1110 | Starting group number = 15 |
| 1111 | Starting group number = 16 |

FIG. 21B

| NOG | Description |
|---|---|
| 000 | Number of groups per a sub-frame = 1 |
| 001 | Number of groups per a sub-frame =2 |
| 010 | Number of groups per a sub-frame = 3 |
| 011 | Number of groups per a sub-frame = 4 |
| 100 | Number of groups per a sub-frame = 5 |
| 101 | Number of groups per a sub-frame = 6 |
| 110 | Number of groups per a sub-frame = 7 |
| 111 | Number of groups per a sub-frame = 8 |

FIG. 21C

| ETP | Description |
|---|---|
| 00 | This ensemble is repeated in every ensemble |
| 01 | This ensemble is repeated in every 2 ensembles |
| 10 | This ensemble is repeated in every 3 ensembles |
| 11 | reserved |

FIG. 23

| Field | Description | No. of bits |
|---|---|---|
| Sub-frame count | Counter value of a sub-frame in an MPH frame : 1 ~ 5 | 3 |
| Slot count | Counter value of a slot in a sub-frame : 1 ~ 16 | 4 |
| Ensemble_id | Ensemble identifier (1 ~ 16) | 4 |
| SGN | Starting group number (1 ~ 16) | 4 |
| NOG | Number of groups per a sub-frame (1 ~ 8) | 3 |
| ETP | Ensemble transmission period | 2 |

TRANSMITTING/RECEIVING SYSTEM AND METHOD OF PROCESSING DATA IN THE TRANSMITTING/RECEIVING SYSTEM

This application claims the benefit of U.S. Provisional Application No. 61/041,928, filed on Apr. 3, 2008, which is hereby incorporated by reference as if fully set forth herein. And this application claims the benefit of Korean Application No. 10-2008-0065171, filed on Jul. 4, 2008, which is hereby incorporated by reference.

BACKGROUND OF THE INVENTION

1. Field of the Invention

The present invention relates to a transmitting system for transmitting a digital broadcasting signal, a receiving system for receiving the digital broadcasting signal transmitted from the transmitting system, and a method of processing data in the transmitting system and the receiving system.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting/receiving system and a data processing method that substantially obviate one or more problems due to limitations and disadvantages of the related art.

An object of the present invention is to provide a transmitting/receiving system and a data processing method that are highly resistant to channel changes and noise.

Another object of the present invention is to provide a transmitting/receiving system and a data processing method that can enhance the receiving performance of the receiving system by performing additional encoding on mobile service data and by transmitting the processed data to the receiving system.

A further object of the present invention is to provide a transmitting/receiving system and a data processing method that can also enhance the receiving performance of the receiving system by inserting known data already known in accordance with a pre-agreement between the receiving system and the transmitting system in a predetermined region within a data region.

A further object of the present invention is to provide a transmitting/receiving system and a data processing method that can also enhance the receiving performance of the receiving system by diversifying mobile service data into time/frequency section and transmitting the diversified mobile service data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transmitting system may include a service multiplexer and a transmitter. The service multiplexer may multiplex mobile service data and main service data at a predetermined data rate and may transmit the multiplexed data to the transmitter. The transmitter may perform additional encoding on the mobile service data being transmitted from the service multiplexer. The transmitter may also group a plurality of additionally encoded mobile service data packets so as to form a data group. The transmitter may multiplex mobile service data packets including mobile service data and main service data packets including main service data and may transmit the multiplexed data packets to a receiving system.

The transmitter may diversify mobile service data into a plurality of time sections and transmit the diversified mobile service data.

The transmitter may diversify mobile service data into a plurality of frequency sections and transmit the diversified mobile service data.

Herein, the data group may be divided into a plurality of regions depending upon a degree of interference of the main service data. Also, a long known data sequence may be periodically inserted in regions without interference of the main service data. Also, a receiving system according to an embodiment of the present invention may be used for demodulating and channel equalizing the known data sequence.

In another aspect of the present invention, a receiving system includes a receiving unit, a demodulator, a block decoder, and a Reed-Solomon (RS) frame decoder. The receiving unit receives a broadcast signal including mobile service data divided into a plurality of output masses, signaling information associated with the mobile service data, and known data. The demodulator demodulates the received broadcast signal. The block decoder block-decodes the demodulated mobile service data of the plurality of output masses based upon the signaling information, thereby outputting the mobile service data of one output mass. And, the Reed-Solomon (RS) frame decoder configures an RS frame with the block-decoded and outputted mobile service data, and performs error-correction decoding on the corresponding mobile service data in RS frame units.

Herein, the block decoder includes a plurality of input buffers, a plurality of inner decoders, a plurality of symbol deinterleavers, an outer symbol mapper, an outer decoder, an inner symbol mapper, a plurality of symbol interleavers, and an output buffer. The plurality of input buffers stores the mobile service data of a corresponding output mass, and repeatedly output the stored mobile service data in block sizes for turbo-decoding. The plurality of inner decoders matches data of a corresponding output mass being turbo-decoded and fed-back with data being outputted from a respective input buffer in block sizes for turbo-decoding, thereby performing trellis decoding. The plurality of symbol deinterleavers block-deinterleaves, in symbol units, soft-decision values of mobile service data of a corresponding output mass being trellis-decoded and outputted.

Also, the outer symbol mapper configures the plurality of soft-decision values being deinterleaved and outputted from the plurality of symbol deinterleavers into one soft-decision value. The outer decoder receives the soft-decision value from the outer symbol mapper and performs symbol decoding. The inner symbol mapper divides the soft-decision value being symbol-decoded and outputted from the outer decoder into the plurality of soft-decision values, and converts the divided soft-decision values to fit an input format of the inner decoder corresponding to the respective output mass. The plurality of symbol interleavers block-interleaves, in symbol units, the soft-decision values of the main service data of the corresponding output mass being outputted from the inner symbol mapper, thereby outputting the block-interleaved data to the inner decoder of the respective output mass. And, the output buffer stores the mobile service data symbol-decoded by the outer decoder, thereby outputting the stored mobile service data.

In another aspect of the present invention, a data processing method of a digital broadcast receiving system includes the steps of receiving a broadcast signal including mobile service data divided into a plurality of output masses, signaling information associated with the mobile service data, and known data, demodulating the received broadcast signal, block-decoding the demodulated mobile service data of multiple output masses based upon the signaling information, thereby outputting the mobile service data of one output mass, and configuring a Reed-Solomon (RS) frame with the block-decoded and outputted mobile service data, and performing error-correction decoding on the corresponding mobile service data in RS frame units.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 21A to FIG. 21C illustrate examples of transmission parameter according to the present invention;

FIG. 23 illustrates examples of MPH-related information among signaling information according to the present invention;

DETAILED DESCRIPTION OF THE INVENTION

Figure 1:
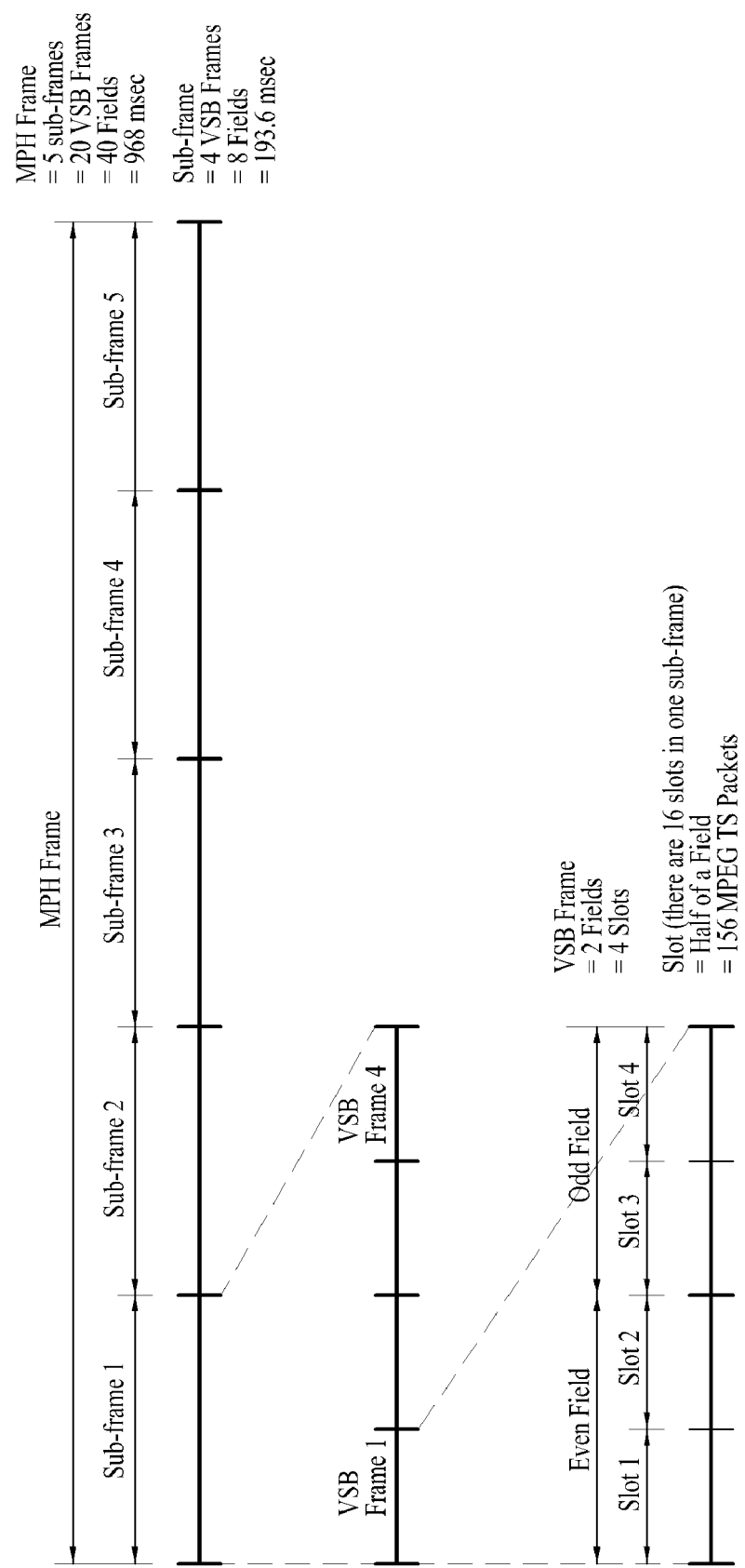
FIG. 1 illustrates a structure of a MPH frame for transmitting and receiving mobile service data according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "MPH" corresponds to the initials of "mobile", "pedestrian", and "handheld" and represents the opposite concept of a fixed-type system. Furthermore, the MPH service data may include at least one of mobile service data, pedestrian service data, and handheld service data, and will also be referred to as "mobile service data" for simplicity. Herein, the mobile service data not only correspond to MPH service data but may also include any type of service data with mobile or portable characteristics. Therefore, the mobile service data according to the present invention are not limited only to the MPH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

MPH Frame Structure

In the embodiment of the present invention, the mobile service data are modulated in a VSB mode and transmitted to the receiving system. At this point, the transmitter groups a plurality of mobile service data packets to form a RS frame so as to perform an encoding process for error correction. Then, data included in the error correction encoded RS frame are allocated to a plurality of data groups. Subsequently, the plurality of data groups are multiplexed with the main service data within an MPH frame, thereby transmitted to the receiving system. In the embodiment of the present invention, a plurality of data groups to which the data included in the error correction encoded RS frame are allocated configures an ensemble. More specifically, the data groups within an ensemble share the same ensemble identification (ID). At this point, since a plurality of mobile services may be included in one RS frame, a plurality of mobile services may also be included in one ensemble. Each mobile service within an ensemble (or RS frame) may be referred to a virtual channel.

A method of allocating the data groups included in an ensemble within a single MPH frame will be described in detail in a later process. At this point, one MPH frame consists of K1 number of sub-frames, wherein one sub-frame includes K2 number of VSB frames. Each VSB frame consists of K3 number of slots. In the embodiment of the present invention, K1 will be set to 5, K2 will be set to 4, and K3 will be set to 4 (i.e., K1=5, K2=4, and K3=4). The values for K1, K2, and K3 presented in this embodiment either correspond to values according to a preferred embodiment or are merely exemplary. Therefore, the above-mentioned values will not limit the scope of the present invention.

FIG. 1 illustrates a structure of a MPH frame for transmitting and receiving mobile service data according to the present invention. In the example shown in FIG. 1, one MPH frame consists of 5 sub-frame, wherein each sub-frame includes 4 VSB frames, and wherein each VSB frame includes 4 slots. In this case, the MPH frame according to the present invention includes 5 sub-frames, 20 VSB frames, and 80 slots.

Figure 2:
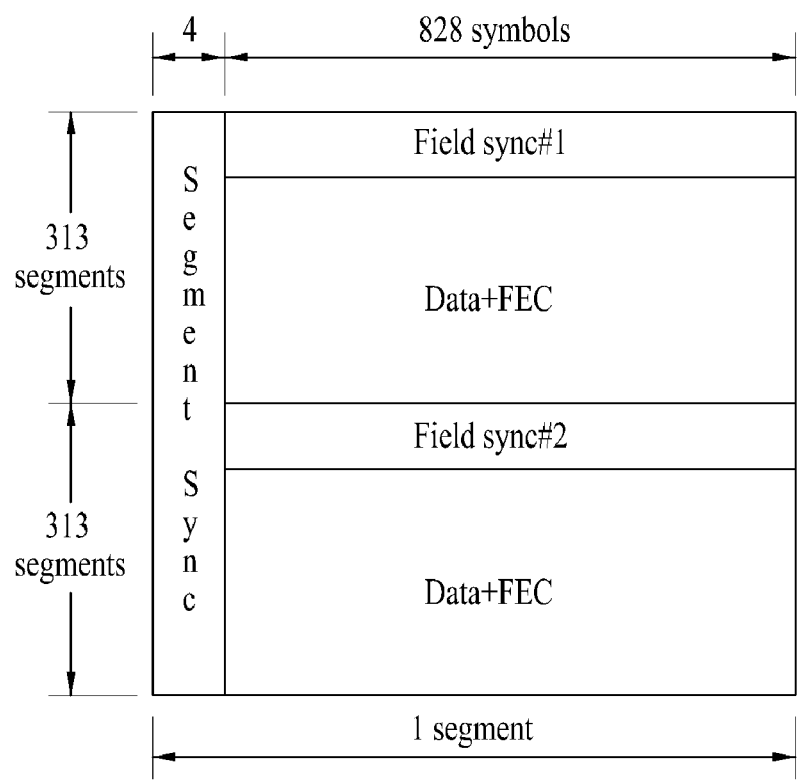
FIG. 2 illustrates an exemplary structure of a VSB frame.

FIG. 2 illustrates an exemplary structure of a VSB frame, wherein one VSB frame consists of 2 fields (i.e., an odd field and an even field). Herein, each field includes a field synchronization segment and 312 data segments. More specifically, 2 slots are grouped to form one field, and 2 slots are grouped to form one VSB frame. Therefore, one slot includes 156 data segments (or packets).

General Description of the Transmitting System

Figure 3:
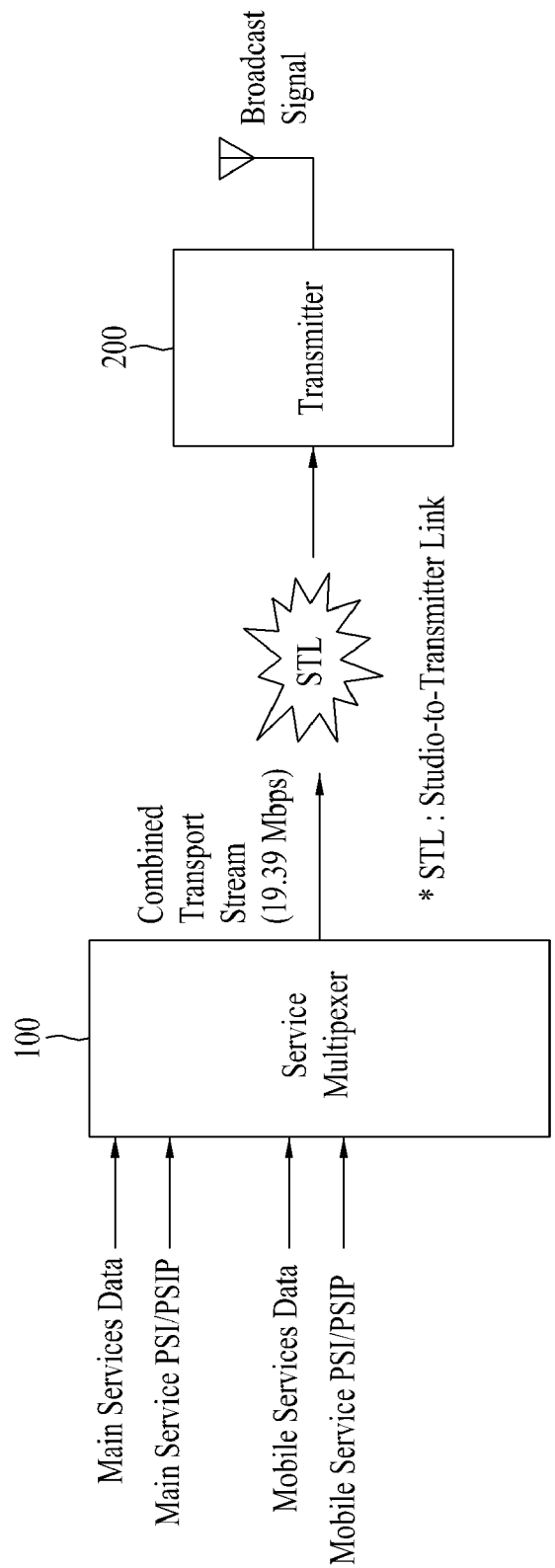
FIG. 3 is a block diagram showing a general structure of a transmitting system according to an embodiment of the present invention.

FIG. 3 illustrates a block diagram showing a general structure of a transmitting system according to an embodiment of the present invention. Herein, the transmitting system includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. This corresponds to data transmission using Single Frequency Network (SFN). Accordingly, in the receiving system, a channel equalizer may compensate signal distortion, which is caused by a reflected wave, so as to recover the original signal. In another example, the plurality of transmitters may have different frequencies with respect to the same channel. This corresponds to data transmission using Multi Frequency Network (MFN).

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8 VSB mode, the output data rate is 19.39 Mbps, and, in case of the 16 VSB mode, the output data rate is 38.78 Mbps. Furthermore, in the conventional 8 VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information/program and system information protocol (PSI/PSIP) table data for each mobile service so as to encapsulate the received data to each TS packet. Also, the service multiplexer 100 receives at least one type of main service data and PSI/PSIP table data for each main service and encapsulates the received data to a transport stream (TS) packet. Subsequently, the TS packets are multiplexed according to a predetermined multiplexing rule and outputs the multiplexed packets to the transmitter 200.

Service Multiplexer

Figure 4:
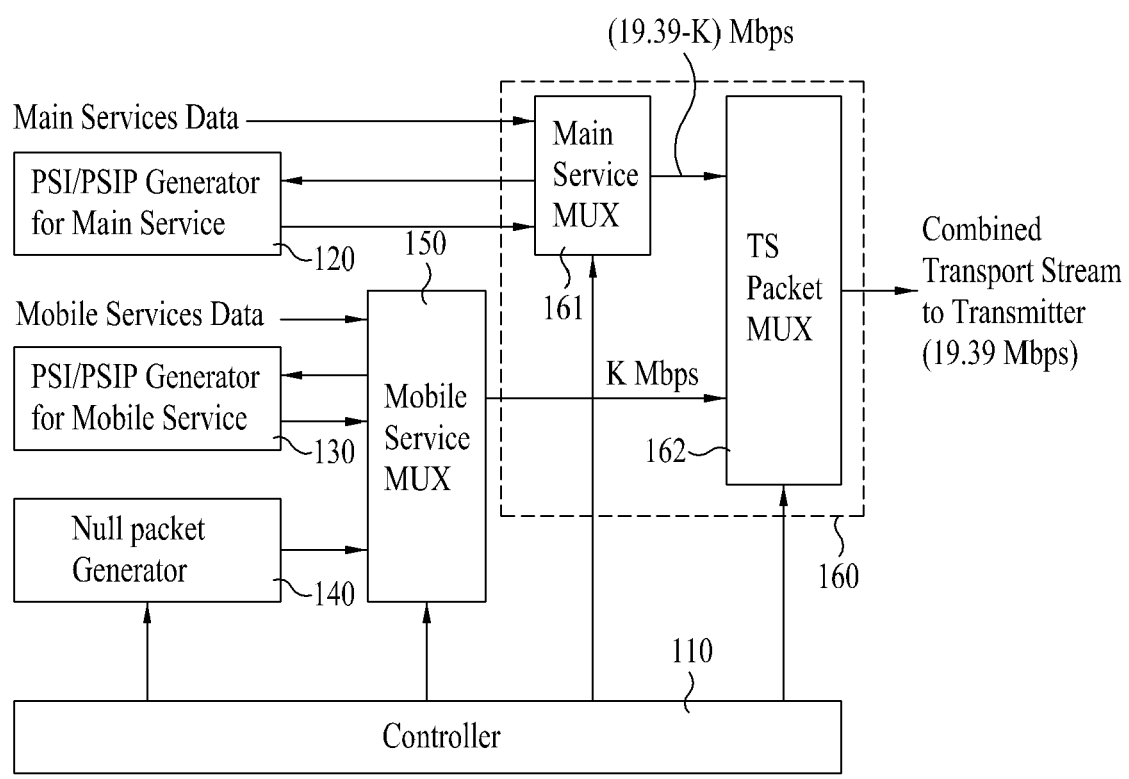
FIG. 4 is a block diagram showing an example of a service multiplexer of FIG. 3.

FIG. 4 illustrates a block diagram showing an example of the service multiplexer. The service multiplexer includes a controller 110 for controlling the overall operations of the service multiplexer, a PSI/PSIP generator 120 for the main service, a table information generator 130 for the mobile service, a null packet generator 140, a mobile service multiplexer 150, and a transport multiplexer 160. According to the embodiment of the present invention, the table information generator 130 generates table data, which is configured in the form of an MPEG-2 private section. For example, the table information generator 130 generates PSI/PSIP table data.

The transport multiplexer 160 may include a main service multiplexer 161 and a transport stream (TS) packet multiplexer 162.

Referring to FIG. 4, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the table information generator 130 for the mobile service are inputted to the mobile service multiplexer 150. The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity. At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet. As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed. As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification. Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps. Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form. Then, the above-described TS packets are multiplexed with the null data packets and, then, outputted to the TS packet multiplexer 162. Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

Herein, the transmission parameter may include data group information, region information within the data group, RS frame information, super frame information, MPH frame information, ensemble information, and RS code information. The transmission parameter may also include information on how signals of a symbol domain are encoded in order to transmit the mobile service data, and multiplexing information on how the main service data and the mobile service data or various types of mobile service data are multiplexed.

The information included in the transmission parameter is merely exemplary to facilitate the understanding of the present invention.

And, the adding and deleting of the information included in the transmission parameter may be easily modified and changed by anyone skilled in the art. Therefore, the present invention is not limited to the examples proposed in the description set forth herein.

Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 5:
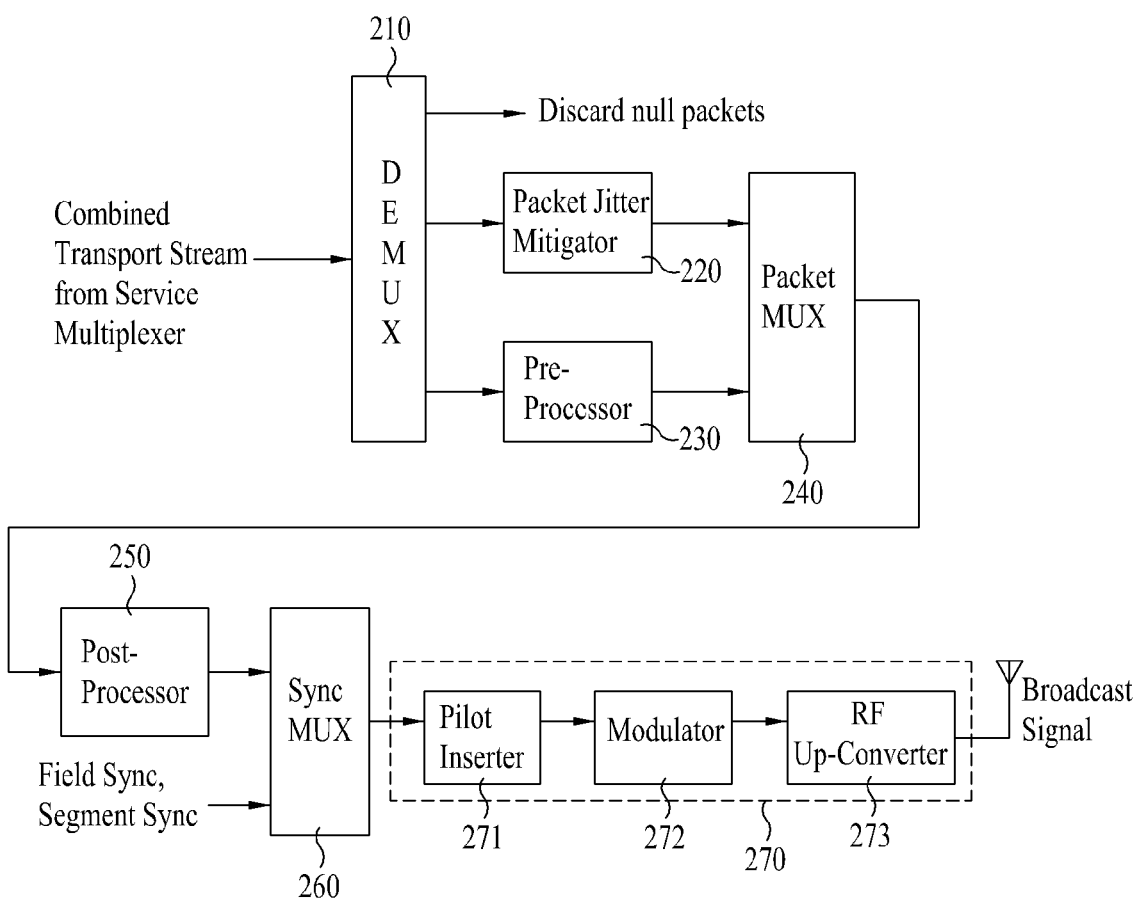
FIG. 5 is a block diagram showing an embodiment of a transmitter of FIG. 3.

FIG. 5 illustrates a block diagram showing an example of the transmitter 200 according to an embodiment of the present invention. Herein, the transmitter 200 includes a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined regions within the data group.

Also, by diversifying (or dispersing) the input data by time and/or frequency, the pre-processor 230 is made to be more robust against the burst noise than that of the related art. Hereinafter, the process of scattering and transmitting the input data by time and/or frequency will be referred to as diversity transmission for simplicity. Additionally, the number of times the data of the same information are divided and transmitted over different time sections or frequency sections will be referred to as a diversity degree.

The process of scattering the input data by time, the process of scattering the input data by frequency, and the process of scattering the input data by time and frequency will hereinafter be separately described.

The input data may correspond to mobile service data, or correspond to known data, or correspond to signaling information, such as a transmission parameter. The process of scattering and transmitting the mobile service data by time and/or frequency will be described as an embodiment of the present invention.

The Pre-Processor of a First Embodiment

The pre-processor according to the first embodiment to the present invention is for scattering the mobile service data on the time section as many times as the diversity degree, thereby outputting the scattered data.

Figure 6:
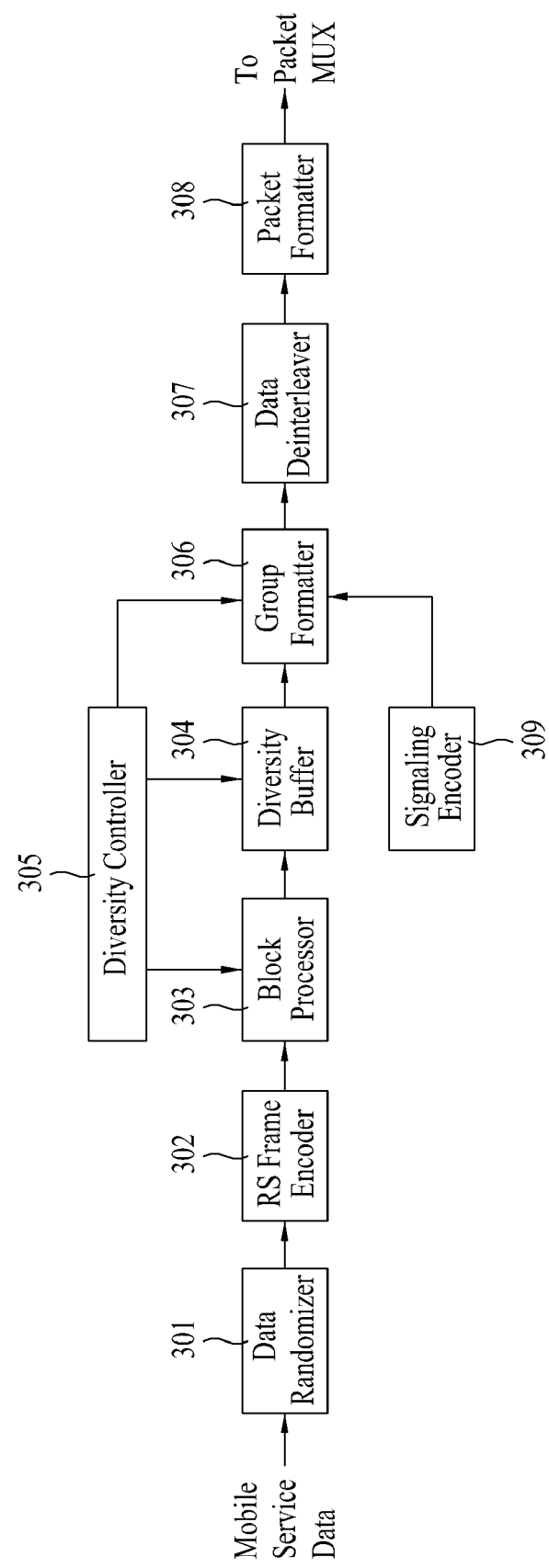
FIG. 6 is a block diagram showing an example of a pre-processor of FIG. 5.

FIG. 6 illustrates a block diagram showing the structure of the pre-processor 230 according to the first embodiment of the present invention. Herein, the pre-processor 230 includes a data randomizer 301, an RS frame encoder 302, a block processor 303, a diversity buffer 304, a diversity controller 305, a group formatter 306, a data deinterleaver 307, a packet formatter 308, and a signaling encoder 309.

The data randomizer 301 within the above-described pre-processor 230 randomizes the mobile service data packet including the mobile service data that is inputted through the demultiplexer 210. Then, the data randomizer 301 outputs the randomized mobile service data packet to the RS frame encoder 302. At this point, since the data randomizer 301 performs the randomizing process on the mobile service data, the randomizing process that is to be performed by the data randomizer 601 of the post-processor 250 on the mobile service data may be omitted. The data randomizer 301 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 302 groups a plurality of mobile service data packets that is randomized and inputted, so as to create a RS frame. Then, the RS frame encoder 302 performs at least one of an error correction encoding process and an error detection encoding process in RS frame units. Accordingly, robustness may be provided to the mobile service data, thereby scattering group error that may occur during changes in a frequency environment, thereby enabling the mobile service data to respond to the frequency environment, which is extremely vulnerable and liable to frequent changes.

Also, the RS frame encoder 302 groups a plurality of RS frames so as to create a super frame, thereby performing a row permutation process in super frame units. The row permutation process may also be referred to as a row interleaving process. Hereinafter, the process will be referred to as row permutation for simplicity.

More specifically, when the RS frame encoder 302 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS frame encoder 302. When performing the RS-encoding, parity data that are used for the error correction are generated. And, when performing the CRC encoding, CRC data that are used for the error detection are generated.

The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

Herein, the RS frame encoder 302 refers to a pre-determined transmission parameter and/or the transmission parameter provided from the service multiplexer 100 so as to perform operations including RS frame configuration, RS encoding, CRC encoding, super frame configuration, and row permutation in super frame units.

The mobile service data, which encoding process in RS frame units and row permutation process in super frame units performed, is output to the block processor 303.

The block processor 303 encodes the inputted mobile service data once again at a coding rate of 1/N (wherein N is an integer equal to or greater than 2, N≧2).

At this point, the diversity controller 305 controls the block processor 303 and the diversity buffer 304 in accordance with the designated diversity degree and transmission method (for example, any one diversity method by time, by frequency, and by time and frequency), thereby enabling the RS-frame-encoded mobile service data symbol to be transmitted to different symbol sections by time and/or frequency.

If the transmission method corresponds to a diversity method by time, the block processor 303 encodes the inputted mobile service data at a coding rate of 1/N. The block processor 303 then scatters the 1/N-rate encoded mobile service data within the time section as many times as the diversity degree, thereby outputting the scattered mobile service data to the diversity buffer 304. For example, when the coding rate is ¼, and when the diversity degree is '2', the mobile service data encoded at a coding rate of ¼ is divided and transmitted to two time sections. Herein, the ¼-rate encoded data refers to 1 bit of input data being encoded and outputted as 4 bits. In this case, 4 bits are not all outputted to the $k^{th}$ time order. Instead, 2 bits of the 4 bits are outputted to the $k^{th}$ time order, and the remaining 2 bits are outputted to the $(k+1)^{th}$ time order. In another example, when the coding rate is ⅙, and when the diversity degree is '3', the mobile service data encoded at a coding rate of ⅙ is divided and transmitted to three time sections. Herein, the ⅙-rate encoded data refers to 1 bit of input data being encoded and outputted as 6 bits. In this case, 6 bits are not all outputted to the $k^{th}$ time order. Instead, 2 bits of the 6 bits are outputted to the $k^{th}$ time order, the next 2 bits are outputted to the $(k+1)^{th}$ time order, and the remaining 2 bits are outputted to the $(k+2)^{th}$ time order. In yet another example, the same data may be scattered and outputted to multiple time sections. For example, 2 bits of ½-rate coded mobile service data may be repeatedly outputted to the $k^{th}$ time order and the $(k+1)^{th}$ time order.

The diversity buffer 304 temporarily stores the mobile service data scattered in the time section. Then, the diversity buffer 304 outputs the corresponding mobile service data in the decided order to the group formatter 306.

At this point, any one unit that can collectively process data, such as MPH block, MPH group, MPH frame, and so on, may be applied as the scattering (or dispersion) and transmission unit. In the present invention, the MPH frame will be described as the processing unit according to the first embodiment of the present invention.

More specifically, when data of one MPH frame section are encoded at the coding rate of ¼, and when the ¼-rate coded data are then scattered to two different time sections, the ¼-rate encoded data are scattered ands transmitted to two MPH frames.

Figure 9:
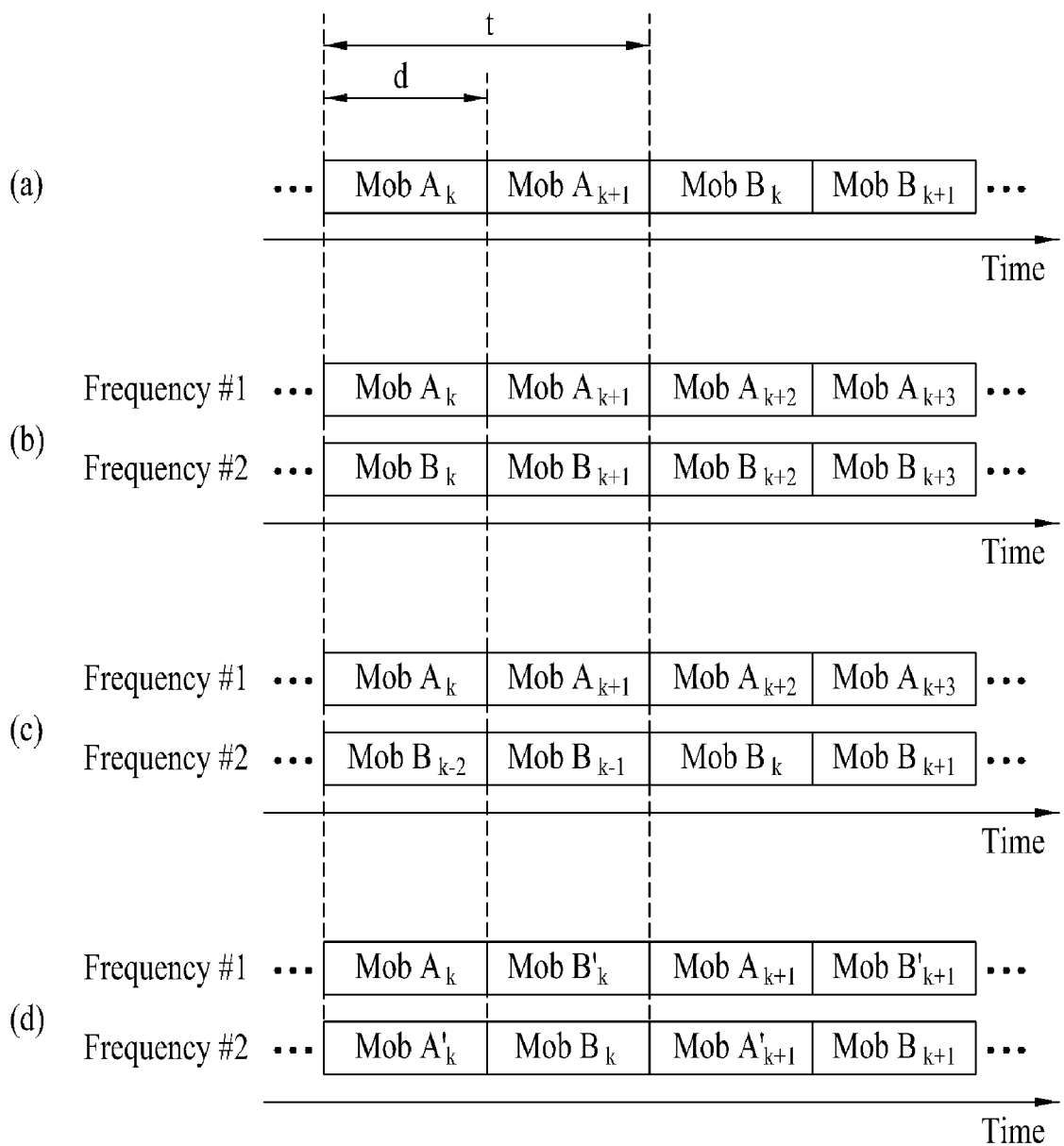
FIG. 9(a) to FIG. 9(d) illustrate examples of a diversity transmission according to the present invention.

Thereafter, when the block processor 303 encodes the data of two chronologically consecutive MPH frame sections at the coding rate of ¼ and then scatters the ¼-rate encoded data to 4 different time sections, the scattered data rate transmitted from the diversity buffer 304 as shown in FIG. 9(*a*). First of all, in the $k^{th}$ time order, the block processor 303 encodes the mobile service data of one MPH frame section at a coding rate of ¼. Then, the block processor 303 divides the ¼-rate encoded mobile service data into two output masses (or groups) (i.e., mob Ak, mob Bk), thereby outputting the processed mobile service data to the diversity buffer 304. For example, among the ¼-rate encoded mobile service data in one MPH frame section, one output mass outputs ½-rate encoded mobile service data (Ak), and another output mass outputs the remaining ½-rate encoded mobile service data (Bk). Additionally, in the $(k+1)^{th}$ time order, the block processor 303 encodes the mobile service data of a next MPH frame section at a coding rate of ¼. Then, the block processor 303 divides the ¼-rate encoded mobile service data into two output masses (i.e., mob Ak+1, mob Bk+1), thereby outputting the processed mobile service data to the diversity buffer 304.

The diversity buffer 304 temporarily stores the mobile service data (mob Ak, mob Bk, mob Ak+1, mob Bk+1) that are scattered and inputted. Then, the diversity buffer 304 outputs the temporarily stored mobile service data to the group formatter 306 by a pre-decided order. For example, as shown in FIG. 9(*a*), the mobile service data of each output mass are respectively carried over 4 MPH frame by the order of mob Ak, mob Bk, mob Ak+1, and mob Bk+1, thereby being outputted to the group formatter 306. More specifically, the diversity buffer 304 breaks down (or divides) mob Ak to group units, so that mob Ak can be first processed by the group formatter 306. Then, when the output of mob Ak is completed, mob Ak+1 is outputted. Thereafter, the remaining data are outputted using the same method by the order shown in FIG. 9(*a*).

The above-described output order of multiple output masses in the diversity buffer 304 is merely exemplary in order to facilitate the understanding of the present invention. According to another embodiment of the present invention, the diversity buffer 304 may also load the mobile service data of each output mass in 4 different MPH frames by the order of mob Ak, mob Bk, mob Ak+1, mob Bk+1, thereby outputting the corresponding mobile service data. As described above, the output order of multiple output masses in the diversity buffer 304 may be modified by the system designer. Therefore, the present invention will not be limited only to the example set forth herein.

Any data section that can group (or collect) and process data, such as an MPH group, an MPH frame, etc., may be used as the transmission unit d and the transmission cycle period t shown in FIG. 9(*a*) to FIG. 9(*d*).

In addition, various processing information for diversity transmission (hereinafter referred to as diversity processing information) are modified by the diversity controller 305. And, such diversity processing information is processed by the group formatter 306 as signaling information, thereby being outputted along with the mobile service data. For example, the diversity processing information may correspond to a diversity degree, a transmission unit d, a transmission cycle period t, and output order of output masses from the diversity buffer 304.

Meanwhile, the group formatter 306 inserts the mobile service data being outputted from the diversity buffer 304 in a corresponding region within a data group, which is formed based upon a pre-decided rule. Also, with respect to data deinterleaving, the group formatter 306 inserts various place holders or known data (or known data place holders) in the corresponding region within the data group. Furthermore, the group formatter 306 also inserts the diversity processing information, which is outputted from the diversity controller 305, as signaling information in a corresponding region within the data group.

At this point, one data group may be divided into one or more hierarchical regions. Herein, the type of mobile service data being inserted in each region may vary depending upon the characteristic of each hierarchical region. Also, each region may be categorized based on the receiving performance within the data group. In the example of the present invention, one data group is divided into regions A, B, C, and D in the data structure prior to data deinterleaving.

Figure 16A:
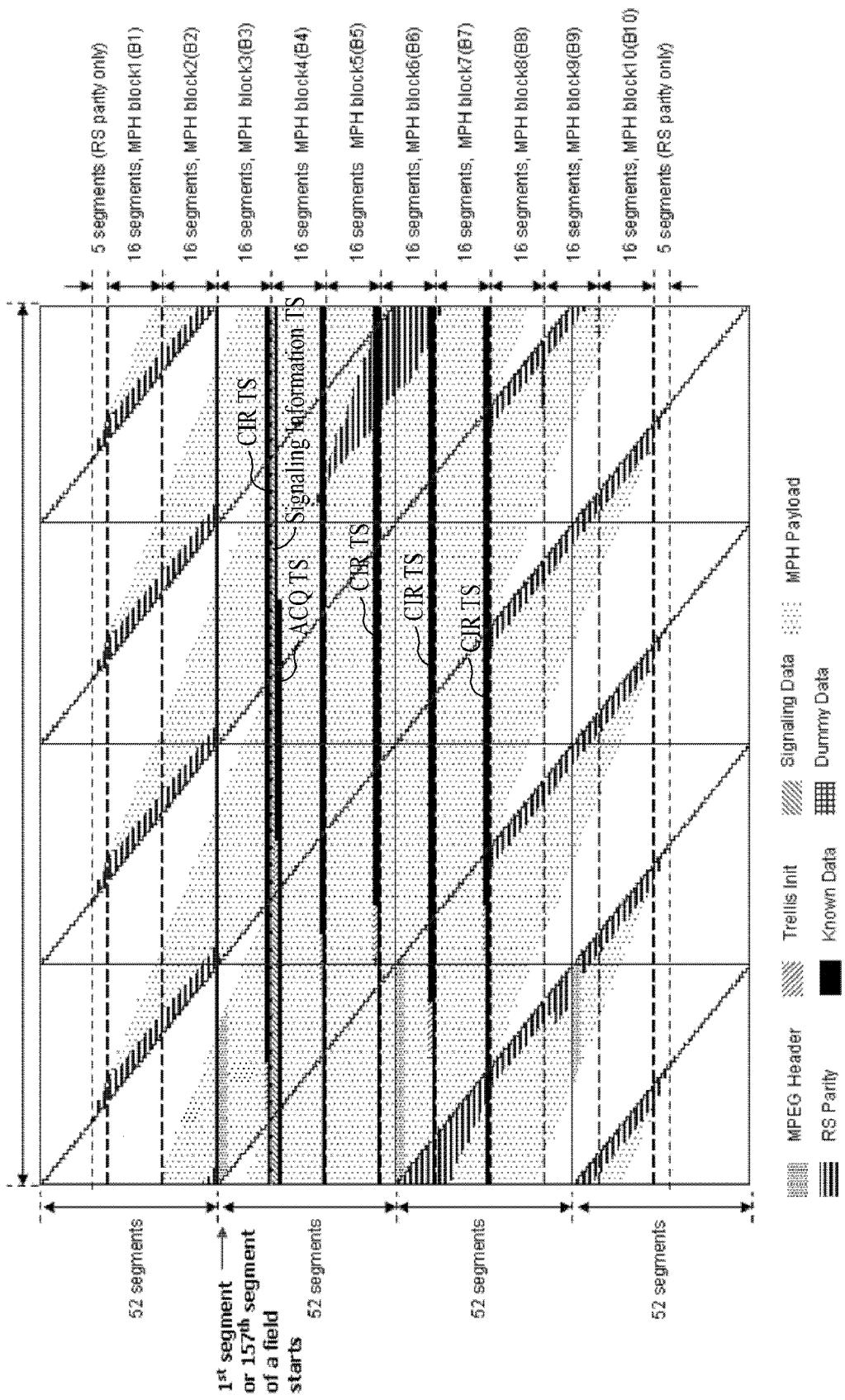
FIG. 16A illustrates a structure of data group after being data interleaved according to the present invention.
Figure 16B:
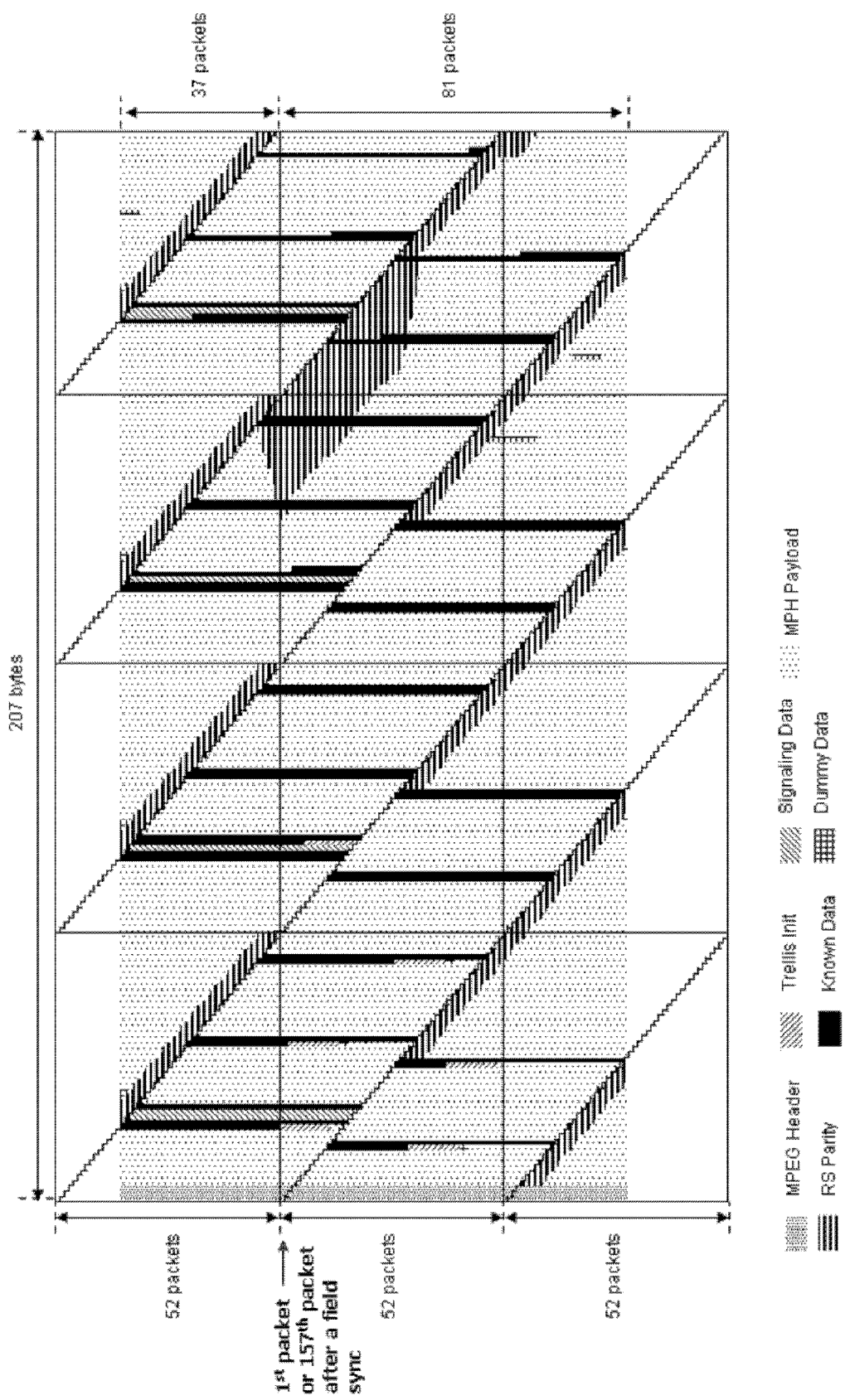
FIG. 16B illustrates a structure of data group before being data interleaved according to the present invention.

FIG. 16A illustrates an alignment of divided data after data interleaving, and FIG. 16B illustrates an alignment of divided data prior to data interleaving. More specifically, the data structure shown in FIG. 16A is transmitted to the receiving system. In other words, one transport packet is interleaved by a data interleaver and, then, scattered to a plurality of data segments, thereby being transmitted to the receiving system. FIG. 16A shows an example of one data group being scattered to 170 data segments. At this point, since one 207-byte packet has the same data size as one data segment, the data packet prior to being data-interleaved may be considered and used as a data segment.

Furthermore, a data group formed to have a structure, as shown in FIG. 16A, is inputted to the data deinterleaver 307.

FIG. 16A shows an example of dividing a data group prior to being data-interleaved into 10 MPH blocks (i.e., MPH block 1 (B1) to MPH block 10 (B10)). In this example, each MPH block has the length of 16 segments. Referring to FIG. 16A, only the RS parity data are allocated to portions of the first 5 segments of the MPH block 1 (B1) and the last 5 segments of the MPH block 10 (B10). The RS parity data are excluded in regions A to D of the data group. When it is assumed that one data group is divided into regions A, B, C, and D, each MPH block may be included in any one of region A to region D depending upon the characteristic of each MPH block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 16A, MPH block 4 (B4) to MPH block 7 (B7) correspond to regions without interference of the main service data. MPH block 4 (B4) to MPH block 7 (B7) within the data group shown in FIG. 16A correspond to a region where no interference from the main service data occurs. In this example, a long known data sequence is inserted at both the beginning and end of each MPH block. In the description of the present invention, the region including MPH block 4 (B4) to MPH block 7 (B7) will be referred to as "region A". As described above, when the data group includes region A having a long known data sequence inserted at both the beginning and end of each MPH block, the receiving system is capable of performing equalization by using the channel information that can be obtained from the known data. Therefore, the strongest equalizing performance may be yielded (or obtained) from one of region A to region D.

In the example of the data group shown in FIG. 16A, MPH block 3 (B3) and MPH block 8 (B8) correspond to a region having little interference from the main service data. Herein, a long known data sequence is inserted in only one side of each MPH block B3 and B8. More specifically, due to the interference from the main service data, a long known data sequence is inserted at the end of MPH block 3 (B3), and another long known data sequence is inserted at the beginning of MPH block 8 (B8). In the present invention, the region including MPH block 3 (B3) and MPH block 8 (B8) will be referred to as "region B". As described above, when the data group includes region B having a long known data sequence inserted at only one side (beginning or end) of each MPH block, the receiving system is capable of performing equalization by using the channel information that can be obtained from the known data. Therefore, a stronger equalizing performance as compared to region C/D may be yielded (or obtained).

Referring to FIG. 16A, MPH block 2 (B2) and MPH block 9 (B9) correspond to a region having more interference from the main service data as compared to region B. A long known data sequence cannot be inserted in any side of MPH block 2 (B2) and MPH block 9 (B9). Herein, the region including MPH block 2 (B2) and MPH block 9 (B9) will be referred to as "region C". Finally, in the example shown in FIG. 16A, MPH block 1 (B1) and MPH block 10 (B10) correspond to a region having more interference from the main service data as compared to region C. Similarly, a long known data sequence cannot be inserted in any side of MPH block 1 (B1) and MPH block 10 (B10). Herein, the region including MPH block 1 (B1) and MPH block 10 (B10) will be referred to as "region D". Since region C/D is spaced further apart from the known data sequence, when the channel environment undergoes frequent and abrupt changes, the receiving performance of region C/D may be deteriorated.

FIG. 16B illustrates a data structure prior to data interleaving. More specifically, FIG. 16B illustrates an example of 118 data packets being allocated to a data group. FIG. 16B shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards.

The size of the data groups, number of hierarchical regions within the data group, the size of each region, the number of MPH blocks included in each region, the size of each MPH block, and so on described above are merely exemplary. Therefore, the present invention will not be limited to the examples described above.

Also, apart from the encoded mobile service data outputted from the diversity buffer 304, the group formatter 306 also inserts MPEG header place holders, non-systematic RS parity place holders, main service data place holders, which are associated with the data deinterleaving in a later process, as shown in FIG. 16A. Herein, the main service data place holders are inserted because the mobile service data bytes and the main service data bytes are alternately mixed with one another in regions B to D based upon the input of the data deinterleaver, as shown in FIG. 16A. For example, based upon the data outputted after data deinterleaving, the place holder for the MPEG header may be allocated at the very beginning of each packet.

Furthermore, the group formatter 306 either inserts known data generated in accordance with a pre-determined method or inserts known data place holders for inserting the known data in a later process. Additionally, place holders for initializing the trellis encoding module 606 are also inserted in the corresponding regions. For example, the initialization data place holders may be inserted in the beginning of the known data sequence.

The output of the group formatter 306 is inputted to the data deinterleaver 307. And, the data deinterleaver 307 deinterleaves data by performing an inverse process of the data interleaver on the data and place holders within the data group, which are then outputted to the packet formatter 308. More specifically, when the data and place holders within the data group configured, as shown in FIG. 16A, are deinterleaved by the data deinterleaver 307, the data group being outputted to the packet formatter 308 is configured to have the structure shown in FIG. 16B.

The packet formatter 308 removes the main service data place holders and the RS parity place holders that were allocated for the deinterleaving process from the deinterleaved data being inputted. Then, the packet formatter 308 groups the remaining portion and replaces the 4-byte MPEG header place holder with an MPEG header having a null packet PID (or an unused PID from the main service data packet). Also, when the group formatter 306 inserts known data place holders, the packet formatter 308 may insert actual known data in the known data place holders, or may directly output the known data place holders without any modification in order to make replacement insertion in a later process. Thereafter, the packet formatter 308 identifies the data within the packet-formatted data group, as described above, as a 188-byte unit mobile service data packet (i.e., MPEG TS packet), which is then provided to the packet multiplexer 240.

The Pre-Processor of a Second Embodiment

The pre-processor according to the second embodiment to the present invention is for scattering the mobile service data on the frequency section as many times as the diversity degree, thereby outputting the processed data. More specifically, in the second embodiment of the present invention, the mobile service data are encoded at a coding rate of 1/N at each time order. Subsequently, the 1/N-rate encoded mobile service data are scattered to a plurality of frequency channels corresponding to the diversity degree, so as to be transmitted in the same transmission unit and cycle period.

Figure 7:
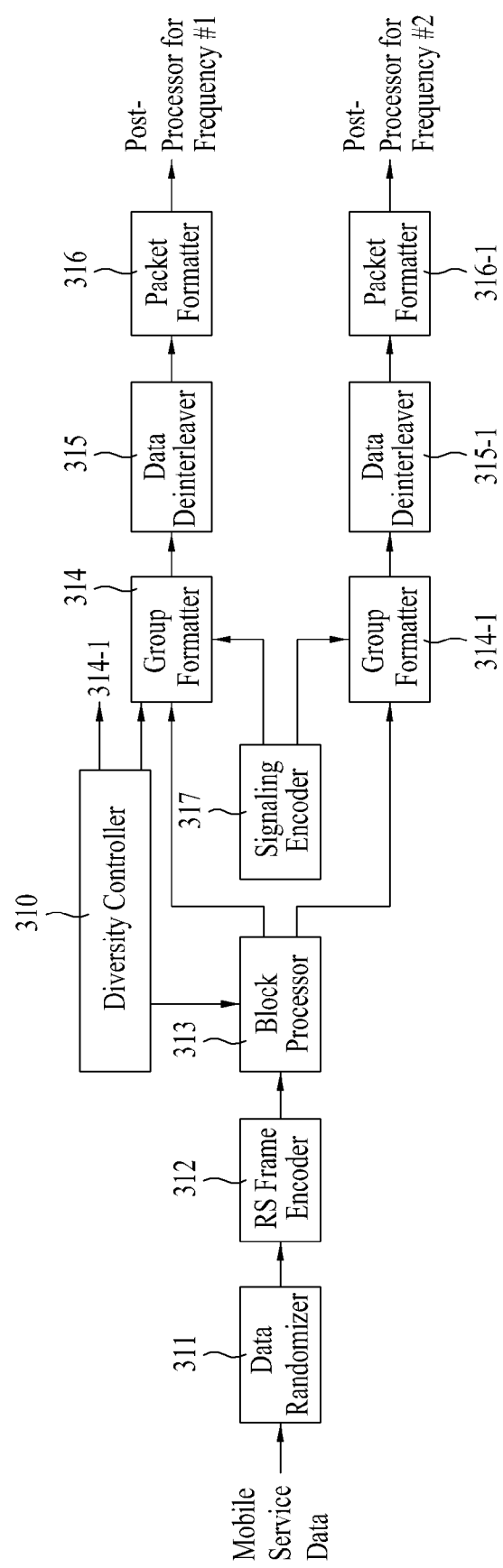
FIG. 7 is a block diagram showing another example of a pre-processor of FIG. 5.

FIG. 7 illustrates a block diagram showing the structure of the pre-processor 230 according to a second embodiment of the present invention, wherein the diversity degree is '2'. Referring to FIG. 7, the pre-processor according to the second embodiment of the present invention includes a data randomizer 311, an RS frame encoder 312, a block processor 313, first and second group formatters 314 and 314-1, first and second data deinterleaver 315 and 315-1, first and second packet formatter 316 and 316-1, a signaling encoder 317, and a diversity controller 310.

Herein, the operations of the data randomizer 311 and the RS frame encoder 312 included in the pre-processor having the above-described structure are identical to those of the data randomizer 301 and the RS frame encoder 302 shown in FIG. 6. Therefore, a detailed description of the same will be omitted for simplicity.

More specifically, the mobile service data being processed with RS-frame unit encoding and super-frame unit row permutation from the RS frame encoder 312 are outputted to the block processor 313.

The block processor 313 then encodes the inputted mobile service data once again at a coding rate of 1/N (wherein N is an integer equal to or greater than 2, N≧2). At this point, the diversity controller 310 controls the block processor 313 in accordance with the designated diversity degree and transmission method (for example, any one diversity method by time, by frequency, and by time and frequency), thereby enabling the RS-frame-encoded mobile service data symbol to be transmitted to different symbol sections by time and/or frequency.

If the transmission method corresponds to a diversity method by frequency, a number of processing blocks corresponding to the diversity degree value should be provided in parallel after the block processor 313. For example, a number of group formatter, data deinterleaver, packet formatter, packet multiplexer, and post-processor corresponding to the diversity degree value are provided in parallel.

FIG. 7 illustrates a block diagram showing a detailed structure of the pre-processor, when it is assumed that the diversity degree is '2'. Herein, two group formatters 313 and 313-1, two data deinterleavers 314 and 314-1, and two packet formatters 315 and 315-1 are each provided in parallel.

More specifically, based upon the control of the diversity controller 310, the block processor 313 encodes the inputted mobile service data at a coding rate of 1/N, the 1/N-rate encoded mobile service data are divided into 2 output masses and outputted to the first and second group formatters 314 and 314-1, respectively. The operations of the first and second group formatters 314 and 314-1 are identical to the operation of the group formatter 306 shown in FIG. 6. Therefore, a detailed description of the same will be omitted for simplicity.

The output of the first group formatter 314 is inputted to the first data deinterleaver 315 and deinterleaved, thereby being outputted to the first packet formatter 316. The output of the second group formatter 314-1 is inputted to the second data deinterleaver 315-1 and deinterleaved, thereby being outputted to the second packet formatter 316-1. Similarly, the operations of the first and second data deinterleavers 315 and 315-1 and the first and second packet formatters 316 and 316-1 are identical to the operations of the data deinterleaver 307 and packet formatter 308 shown in FIG. 6. Therefore, a detailed description of the same will be omitted for simplicity. The mobile service data of each MPH frame section being outputted from the first and second packet formatters 316 and 316-1 transmitted to different frequency channels through each of the packet multiplexer and the post-processor, which are provided in parallel in correspondence with the diversity degree value.

For example, when the coding rate is ¼, and when the diversity degree is '2', the ¼-rate encoded mobile service data are scattered to two frequency sections and then transmitted. More specifically, instead of outputting all 4 bits of the mobile service data, which are encoded at a coding rate of ¼ to the same frequency, among the 4 bits, 2 bits are outputted to frequency F1 (#1), and the remaining 2 bits are outputted to frequency F2 (#2) (wherein, frequency F1≠frequency F2). In another example, when the coding rate is ⅙, and when the diversity degree is '3', among the 6 bits, 2 bits are outputted to frequency F1 (#1), the next 2 bits are outputted to frequency F2 (#2), and the remaining 2 bits are outputted to frequency F3 (#3) (wherein, F1≠F2≠F3). In yet another example, the same data may be scattered and outputted to multiple frequency sections. For example, 2 bits of ½-rate coded mobile service data may be identically outputted to frequency F1 and frequency F2.

According to the embodiment of the present invention, the mobile service data that are to be transmitted to frequency F1 (#1) are outputted to the first group formatter 314, and the mobile service data that are to be transmitted to frequency F2 (#2) are outputted to the second group formatter 314-1.

At this point, any one unit that can collectively process data, such as MPH block, MPH group, MPH frame, and so on, may be applied as the scattering (or dispersion) and transmission unit. In the present invention, the MPH frame will be described as the processing unit according to the first embodiment of the present invention.

More specifically, when data of one MPH frame section are encoded at the coding rate of ¼, and when the ¼-rate coded data are then scattered to two different frequency sections, the ¼-rate encoded data are scattered and transmitted to two MPH frames over two different frequency channels. When the mobile service data of the MPH frame section are encoded at the coding rate of ¼ and scattered to two frequency sections, the scattered mobile service data are transmitted using the method shown in FIG. 9(b).

First of all, in the $k^{th}$ time order, the block processor 313 encodes the mobile service data of one MPH frame section at a coding rate of ¼. Then, the block processor 313 divides the ¼-rate encoded mobile service data into two output masses (or groups) (i.e., mob Ak, mob Bk). Also, in order to be carried and transmitted over frequency F1 (#1), the mobile service data of the output mass mob Ak are outputted to the first group formatter 314. And, in order to be carried and transmitted over frequency F2 (#2), the mobile service data of the output mass mob Bk are outputted to the second group formatter 314-1.

Subsequently, in the $(k+1)^{th}$ time order, the block processor 313 encodes the mobile service data of a next MPH frame section at a coding rate of ¼. Then, the block processor 313 divides the ¼-rate encoded mobile service data into two output masses (i.e., mob Ak+1, mob Bk+1). Also, in order to be carried and transmitted over frequency F1 (#1), the mobile service data of the output mass mob Ak+1 are outputted to the first group formatter 314. And, in order to be carried and transmitted over frequency F2 (#2), the mobile service data of the output mass mob Bk+1 are outputted to the second group formatter 314-1. This process is identically applied to the mobile service data of each MPH frame that are inputted in accordance with the time order. And, when the mobile service data of two output masses, which are divided from one MPH frame, are scattered and transmitted over two difference frequency channels, the mobile service data of the two output masses may be outputted at the same time order or outputted at different time orders.

More specifically, referring to FIG. 9(b), two output masses processed at each time order are divided to two different frequency channels and transmitted in the same transmission unit and cycle period.

Also, even when being scattered by frequency, the diversity processing information is modified by the diversity controller 310. Then, such diversity processing information is processed by the first and second group formatters 314 and 314-1 as signaling information, thereby being transmitted along with the corresponding mobile service data. More specifically, the transmission parameter being encoded and outputted from the signaling encoder 317 and the diversity processing information being outputted from the diversity controller 310 are each processed as signaling information by both group formatters 314 and 314-1.

The Pre-Processor of a Third Embodiment

The pre-processor according to the third embodiment to the present invention is for scattering the mobile service data on the time and frequency sections as many times as the diversity degree, thereby outputting the processed data. More specifically, in the third embodiment of the present invention, the mobile service data are encoded at a coding rate of 1/N at each time order. Subsequently, the 1/N-rate encoded mobile service data are scattered to a plurality of time sections and frequency channels corresponding to the diversity degree, thereby being outputted.

In order to disperse and output the mobile service data to time sections and frequency sections, the pre-processor according to the third embodiment of the present invention may be further provided with a diversity buffer in addition to the structure shown in FIG. 7.

Figure 8:
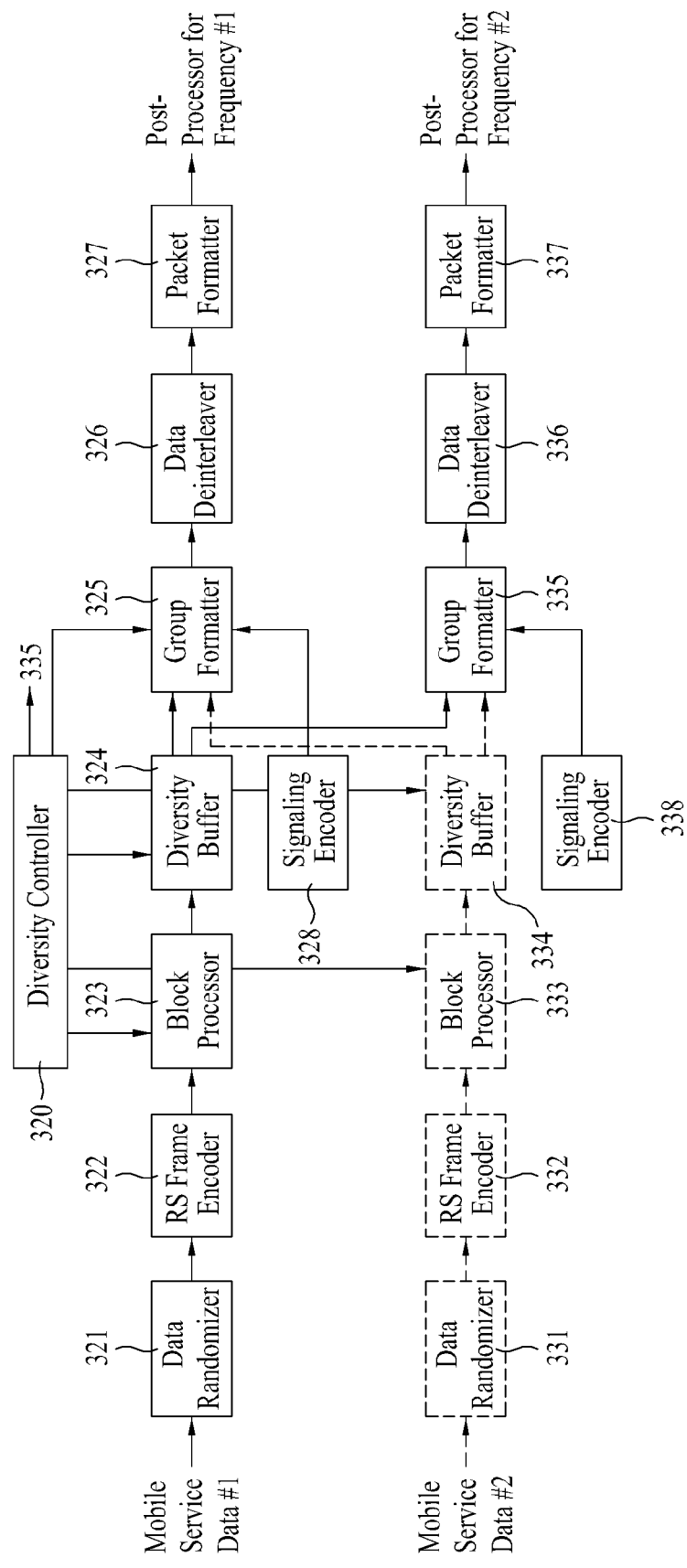
FIG. 8 is a block diagram showing another example of a pre-processor of FIG. 5.

FIG. 8 illustrates a block diagram showing the structure of the pre-processor 230 according to a third embodiment of the present invention, wherein the diversity degree is '2'.

Referring to FIG. 8, the pre-processor according to the third embodiment of the present invention includes a data randomizer 321, an RS frame encoder 322, a block processor 323, a diversity buffer 324, first and second group formatters 325 and 335, first and second data deinterleavers 326 and 336, first and second packet formatters 327 and 337, first and second signaling encoders 328 and 338, and a diversity controller 320. Herein, FIG. 9(c) illustrates an example of the mobile service data being dispersed and transmitted to multiple time sections and frequency sections from a structure provided with one block processor and one diversity buffer.

The data randomizer 321 included in the pre-processor randomizes the inputted mobile service data and outputs the randomized data to the RS frame encoder 322. The RS frame encoder 322 performs RS-frame unit encoding and super-frame unit row permutation on the randomized and inputted mobile service data, thereby outputting the processed data to the block processor 323. The block processor 323 then encodes the inputted mobile service data, which are encoded and outputted from the RS frame encoder 322, once again at a coding rate of 1/N (wherein N is an integer equal to or greater than 2, N≧22). At this point, the diversity controller 320 controls the block processor 323 and the diversity buffer 324 in accordance with the designated diversity degree and transmission method (for example, a diversity method by time and frequency), thereby enabling the RS-frame-encoded mobile service data symbol to be transmitted to different symbol sections by time and frequency.

More specifically, based upon the control of the diversity controller 320, the block processor 323 encodes the inputted mobile service data at a coding rate of 1/N, the 1/N-rate encoded mobile service data are divided into 2 output masses and outputted to the diversity buffer 324. For example, when the coding rate is ¼ and the diversity degree is '2', and when the scattering (or dispersion) and transmission unit of the data corresponds to an MPH frame, the block processor 323 encodes the inputted mobile service data of one MPH frame section at a coding rate of ¼. Then, the block processor 323 divides the ¼-rate encoded mobile service data into two output masses (or groups) (i.e., mob Ak, mob Bk), which are then outputted to the diversity buffer 324. In addition, the block processor 323 also performs ¼-rate encoding on the mobile service data of three MPH frame sections, which are sequentially inputted in succession to the MPG frame section. Then, the block processor 323 divides the ¼-rate encoded mobile service data into two output masses (mob Ak+1, mob Bk+1), (mob Ak+2, mob Bk+2), and (mob Ak+3, mob Bk+3).

The diversity buffer 324 temporarily stores the mobile service data of each output mass (mob Ak, mob Bk, mob Ak+1, mob Bk+1, mob Ak+2, mob Bk+2, mob Ak+3, mob Bk+3) being outputted from the block processor 323. Thereafter, the diversity buffer 324 outputs the stored data to the first and second group formatters 325 and 335 according to a pre-decided order. For example, as shown in FIG. 9(*c*), the mobile service data of the corresponding output mass are loaded on four MPH frames by the order of mob Ak, mob Ak+1, mob Ak+2, and mob Ak+3 and outputted to the first group formatter 325 so as to be transmitted over frequency F1 (#1). Also, the mobile service data of the corresponding output mass are loaded on four MPH frames by the order of mob Bk, mob Bk+1, mob Bk+2, and mob Bk+3 and outputted to the second group formatter 335 so as to be transmitted over frequency F2 (#2).

Since the operations of the first and second group formatters 325 and 335 are identical to that of the group formatter 306 shown in FIG. 6, a detailed description of the same will be omitted for simplicity. The output of the first group formatter 325 is inputted to the first data deinterleaver 326 so as to be deinterleaved, thereby being outputted to the first packet formatter 327. Also, the output of the second group formatter 335 is inputted to the second data deinterleaver 336 so as to be deinterleaved, thereby being outputted to the second packet formatter 337.

Similarly, since the operations of the first and second data deinterleaver 326 and 336 and the first and second packet formatter 327 and 337 are identical to the data deinterleaver 307 and to the packet formatter 308 of FIG. 6, detailed description of the same will be omitted for simplicity. Furthermore, the mobile service data of each MPH frame section being outputted from the first and second packet formatter 327 and 337 are transmitted to two different frequency channels (i.e., frequencies F1 and F2) through the packet multiplexer and post-processor, which are each provided in parallel in correspondence with the diversity degree value.

Meanwhile, in order to transmit different types of mobile service data by scattering the corresponding data by time and frequency, the pre-processor of FIG. 8 may further include a data randomizer 331, an RS frame encoder 332, a block processor 333, and a diversity buffer 334. FIG. 9(*d*) illustrates an example of the mobile service data being dispersed and transmitted to multiple time sections and frequency sections from a structure provided with a plurality of block processors.

More specifically, the first mobile service data pass through the first data randomizer 321 and the RS frame encoder 322 so as to be outputted to the first block processor 323. And, the second mobile service data pass through the second data randomizer 331 and the RS frame encoder 322 so as to be outputted to the second block processor 333. Based upon the control of the diversity controller 320, the first block processor 323 receives the RS-frame encoded first mobile service data and encodes the received first mobile service data at a coding rate of 1/N. Then, the 1/N-rate encoded first mobile service data are divided to two output masses and, then, outputted to the first diversity buffer 324. Subsequently, based upon the control of the diversity controller 320, the first diversity buffer 324 temporarily stores the mobile service data of the two output masses. Then, the stored mobile service data may be outputted to only one of the first and second group formatters 325 and 335, or be outputted to each of the first and second group formatters 325 and 335.

Similarly, based upon the control of the diversity controller 320, the second block processor 333 receives the RS-frame encoded second mobile service data and encodes the received second mobile service data at a coding rate of 1/N. Then, the 1/N-rate encoded second mobile service data are divided to two output masses and, then, outputted to the second diversity buffer 334. Subsequently, based upon the control of the diversity controller 320, the second diversity buffer 334 temporarily stores the mobile service data of the two output masses. Then, the stored mobile service data may be outputted to only one of the first and second group formatters 325 and 335, or be outputted to each of the first and second group formatters 325 and 335.

In the present invention, when the coding rate is ¼, and when the diversity degree is '2', as shown in FIG. 9(*d*), among the two output masses (mob Ak, mob Bk) within the one MPH frame being outputted from the first block processor 323, the first diversity buffer 325 according to the embodiment of the present invention outputs the mobile service data of one output mass mob Ak to the first group formatter 326 so as to be transmitted over frequency F1 (#1), and then the first diversity buffer 325 according to the embodiment of the present invention outputs the mobile service data of the other output mass mob Bk to the second group formatter 336 so as to be transmitted over frequency F2 (#2). Similarly, according to the embodiment of the present invention, among the two output masses (mob Ak', mob Bk') within the one MPH frame being outputted from the second block processor 333, the mobile service data of one output mass mob Bk' are outputted to the first group formatter 326 so as to be transmitted over frequency F1 (#1), and then the mobile service data of the other output mass mob Ak' are outputted to the second group formatter 336 so as to be transmitted over frequency F2 (#2).

The output of the first group formatter 325 is inputted to the first data deinterleaver 326 so as to be deinterleaved. Then, the deinterleaved data are outputted to the first packet formatter 327. Also, the output of the second group formatter 335 is inputted to the second data deinterleaver 336 so as to be deinterleaved. Then, the deinterleaved data are outputted to the second packet formatter 337. Thereafter, the mobile service data of each MPH frame section being outputted from the first and second packet formatters 327 and 337 are transmitted to two different frequency channels (i.e., frequencies F1 and F2) through the packet multiplexer and post-processor, which are each provided in parallel in correspondence with the diversity degree value.

Meanwhile, even when being scattered by time and by frequency, the diversity processing information is modified by the diversity controller 320. Then, such diversity processing information is processed by the first and second group formatters 325 and 335 as signaling information, thereby being transmitted along with the corresponding mobile service data. More specifically, the transmission parameter being encoded and outputted from the first and second signaling encoders 328 and 338 and the diversity processing information being outputted from the diversity controller 320 are each processed as signaling information by both group formatters 325 and 335.

Block Processor

Figure 10:
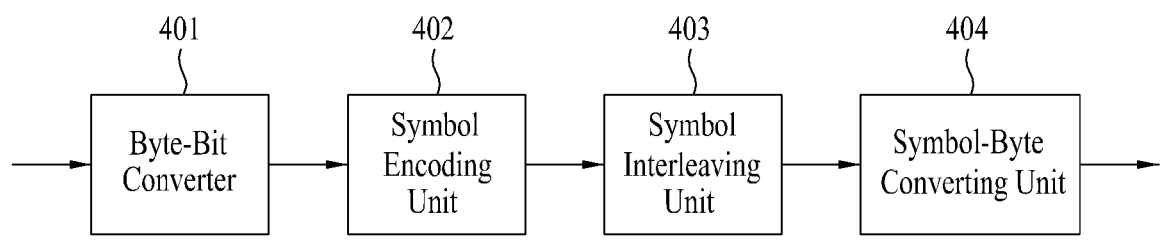
FIG. 10 is a block diagram showing an example of a block processor according to present invention.

FIG. 10 illustrates a block diagram showing the structure of a block processor according to an embodiment of the present invention. The block processor shown in FIG. 10 may be applied as the block processor according to the first to third embodiments of the present invention. The block processor of FIG. 10 includes a byte-bit converter 401, a symbol encoding unit 402, a symbol interleaving unit 403, and a symbol-byte converting unit 404. Herein, the byte-bit converter 401 distinguishes the mobile service data bytes being RS-frame encoded and inputted and, then, outputs the distinguished data bytes to the symbol encoding unit 402. The symbol encoding unit 402 encoded the inputted mobile service data at a coding rate of 1/N. Thereafter, the 1/N-rate encoded mobile service data are divided into a plurality of output masses.

For example, when it is assumed that the diversity degree is '2', and that the mobile service data are scattered in the time section, the symbol encoding unit 402 divides the 1/N-rate encoded mobile service data to two output masses. The symbol interleaving unit 403 is provided with a number of symbol interleavers corresponding to the number of divided output masses. Then, each symbol interleaver performs block interleaving in symbol units on the mobile service data of the corresponding output mass. Any interleaver that can structurally perform order realignment may be applied as the symbol interleaver. The output end of each symbol interleaver is connected to the symbol-byte converter. More specifically, the symbol-byte converting unit 404 includes as many symbol-byte converters as the number of symbol interleavers included in the symbol interleaving unit 403. Herein, each symbol-byte converter converts symbol data being interleaved and outputted from the respective symbol interleaver, thereby outputting the processed data. More specifically, since 2 bits configure 1 symbol, 4 symbols are grouped to form 1 byte.

At this point, when the mobile service data are scattered in the time section, the output data of multiple symbol-byte converters are provided to the diversity buffer. Conversely, when the mobile service data are scattered in the frequency section, the output data of each symbol-byte converter are provided to the respective group formatter. More specifically, by receiving 1 bit and encoding the received 1 bit to N number of bits, the symbol encoding unit 402 included in the block processor may generate an output of N bits. Also, the N bits may be divided into a plurality of output masses based upon the diversity degree, which are then independently processed by the respective symbol interleaver and symbol-byte converter.

As described above, the detailed structure of the symbol encoding unit 402 may vary depending upon the coding rate, the diversity degree, and the scattering (or dispersion) by time and/or frequency. Also, the number of symbol interleavers in the symbol interleaving unit 403 and the number of symbol-byte converters in the symbol-byte converting unit 404 may also vary depending upon the structure of the symbol encoding unit 402.

Figure 11A:
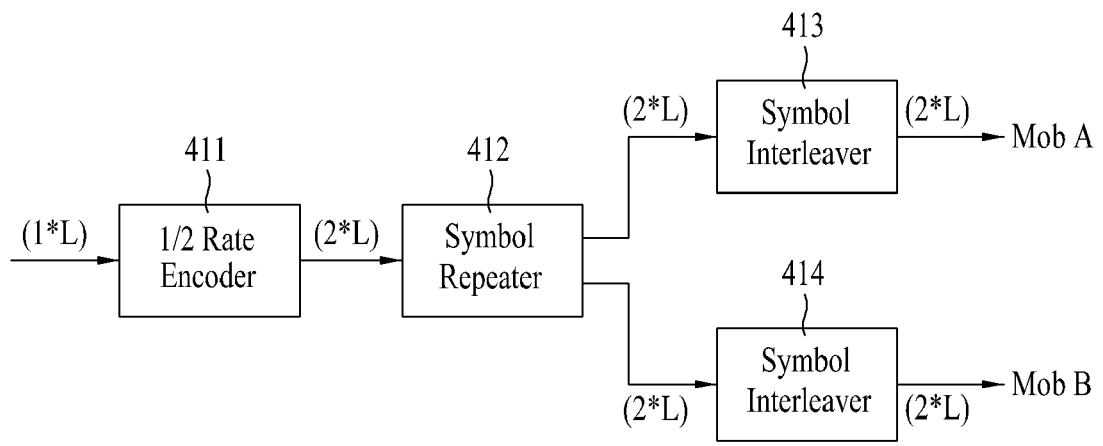
FIG. 11A and FIG. 11B illustrate examples encoding on mobile service data at a coding rate of ¼, and dividing the encoded mobile service data into two output masses, thereby respectively symbol-interleaving the two output masses according to the present invention.
Figure 11B:
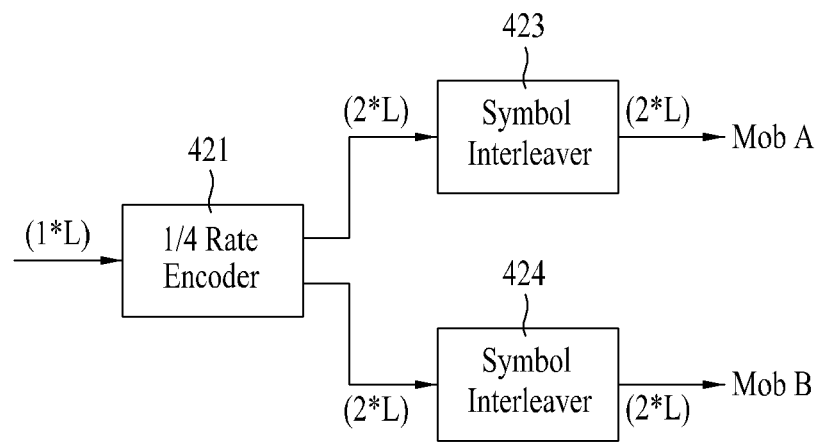

FIG. 11A and FIG. 11B respectively illustrate block views showing exemplary structures for encoding mobile service data at a coding rate of ¼ and dividing the ¼-rate encoded mobile service data into two output masses, thereby respectively performing symbol interleaving.

Referring to FIG. 11A, a ½-encoder 411 and a symbol repeater 412 correspond to the symbol encoding unit 402, and first and second symbol interleavers 413 and 414 correspond to the symbol interleaving unit 403.

More specifically, the ½-encoder 411 encodes the inputted mobile service data bit at a coding rate of ½, thereby outputting the ½-rate encoded mobile service data bit to the symbol repeater 412. For example, when 1*L bits of mobile service data are encoded at the coding rate of ½, 2*L bits of mobile service data are outputted to the symbol repeater 412. When the 2*L bits of mobile service data are repeated by the symbol repeater 412, 4*L bits of mobile service data may be obtained. More specifically, the ½-encoder 411 and the symbol repeater 412 may be combined to perform the function of a ¼-encoder.

At this point, the symbol repeater 412 outputs 2*L bits among the 4*L bits of mobile service data to the first symbol interleaver 413 and, then, outputs the remaining 2*L bits of mobile service data to the second symbol interleaver 414. For example, if the symbol repeater 412 repeats 2*L bits of mobile service data in symbol units, the original (or initial) mobile service data symbol may be outputted to the first symbol interleaver 413, and the repeated mobile service data symbol may be outputted to the second symbol interleaver 414, and vice versa.

Each of the first and second symbol interleavers 413 and 414 performs block interleaving in symbol units on the respective inputted mobile service data, thereby outputting the processed data to the respective symbol-byte converter (not shown). At this point, the output of the first symbol interleaver 413 corresponds to one output mass mob A, and the output of the second symbol interleaver 414 corresponds to another output mass mob B. More specifically, the mobile service data encoded at the coding rate of ¼ are divided into two output masses of the mobile service data being encoded at the coding rate of ½.

Meanwhile, FIG. 11B illustrates an example, wherein the symbol encoding unit 402 is configured of a ¼-encoder 421, and wherein the symbol interleaving unit 403 is configured of first and second symbol interleavers 422 and 423. More specifically, the ¼-encoder 421 encodes the inputted mobile service data bit at a coding rate of ¼. For example, when 1*L bits of mobile service data are encoded at the coding rate of ¼, 4*L bits of mobile service data may be obtained. At this point, the ¼-encoder 421 outputs 2*L bits among the 4*L bits of mobile service data to the first symbol interleaver 422 and, then, outputs the remaining 2*L bits of mobile service data to the second symbol interleaver 423. For example, the upper 2*L bits of mobile service data may be outputted to the first symbol interleaver 422, and the lower 2*L bits of mobile service data may be outputted to the second symbol interleaver 423. However, this is merely exemplary, and other combinations may be applied herein.

Each of the first and second symbol interleavers 422 and 423 performs block interleaving in symbol units on the respective inputted mobile service data, thereby outputting the processed data to the respective symbol-byte converter (not shown). At this point, the output of the first symbol interleaver 422 corresponds to one output mass mob A, and the output of the second symbol interleaver 423 corresponds to another output mass mob B. Similarly, the mobile service data encoded at the coding rate of ¼ are divided into two output masses of the mobile service data being encoded at the coding rate of ½.

Figure 12A:
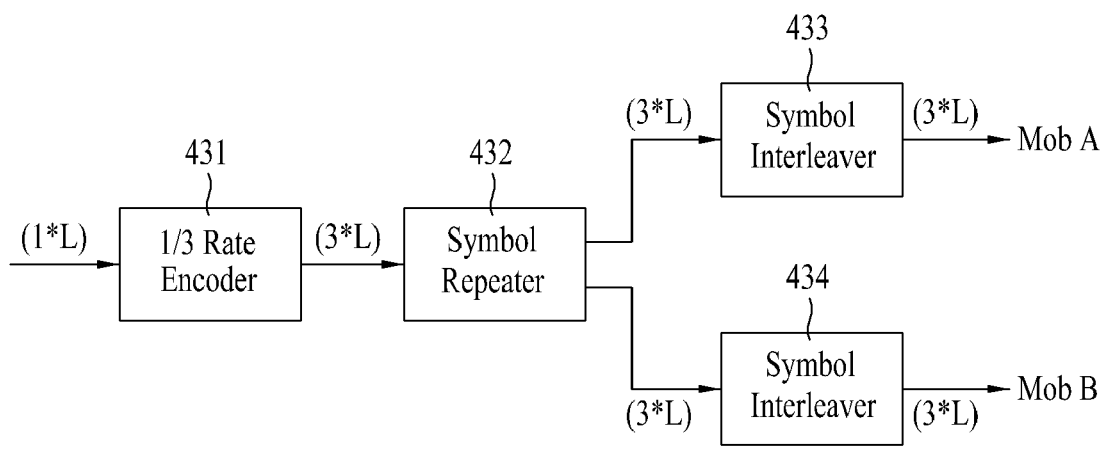
FIG. 12A and FIG. 12B illustrate examples encoding on mobile service data at a coding rate of ⅙, and dividing the encoded mobile service data into two output masses, thereby respectively symbol-interleaving the two output masses according to the present invention.
Figure 12B:
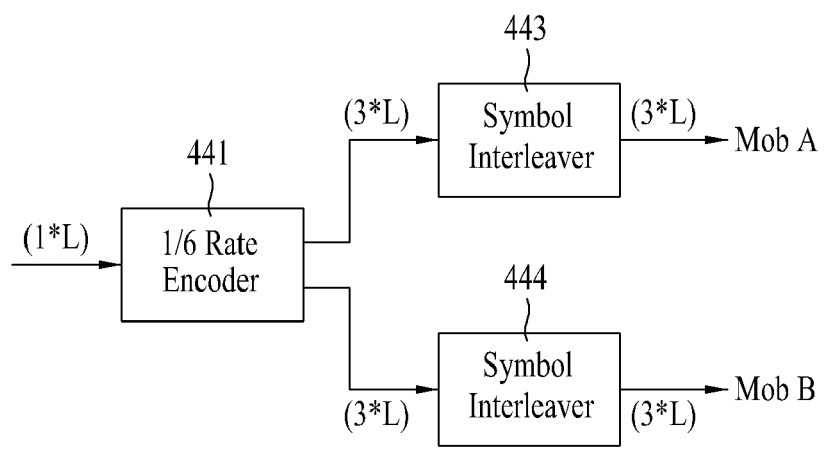

FIG. 12A and FIG. 12B respectively illustrate block views showing exemplary structures for encoding mobile service data at a coding rate of ⅙ and dividing the ⅙-rate encoded mobile service data into two output masses, thereby respectively performing symbol interleaving.

Referring to FIG. 12A, a ⅓-encoder 431 and a symbol repeater 432 correspond to the symbol encoding unit 402, and first and second symbol interleavers 433 and 434 correspond to the symbol interleaving unit 403.

More specifically, the ⅓-encoder 431 encodes the inputted mobile service data bit at a coding rate of ⅓, thereby outputting the ⅓-rate encoded mobile service data bit to the symbol repeater 432. For example, when 1*L bits of mobile service data are encoded at the coding rate of ⅓, 3*L bits of mobile service data are outputted to the symbol repeater 432. When the 3*L bits of mobile service data are repeated by the symbol repeater 432, 6*L bits of mobile service data may be obtained. More specifically, the ⅓-encoder 431 and the symbol repeater 432 may be combined to perform the function of a ⅙-encoder.

At this point, the symbol repeater 432 outputs 3*L bits among the 6*L bits of mobile service data to the first symbol interleaver 433 and, then, outputs the remaining 3*L bits of mobile service data to the second symbol interleaver 434. For example, if the symbol repeater 432 repeats 3*L bits of mobile service data in symbol units, the original (or initial) mobile service data symbol may be outputted to the first symbol interleaver 433, and the repeated mobile service data symbol may be outputted to the second symbol interleaver 434, and vice versa.

Each of the first and second symbol interleavers 433 and 434 performs block interleaving in symbol units on the respective inputted mobile service data, thereby outputting the processed data to the respective symbol-byte converter (not shown). At this point, the output of the first symbol interleaver 433 corresponds to one output mass mob A, and the output of the second symbol interleaver 434 corresponds to another output mass mob B. More specifically, referring to FIG. 12A, the mobile service data encoded at the coding rate of ⅙ are divided into two output masses of the mobile service data being encoded at the coding rate of ⅓.

Meanwhile, FIG. 12B illustrates an example, wherein the symbol encoding unit 402 is configured of a ⅙-encoder 441, and wherein the symbol interleaving unit 403 is configured of first and second symbol interleavers 442 and 443.

More specifically, the ⅙-encoder 441 encodes the inputted mobile service data bit at a coding rate of ⅙. For example, when 1*L bits of mobile service data are encoded at the coding rate of ⅙, 6*L bits of mobile service data may be obtained. At this point, the ⅙-encoder 441 outputs 3*L bits among the 6*L bits of mobile service data to the first symbol interleaver 442 and, then, outputs the remaining 3*L bits of mobile service data to the second symbol interleaver 443. For example, the upper 3*L bits of mobile service data may be outputted to the first symbol interleaver 442, and the lower 3*L bits of mobile service data may be outputted to the second symbol interleaver 443. However, this is merely exemplary, and other combinations may be applied herein.

Each of the first and second symbol interleavers 442 and 443 performs block interleaving in symbol units on the respective inputted mobile service data, thereby outputting the processed data to the respective symbol-byte converter (not shown). At this point, the output of the first symbol interleaver 442 corresponds to one output mass mob A, and the output of the second symbol interleaver 443 corresponds to another output mass mob B. Similarly, referring to FIG. 12B, the mobile service data encoded at the coding rate of ⅙ are divided into two output masses of the mobile service data being encoded at the coding rate of ⅓.

According to an embodiment of the present invention, when any one of the block processors shown in FIG. 11A to FIG. 12B is applied to the block processor 303 shown in FIG. 6, the mobile service data of the output mass mob A and the mobile service data of the output mass mob B are outputted to the diversity buffer 304.

According to another embodiment of the present invention, when any one of the block processors shown in FIG. 11A to FIG. 12B is applied to the block processor 313 shown in FIG. 7, the mobile service data of the output mass mob A are outputted to the first group formatter 314, and the mobile service data of the output mass mob B are outputted to the second group formatter 314-1, and vice versa.

According to yet another embodiment of the present invention, when any one of the block processors shown in FIG. 11A to FIG. 12B is applied to the block processor 323 shown in FIG. 8, the mobile service data of the output mass mob A are outputted to the first group formatter 325 through the diversity buffer 324, and the mobile service data of the output mass mob B are outputted to the second group formatter 335 through the diversity buffer 324, and vice versa.

The above-described embodiments shown in FIG. 11A to FIG. 12B correspond to the block processor when the diversity degree is '2'. Similarly, when the diversity degree is '3', and when the ⅙-encoder is used, the mobile service data encoded at the coding rate of ⅙ may be divided into 3 output masses of ½-rate encoded mobile service data, which are then scattered by time and/or by frequency. If the diversity degree is '3', and when a ½-encoder, a ⅓-encoder, a ¼-encoder, or a ⅕-encoder is used, the symbol repeater may be used to repeat the input symbol, thereby dividing the corresponding mobile service data to 3 output masses encoded at a coding rate of ½.

Figure 13A:
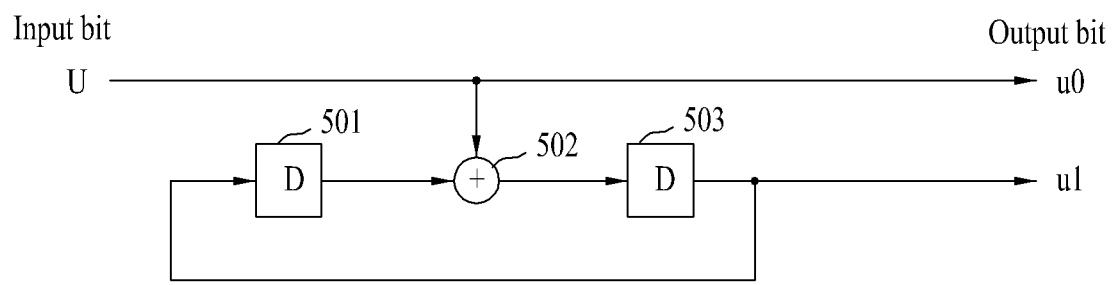
FIG. 13A is a detailed block diagram showing an embodiment of a 1/N encoder according to the present invention.

FIG. 13A illustrates a detailed block diagram of a ½-encoder according to an embodiment of the present invention. Referring to FIG. 13A, the ½-encoder includes two delay units 501 and 503 and one adder 502. Herein, the ½-encoder encodes an input data bit U and outputs the coded bit U to 2 bits (u0 and u1). At this point, the data bit U is directly outputted as an upper bit u0 and simultaneously encoded as a lower bit u1 and then outputted.

More specifically, the input data bit U is directly outputted as the upper bit u0 and simultaneously outputted to the adder 502. The adder 502 adds the input data bit U and the output bit of the first delay unit 501 and, then, outputs the added bit to the second delay unit 503. Thereafter, the data bit delayed by a pre-determined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the adder 502.

Figure 13B:
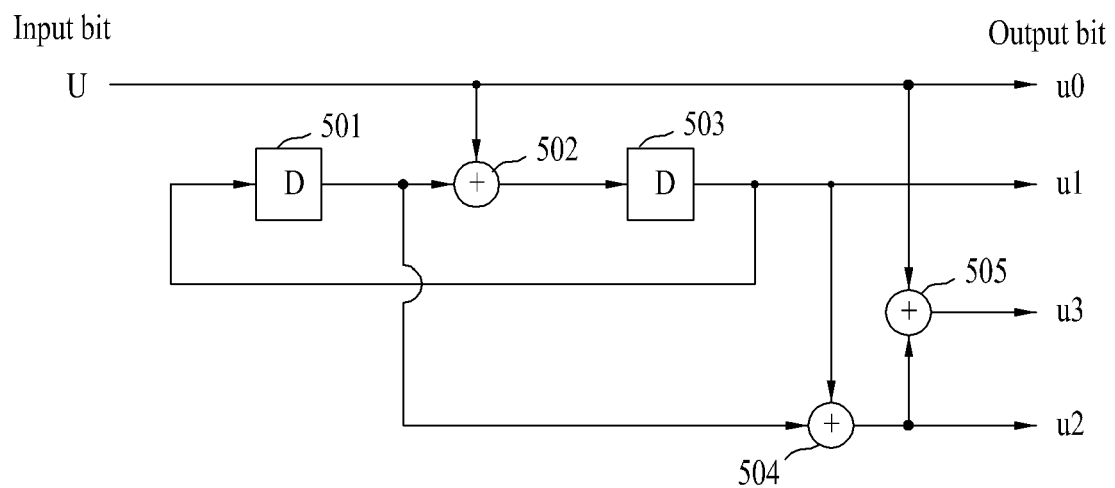
FIG. 13B is a detailed block diagram showing another embodiment of a 1/N encoder according to the present invention.

FIG. 13B illustrates a detailed block diagram of a ¼-encoder according to an embodiment of the present invention. Referring to FIG. 13B, the ¼-encoder includes two delay units 501 and 503 and three adders 502, 504, and 505. Herein, the ¼-encoder encodes an input data bit U and outputs the coded bit U to 4 bits (u0 to u3). At this point, the data bit U is directly outputted as uppermost bit u0 and simultaneously encoded as lower bit u1u2u3 and then outputted.

More specifically, the input data bit U is directly outputted as the uppermost bit u0 and simultaneously outputted to the first and third adders 502 and 505. The first adder 502 adds the input data bit U and the output bit of the first delay unit 501 and, then, outputs the added bit to the second delay unit 503.

Thereafter, the data bit delayed by a pre-determined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the first adder 502 and the second adder 504. The second adder 504 adds the data bits outputted from the first and second delay units 501 and 503 as a lower bit u2. The third adder 505 adds the input data bit U and the output of the second delay unit 503 and outputs the added data bit as a lower bit u3.

Figure 14:
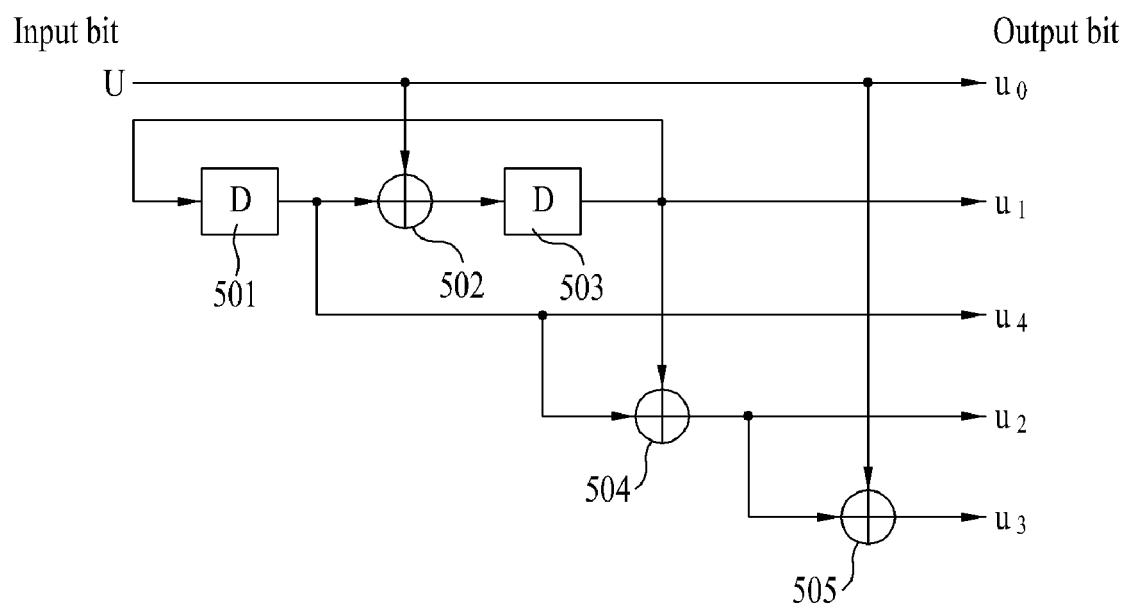
FIG. 14 is a detailed block diagram showing another embodiment of a 1/N encoder according to the present invention.

FIG. 14 illustrates a block diagram showing the structure of a ⅕-encoder according to an embodiment of the present invention. The overall elements of the ⅕-encoder are identical to those of the ¼-encoder shown in FIG. 13B. However, the difference between the encoder of FIG. 14 and the encoder of FIG. 13B is that, in FIG. 14, the lowermost bit u4 is directly outputted without modification as the output of the first delay unit 501.

Also, when it is assumed that a ⅕-encoder shown in FIG. 14 is used as the symbol encoding unit 402, part of the output bits of the ⅕-encoder may be grouped so as to be divided into a plurality of output masses. For example, part of the data bits outputted from the ⅕-encoder may be grouped by 2 bits, thereby dividing the ⅕-rate encoded mobile service data to 2 output masses having the coding rate of ½. For example, a symbol may be configured of output bits u0u1 so as to be outputted to the output mass mob A, and a symbol may be configured of output bits u3u4 so as to be outputted to the output mass mob B. In another example, a symbol may be configured of output bits u0u2 so as to be outputted to the output mass mob A, and a symbol may be configured of output bits u1 and u4 so as to be outputted to the output mass mob B.

Meanwhile, when the coding rate, i.e., N, of the symbol encoding unit 402 is an integer cannot be divided by the diversity degree, based upon the coding method, the N-bit output with respect to a 1-bit input may be repeated so as to obtain an output of 2N bits or 3N bits. Thereafter, the obtained bits may be divided so as to be grouped into masses, thereby being independently processed. At this point, a method of breaking down (or dividing) the output of an encoder so as to form a mass may be used in all cases where each mass has the same number of bits included therein.

As described above, after having the symbol encoding unit 402 encode the mobile service data at a coding rate of 1/N, and after having the 1/N-rate encoded mobile service data divided into a plurality of output masses, each output mass is interleaved by an independent symbol interleaver. More specifically, when the 1/N-rate encoded mobile service data are divided into 2 output masses, each output mass of the corresponding mobile service data is block interleaved in symbol units through two independent symbol interleavers.

At this point, any interleaver that can structurally perform order realignment may be applied as the symbol interleaver. In the present invention, even when the symbol that is to have its order realigned has different lengths, an example of using an applicable variable length symbol interleaver will be described according to the embodiment of the present invention. Also, for the interleaving unit, an M*L size bit-interleaving process may be used on a bit symbol having the length of L, or an L size symbol interleaving process may be used on an M-bit symbol unit.

FIG. 15(a) to FIG. 15(c) illustrate a symbol interleaver according to an embodiment of the present invention. Herein, the symbol interleaver according to the embodiment of the present invention corresponds to a variable length symbol interleaver that may be applied even when a plurality of lengths is provided for the symbol, so that its order may be rearranged. Namely, FIG. 15(a) to FIG. 15(c) is a detailed description for any one symbol interleaver of a plurality of symbol interleavers within the symbol interleaving unit 403.

Particularly, FIG. 15(a) to FIG. 15(c) illustrate an example of the symbol interleaver when BK=6 and BL=8. Herein, BK indicates a number of symbols that are outputted for symbol interleaving from the corresponding output mass among the plurality of output masses of the symbol encoding unit 402. And, BL represents a number of symbols that are actually interleaved by the symbol interleaver.

In the present invention, the symbol interleaving unit 403 should satisfy the conditions of BL=$2^n$ (wherein n is an integer) and of BL≧BK. If there is a difference in value between BK and BL, (BL−BK) number of null (or dummy) symbols is added, thereby creating an interleaving pattern. Therefore, BK becomes a block size of the actual symbols that are inputted to the symbol interleaving unit 403 in order to be interleaved. BL becomes an interleaving unit when the interleaving process is performed by an interleaving pattern created from the symbol interleaving unit 403.

The example of what is described above is illustrated in FIG. 15(a) to FIG. 15(c). The number of symbols outputted from the corresponding output mass of the symbol encoding unit 402 in order to be interleaved is equal to 6 (i.e., BK=6). In other words, 6 symbols are outputted from the symbol encoding unit 402 in order to be interleaved. And, the actual interleaving unit (BL) is equal to 8 symbols. Therefore, as shown in FIG. 15(a), 2 symbols are added to the null (or dummy) symbol, thereby creating the interleaving pattern.

Equation 1 shown below described the process of sequentially receiving BK number of symbols, the order of which is to be rearranged, and obtaining an BL value satisfying the conditions of BL=$2^n$ (wherein n is an integer) and of BL≧BK, thereby creating the interleaving so as to realign (or rearrange) the symbol order.

In relation to all places, wherein 0≦i≦BL−1, $$P(i)=\{S \times i \times (i+1)/2\} \bmod BL \qquad \text{Equation 1}$$

Figure 15:
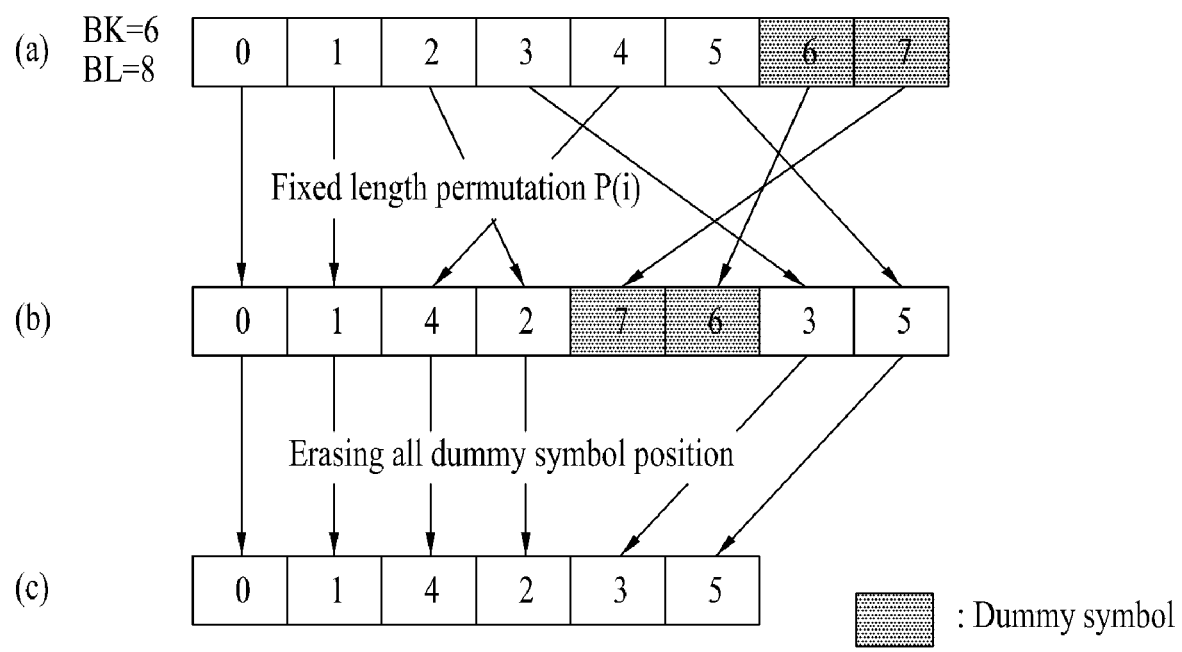
FIG. 15 illustrates a symbol interleaving process according to an embodiment of the present invention.

Herein, BL≧BK, BL=$2^n$, and n and S are integers. FIG. 15 shows an example of an interleaving pattern and an interleaving process, wherein it is assumed that S is equal to 89, and that BL is equal to 8.

As shown in FIG. 15(b), the order of BK number of input symbols and (BL−BK) number of null symbols is rearranged by using the above-mentioned Equation 1. Then, as shown in FIG. 15(c), the null byte places are removed, so as to rearrange the order, by using Equation 2 shown below. Thereafter, the symbol that is interleaved by the rearranged order is then outputted to the corresponding symbol-byte converter of the symbol-byte converting unit 404.

$$\text{if } P(i) > BK-1, \qquad \text{Equation 2}$$

then P(i) place is removed and rearranged

Subsequently, the symbol-byte converter converts to bytes the mobile service data symbols, having the rearranging of the symbol order completed and then outputted in accordance with the rearranged order from the corresponding symbol interleaver, and thereafter outputs the converted bytes to the corresponding group formatter (or diversity buffer). For example, when mobile service data is scattered into time sections, the output of the symbol converter is outputted to the diversity buffer. Also, when mobile service data is scattered into frequency sections, the output of the symbol converter is outputted to the corresponding group formatter.

The operation of the group formatter, data deinterleaver, and packet formatter within the pre-processor 230 according to the present invention was described in detail above. Therefore, a detailed description of the same will be omitted for simplicity.

The output of the packet formatter in the pre-processor 230 is inputted to the packet multiplexer 240.

The packet multiplexer 240 multiplexes the data group packet-formatted and outputted from the packet formatter 308 and the main service data packet outputted from the packet jitter mitigator 220 in accordance with a pre-defined multiplexing method. Then, the packet multiplexer 240 outputs the multiplexed data packets to the data randomizer of the post-processor 250. The multiplexing method and multiplexing rules of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet. Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem.

More specifically, due to the packet jitter, an overflow or underflow may occur in the buffer for the main service data of the receiving system (e.g., the buffer for the audio data).

Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible.

Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 in accordance with a pre-determined multiplexing rule. Then, the packet multiplexer 240 outputs the multiplexed data packets to the post-processor 250.

Figure 25:
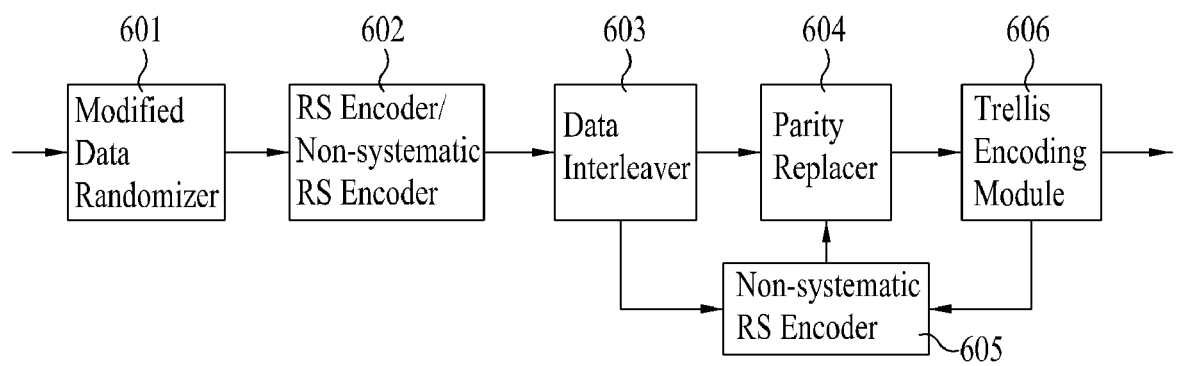
FIG. 25 illustrates a block diagram of a post-processor according to an embodiment of the present invention.

Referring to FIG. 25, the post-processor 250 may include a data randomizer 601, an RS encoder/non-systematic RS encoder 602, a data interleaver 603, a parity replacer 604, a non-systematic RS encoder 605, and a trellis encoding module 606. When mobile service data is scattered and transmitted on the frequency section, in order to process independently mobile service data by each frequency, the post-processor within the transmitter should be provided in parallel as many times as the diversity degree value. FIG. 25 illustrates an exemplary of the transmitter when mobile service data is scattered and processed on the time section.

If the inputted data correspond to the main service data packet, the data randomizer 601 performs the same randomizing process as that of the conventional randomizer. More specifically, the synchronization byte within the main service data packet is deleted. Then, the remaining 187 data bytes are randomized by using a pseudo random byte generated from the data randomizer 601. Thereafter, the randomized data are outputted to the RS encoder/non-systematic RS encoder 602.

On the other hand, if the inputted data correspond to the mobile service data packet, the data randomizer 601 may randomize only a portion of the data packet. For example, if it is assumed that a randomizing process has already been performed in advance on the mobile service data packet by the pre-processor 230, the data randomizer 601 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 602. More specifically, the randomizing process is not performed on the remaining portion of the mobile service data excluding the MPEG header. In other words, the remaining portion of the mobile service data packet is directly outputted to the RS encoder/non-systematic RS encoder 602 without being randomized. Also, the data randomizer 601 may or may not perform a randomizing process on the known data (or known data place holders) and the initialization data place holders included in the mobile service data packet.

The RS encoder/non-systematic RS encoder 602 performs an RS encoding process on the data being randomized by the data randomizer 601 or on the data bypassing the data randomizer 601, so as to add 20 bytes of RS parity data. Thereafter, the processed data are outputted to the data interleaver 603. Herein, if the inputted data correspond to the main service data packet, the RS encoder/non-systematic RS encoder 602 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 602 performs a non-systematic RS encoding process. At this point, the 20-byte RS parity data obtained from the non-systematic RS encoding process are inserted in a pre-decided parity byte place within the mobile service data packet.

The data interleaver 603 corresponds to a byte unit convolutional interleaver.

The output of the data interleaver 603 is inputted to the parity replacer 604 and to the non-systematic RS encoder 605.

Meanwhile, a process of initializing a memory within the trellis encoding module 606 is primarily required in order to decide the output data of the trellis encoding module 606, which is located after the parity replacer 604, as the known data pre-defined according to an agreement between the receiving system and the transmitting system. More specifically, the memory of the trellis encoding module 606 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 606. Further, due to the newly replaced initialization data, a process of newly calculating the RS parity and replacing the RS parity, which is outputted from the data interleaver 603, with the newly calculated RS parity is required. Therefore, the non-systematic RS encoder 605 receives the mobile service data packet including the initialization data place holders, which are to be replaced with the actual initialization data, from the data interleaver 603 and also receives the initialization data from the trellis encoding module 606.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 604. Accordingly, the parity replacer 604 selects the output of the data interleaver 603 as the data within the mobile service data packet, and the parity replacer 604 selects the output of the non-systematic RS encoder 605 as the RS parity. The selected data are then outputted to the trellis encoding module 606.

Meanwhile, if the main service data packet is inputted or if the mobile service data packet, which does not include any initialization data place holders that are to be replaced, is inputted, the parity replacer 604 selects the data and RS parity that are outputted from the data interleaver 603. Then, the parity replacer 604 directly outputs the selected data to the trellis encoding module 606 without any modification.

The trellis encoding module 606 converts the byte-unit data to symbol units and performs a 12-way interleaving process so as to trellis-encode the received data. Thereafter, the processed data are outputted to the synchronization multiplexer 260.

The synchronization multiplexer 260 inserts a field synchronization signal and a segment synchronization signal to the data outputted from the trellis encoding module 606 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Multiplexing Method of a Packet Multiplexer 240

Meanwhile, the packet multiplexer 240 a data group is allocated to a VSB frame based upon a starting point of a slot. Also, main service data are allocated in-between data groups, thereby performing the multiplexing process. According to an embodiment of the present invention, based upon a data structure prior to data interleaving, data are allocated to a starting point of a slot (i.e., a first data segment of the slot) starting from the $N^{th}$ packet of the data group. Herein, N is an integer. Also, the value N has a different meaning from the N used in the block processor within the pre-processor 230. For example, when N=1, the data starting from the $1^{st}$ packet of the corresponding data group are allocated to a $1^{st}$ data segment of the current slot. And, when N=38, the data starting from the $38^{th}$ packet of the corresponding data group are allocated to a $1^{st}$ data segment of the current slot. If N=1, one data group may be allocated to one slot.

Figure 17:
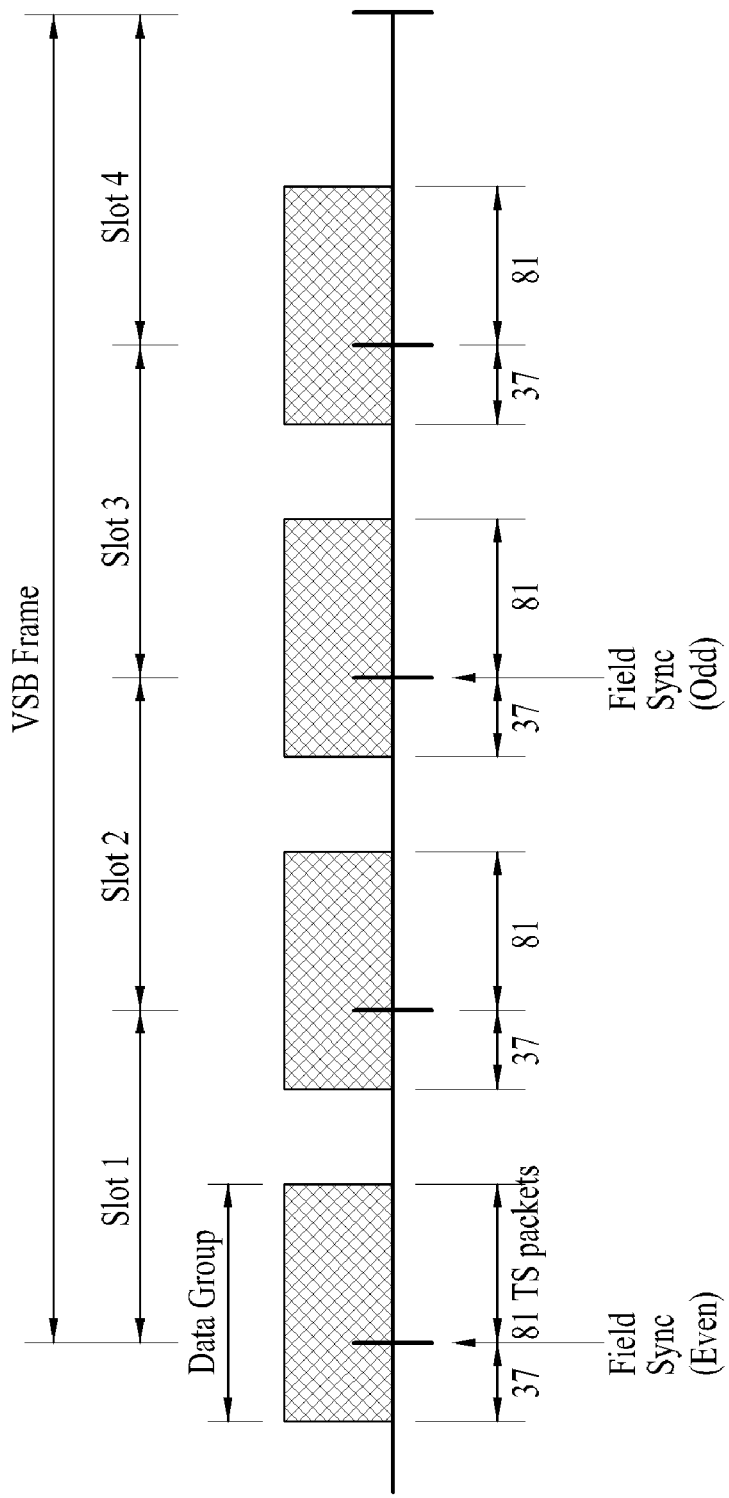
FIG. 17 illustrates a mapping example of the positions to which the first 4 slots of a sub-frame are assigned with respect to a VSB frame based on before being data interleaved according to the present invention.

FIG. 17 illustrates an example of a $38^{th}$ packet of a corresponding data group data being allocated to a starting point of a slot (i.e., the first data segment of the current slot), based upon a data structure prior to data interleaving. In this case, the portion starting from the $1^{st}$ packet to the $37^{th}$ packet of the corresponding data group is allocated to the previous slot. Also, as shown in FIG. 17, when it is assumed that a data group is allocated to each slot with the VSB frame, a synchronization multiplexer 260 may insert a field synchronization signal after the $37^{th}$ packet of the data group being allocated to the $1^{st}$ slot of each field. In this case, the receiving system may also use the field synchronization for channel equalization, thereby enhancing the receiving performance of the corresponding data group.

As described above, after being encoded at a coding rate of 1/N by the block processor, the data of one RS frame is divided into a plurality of output masses based upon the diversity degree. Then, the plurality of output masses divided as described above may be outputted to the same group formatter at different time periods (ref. FIG. 6), and the plurality of output masses may also be outputted to each group formatter so as to be transmitted through different frequencies (ref. FIG. 7 and FIG. 8). The data of each output mass are distributed to a plurality of data groups by the corresponding group formatter, thereby being allocated to the respective region. Such data group passes through the data deinterleaver and packer formatter each connected to the corresponding group formatter, so as to be multiplexed with the main service data by the packet multiplexer 240 in accordance with a pre-decided multiplexing rule.

In the description of the present invention, the plurality of data groups having data within an output mass assigned (or allocated) thereto will be referred to as an "ensemble".

According to an embodiment of the present invention, the data groups included in an ensemble are allocated to be spaced apart from one another as possible within the MPH frame. Thus, the system can be capable of responding promptly and effectively to any burst error that may occur within an ensemble.

Additionally, since the data groups for each ensemble are allocated based upon the MPH frames, the method for allocating the data groups may vary depending upon the corresponding MPH frame. Furthermore, the data groups are equally (or identically) allocated to each sub-frame within an MPH frame.

According to the embodiment of the present invention, in each sub-frame, the data groups are serially allocated to a group space having 4 slots (i.e., 1 VSB frame) from left to right. Therefore, a number of groups of one ensemble per sub-frame (NOG) may correspond to any one integer from '1' to '8'. Herein, since one MPH frame includes 5 sub-frames, the total number of data groups within an ensemble that can be allocated to an MPH frame may correspond to any one multiple of '5' ranging from '5' to '40'.

Figure 18:
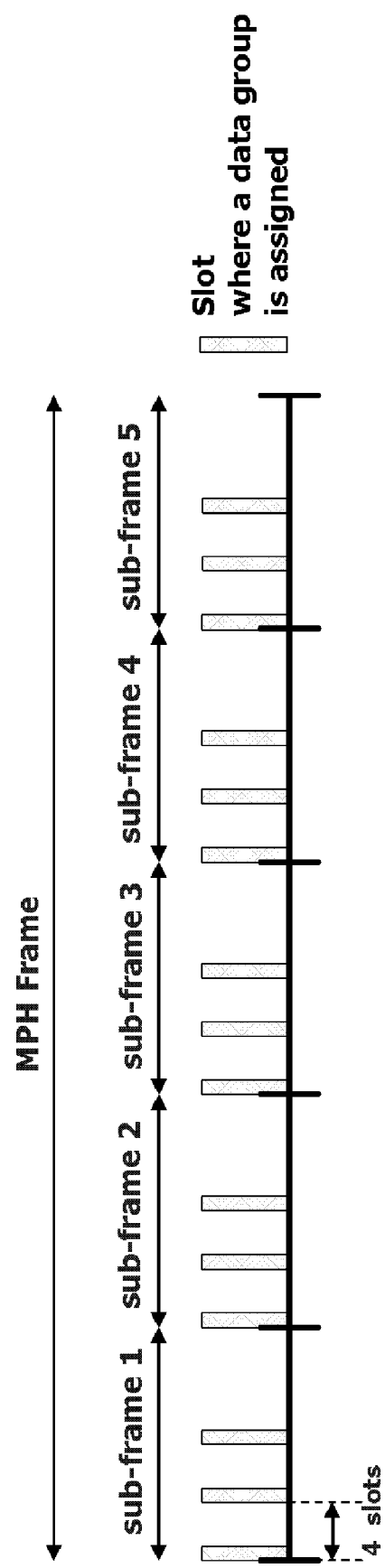
FIG. 18 illustrates an example of data groups of a single ensemble being assigned (or allocated) to an MPH frame.

FIG. 18 illustrates an example of multiple data groups of a single ensemble being allocated (or assigned) to an MPH frame. More specifically, FIG. 18 illustrates an example of a plurality of data groups included in an ensemble having an NOG of '3' being allocated to an MPH frame.

Referring to FIG. 18, 3 data groups are sequentially assigned to a sub-frame at a cycle period of 4 slots. Accordingly, when this process is equally performed in the 5 sub-frames included in the corresponding MPH frame, 12 data groups are assigned to a single MPH frame. Herein, the 15 data groups correspond to data groups included in an ensemble. Therefore, since one sub-frame is configured of 4 VSB frame, and since the NOG is equal to '3', the data group of the corresponding ensemble is not assigned to 1 VSB frame within each sub-frame.

For example, when the RS code mode of a corresponding RS frame is equal to '00' (i.e., when 24 bytes of parity data are added to the corresponding RS frame by an RS encoding process), the parity data occupies approximately 11.37% (=24/(187+24)×100) of the total code word length. Meanwhile, when the NOG is equal to '3', and when the data groups of an ensemble are assigned, as shown in FIG. 18, a total of 15 data groups form an RS frame. Accordingly, even when an error occurs in an entire data group due to a burst noise within a channel, the percentile is merely 6.67% (=1/15×100). Therefore, all errors may be corrected by an erasure RS decoding process. More specifically, when the erasure RS decoding is performed, a number of channel errors corresponding to the number of RS parity bytes may be corrected. By doing so, the receiving system may correct the error of at least one data group within one ensemble. On the other hand, for example, when the same information is transmitted as diversity to two MPH frames, even if an error occurs in all groups within one of the two received MPH frames, and if 11.37% of error occurs in the remaining MPH frame, the error can be corrected. Therefore, errors existing in at least 16 data groups may be corrected.

Meanwhile, when data groups of an ensemble are assigned as described above, either main service data may be assigned between each data group, or data groups corresponding to different ensembles may be assigned between each data group. More specifically, data groups corresponding to multiple ensembles may be assigned to one MPH frame.

Basically, the method of assigning data groups corresponding to multiple ensembles is very similar to the method of assigning data groups corresponding to a single ensemble.

In other words, data groups included in other ensembles that are to be assigned to an MPH frame are also respectively assigned according to a cycle period of 4 slots. At this point, a data group of a different ensemble may be sequentially assigned to a sub-frame starting from the $1^{st}$ VSB frame (i.e., VSB frame 1). Alternatively, a data group of a previous ensemble may be assigned in a circular method starting from a VSB frame to which a data group has not yet been assigned. For example, when it is assumed that data groups corresponding to an ensemble are assigned as shown in FIG. 18, data groups corresponding to the next ensemble may be assigned to a sub-frame starting either from the $1^{st}$ VSB frame (VSB frame 1) or the $4^{th}$ VSB frame (VSB frame 4).

Figure 19:
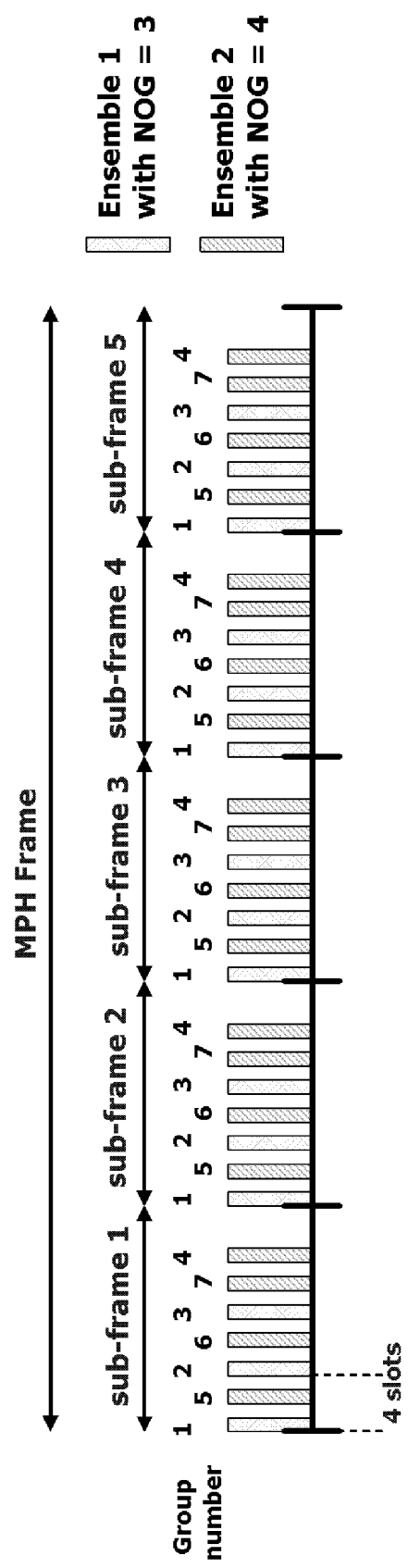
FIG. 19 illustrates an example of data groups of a plurality of ensembles being assigned (or allocated) to an MPH frame.

FIG. 19 illustrates an example of allocating data groups for a plurality of ensembles to one MPH frame. More specifically, FIG. 19 shows an example of data groups of a $1^{st}$ ensemble having an NOG of '3' and data groups of a $2^{nd}$ ensemble having an NOG of '4' being allocated to the MPH frame.

Referring to FIG. 19, when the allocation of the data groups to the $1^{st}$ ensemble is completed, the data group of the $2^{nd}$ ensemble is allocated starting from the $4^{th}$ VSB frame of the $1^{st}$ sub-frame within the corresponding MPH frame. More specifically, the $1^{st}$ data group of the $2^{nd}$ ensemble may be allocated to the $4^{th}$ VSB frame of the $1^{st}$ sub-frame, the $2^{nd}$ data group may be allocated to the $1^{st}$ VSB frame of the $1^{st}$ sub-frame, the $3^{rd}$ data group may be allocated to the $2^{nd}$ VSB frame of the $1^{st}$ sub-frame, and the $4^{th}$ data group may be allocated to the $3^{rd}$ VSB frame of the $1^{st}$ sub-frame. Similarly, the data groups of the $2^{nd}$ ensemble are also allocated in the sub-frames subsequent to the $1^{st}$ sub-frame. More specifically, in FIG. 19, the group number corresponds to an allocating order of the data groups in each sub-frame.

At this point, the allocating order of the data groups in one VSB frame corresponds to the $1^{st}$ slot, the $3^{rd}$ slot, the $2^{nd}$ slot, and the $4^{th}$ slot.

For example, when four data groups are sequentially allocated to the $1^{st}$ slot of the 4 VSB frame within one sub-frame, the next four data groups are sequentially allocated to the $3^{rd}$ slot of each VSB frame within one sub-frame. Then, the next four data groups are sequentially allocated to the $2^{nd}$ slot of each VSB frame within one sub-frame. And, finally, the next four data groups are sequentially allocated to the $4^{th}$ slot of each VSB frame within one sub-frame.

Therefore, when it is assumed that the above-described process is performed, and that 16 data groups are allocated to 4 VSB frame within a sub-frame, in case of the $1^{st}$ VSB frame, the $1^{st}$ data group is allocated to the $1^{st}$ slot, the $5^{th}$ data group is allocated to the $3^{rd}$ slot, the $9^{th}$ data group is allocated to the $2^{nd}$ slot, and the $13^{th}$ slot is allocated to the $4^{th}$ slot.

Meanwhile, when it is assumed that the minimum number of data groups that can be allocated to one sub-frame for one ensemble is equal to '1', up to a maximum number of 16 different ensembles may be transmitted in one MPH frame. This is because the maximum number of 16 data groups may be transmitted to a single sub-frame.

The following Equation 3 indicates the above-described multiplexing rule (or allocation rule) of the above-described data group.

$$\text{SLOT}_i = ((4(i-1) + O_i) \bmod 16) + 1 \qquad \text{Equation 3}$$

Herein,
$O_i = 0$ if $1 \leq i \leq 4$,
$O_i = 2$ else if $i \leq 8$,
$O_i = 1$ else if $i \leq 12$,
$O_i = 3$ else.
Also, $1 \leq \text{SLOT}_i \leq 16$, and $1 \leq i \leq \text{TNOG}$.

More specifically, $\text{SLOT}_i$ represents the slot having the $i^{th}$ data group allocated thereto within a sub-frame. And, the slot number (i) within the sub-frame has any one of the values ranging from '1' to '16'.

And, TNOG represents a total number of groups assigned (or allocated) to all ensembles for one sub-frame.

For example, it is assumed that 2 ensembles are assigned to one MPH frame, and that NOG2 of ensemble 2 is equal to '4' (i.e., NOG2=4). Herein, NOGj represents the number of data groups included in a $j^{th}$ ensemble (ensemble j) of a sub-frame. In this case, within one sub-frame, the data groups of ensemble 1 are assigned to slot 1, slot 5, and slot 9 (wherein, i=1, 2, 3), and the data groups of ensemble 2 are assigned to slot 13, slot 3, slot 7, and slot 11 (wherein, i=4, 5, 6, 7).

Herein, a portion of the RS frame corresponding to ensemble 2 may be mapped in a time order to the $3^{rd}$ data group, the $7^{th}$ data group, the $11^{th}$ data group, and the $13^{th}$ data group. More specifically, when an RS frame is divided and mapped into a plurality of data groups, instead of mapping the RS frame in a slot order, which is decided by substituting an integer for the group number (i) in Equation 3, the RS frame is mapped in a time order starting from the closest slot. In other words, when the NOG of an ensemble is decided, the position of each slot to which the data groups of a corresponding ensemble are transmitted within a sub-frame is also decided. Accordingly, when the RS frame of the corresponding ensemble is divided and transmitted to a plurality of data groups, the RS frame is mapped and transmitted in a time order of the corresponding slots.

Additionally, each sub-frames within the above-described MPH frame, each VSB frame within each sub-frame, and the rule for multiplexing the data groups in each slot within each VSB frame may be pre-decided and shared by the transmitting system and the receiving system. When the transmitting system transmits to the receiving system NOG information of all ensembles that are sent to the corresponding MPH frame, the receiving system can know to which slot the data group of each slot is mapped by using Equation 3. In this case, the group mapping of all ensembles can be known. Hereinafter, the information on which slot the data groups configuring one ensemble are mapped within a sub-frame will be referred to as an ensemble MAP. However, when the NOG information of all ensembles are transmitted as signaling information to all data groups of all ensembles as described above, by receiving the data groups of an ensemble, thereby receiving the signaling information, it is advantageous in that the ensemble MAP for all ensembles existing within the corresponding MPH frame can be known. However, the disadvantage is that the signaling information may be transmitted excessively.

One of the methods for minimizing the amount of signaling information is to transmit only the NOG of the corresponding ensemble. However, when transmitting only the NOG, the ensemble MAP of the corresponding ensemble cannot be obtained by using Equation 3. In order to accurately obtain the ensemble MAP using Equation 3, not only the NOG but also a starting group number (SGN) of the ensemble should be given. In other words, when given the NOG and SGN of the corresponding ensemble, the ensemble MAP of the corresponding ensemble can be obtained. Herein, the SGN indicates the number of the data group, which may be substituted by i in Equation 3. More specifically, referring to FIG. 19, the starting group number (SGN) of ensemble 2 is equal to '4'. This is because the NOG of ensemble 1 is equal to '3' in FIG. 19.

Meanwhile, in order to enable the receiving system to receive only the data of the desired (or requested) ensemble, the transmitting system is required to transmit an identifier for each ensemble (i.e., an ensemble identifier, hereinafter referred to as "ensemble_id") to the receiving system. Since the maximum number of ensembles that can be transmitted (i.e., the maximum number of transmittable ensembles) within an MPH frame is equal to '16', the ensemble_id may be indicated as 4 bits.

Unlike in real-time data broadcasting, such as audio and video data, channel change time is not as significant (or important) as in non-real time data broadcasting. Therefore, the data of a particular ensemble is not required to be transmitted for each MPH frame. Instead, the data may be transmitted once for each set of multiple MPH frames. For example, data may be transmitted once for each 2 MPH frames. In this case, the data rate of the corresponding ensemble may be reduced by ½ as compared to when transmitting data for each MPH frame. Accordingly, when a broadcast station assigns the data rate of an MPH broadcast program, the data may be provided with smaller resolution, thereby increasing the efficiency in applying broadcast programs. In order to do so, an ensemble transmission period (hereinafter referred to as "ETP") is added to the signaling information, thereby indicating that the corresponding ensemble is transmitted once for k number of MPH frames.

As described above, in order to enable the receiving system to know the ensemble MAP of the corresponding ensemble, the transmitting system transmits signaling information, such as ensemble_id, SGN, NOG, ETP, and so on, of the corresponding ensemble.

FIG. 21A describes the SGN, wherein SGN is configured of 4 bits. In this case, the value of SGN may be equal to any one value ranging from '1' to '16'. FIG. 21B describes the NOG, wherein NOG is configured of 3 bits. Herein, the value of NOG may be equal to any one value ranging from '1' to '8'. Furthermore, FIG. 21C describes the ETP, wherein ETP is configured of 2 bits. The ETP indicates the MPH frame cycle period according to which the corresponding ensemble is being transmitted.

Figure 20:
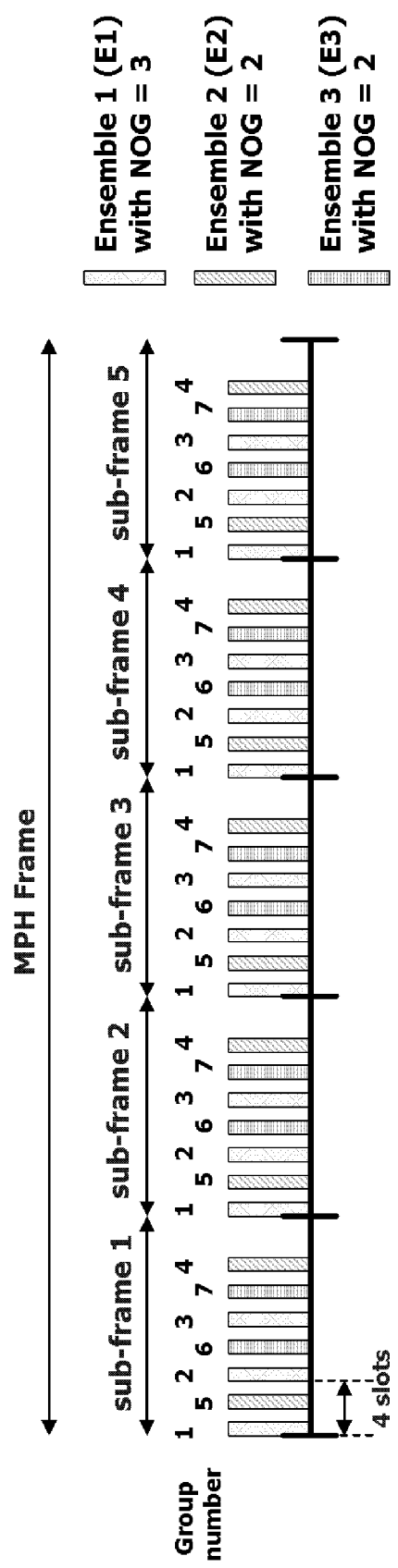
FIG. 20 illustrates an example of data groups of three ensembles being assigned (or allocated) to an MPH frame.

FIG. 20 illustrates an example of 3 ensembles existing in one MPH frame. Referring to FIG. 20, 3 data groups of the $1^{st}$ ensemble (E1), 2 data groups of the $2^{nd}$ ensemble (E2), and 2 data groups of the $3^{rd}$ ensemble (E3) exist in one sub-frame. Therefore, in the $1^{st}$ ensemble, the SGN is equal to '1' (i.e., SGN=1) and the NOG is equal to '3' (i.e., NOG=3). Also, in the $2^{nd}$ ensemble, the SGN is equal to '4' (i.e., SGN=4) and the NOG is equal to '2' (i.e., NOG=2). Similarly, in the $3^{rd}$ ensemble, the SGN is equal to '6' (i.e., SGN=6) and the NOG is equal to '2' (i.e., NOG=2). In FIG. 20, different values may be given for the ensemble_id of each ensemble. Also, different values may be given for the ETP.

Meanwhile, in the receiving system, by turning the power on during a section, wherein the data groups of a requested ensemble are assigned, so as to receive data, and by turning the power off during the remaining sections, excessive power consumption of the receiving system may be reduced. Such characteristic is particularly advantageous in portable and mobile receivers that require low power consumption. For example, it is assumed that data groups of the $1^{st}$ ensemble with NOG=3 and data groups of the $2^{nd}$ ensemble with NOG=2 are assigned to an MPH frame, as shown in FIG. 22(a). It is also assumed that the user uses a keypad provided on a remote controller or terminal to select a mobile service included in the $1^{st}$ ensemble. In this case, the receiving system turns the power on only during a section having the data groups of the $1^{st}$ ensemble assigned thereto, and turns the power off during the remaining sections, as shown in FIG. 22(b), thereby reducing power consumption. At this point, it is preferable that the power is turned on slightly earlier than the section having the actual required data assigned thereto. This is to enable a tuner or a demodulator to converge in advance.

Processing Signaling Information

Meanwhile, apart from the mobile service data, the group formatter may also insert additional (or supplemental) information, such as signaling information providing overall (or general) system information, to the data group. Transmission parameters associated with the transmission and reception of broadcast signals may be determined as the signaling information. Herein, the signaling information is encoded based upon a pre-determined encoding method by the corresponding signaling encoder, thereby being outputted to the corresponding group formatter. For example, the signaling information may include information associated with the RS frame and information associated with the MPH frame (ref., FIG. 21A to FIG. 21C), and so on.

Furthermore, the signaling information may include diversity processing information. The diversity processing information may be encoded by the signaling encoder and, then, outputted to the corresponding group formatter. Alternatively, the diversity processing information may be encoded by the diversity controller and, then, outputted to the corresponding group formatter. However, the signaling information is merely an example proposed to facilitate the understanding of the present invention. And, the addition or deletion of the information included in the signaling information may be easily modified by anyone skilled in the art. Therefore, the present invention will not be limited to the example given herein.

Referring to FIG. 16A and FIG. 16B, it is apparent that, in the data group, a signaling information region for inserting the signaling information is assigned to a partial region of the MPH 4 block (B4).

More specifically, referring to the structure of a data group after being processed with data interleaving, as shown in FIG. 16A, it is apparent that 6 known data regions are assigned to the data group in order to insert known data or known data place holders.

Herein, the 6 known data regions consist of 5 regions for the purpose of training the estimation of a channel impulse response (hereinafter referred to as a "CIR") (or the purpose of training the channel equalizer) and 1 regions for the purpose of acquiring an initial carrier frequency synchronization signal.

Referring to FIG. 16A, the $1^{st}$, $3^{rd}$, $4^{th}$, $5^{th}$, and $6^{th}$ known data regions correspond to the known data regions assigned for the above-described purpose of CIR estimation training or channel equalizer training. Herein, the $1^{st}$ known data region and $3^{rd}$ to $6^{th}$ known data regions may each have relatively different lengths. However, a portion of each known data region has the same pattern value, and each known data region is inserted at equal intervals of 16 segments. In the embodiment of the present invention, the known data region is encoded by 12 trellis encoders, and the status of each trellis encoder is required to be initialized. However, since the regions that can be initialized are pre-decided, it is inevitable to have different lengths for each of the $1^{st}$ known data region and $3^{rd}$ to $6^{th}$ known data regions. Nevertheless, once each of the known data regions is initialized, the 5 known data patterns are each given the same value starting from a predetermined point to the end of each known data region. Also, each of the known data regions is spaced apart at equal intervals.

Meanwhile, the $2^{nd}$ known data region may be used for acquiring an initial carrier frequency synchronization signal from the receiving system, or for estimating the position of a field synchronization signal or the positions of other known data regions. In order to do so, the $2^{nd}$ known data region is configured of 2 sets of known data having the same pattern assigned thereto. In the present invention, the above-described $1^{st}$ and $3^{rd}$ to $6^{th}$ known data regions may be referred to as "CIR known data regions", and the $2^{nd}$ known data region may be referred to as an "ACQ known data region", wherein ACQ stands for "acquisition".

At this point, the data assigned to the CIR known data regions and the ACQ known data region correspond to known data pre-decided based upon an agreement between the transmitting system and the receiving system. Herein, each data group maintains the same pattern. According to the embodiment of the present invention, a signaling region is assigned between the $1^{st}$ known data region and the $2^{nd}$ known data region. This region may also be referred to as a "signaling information region". Herein, the data assigned to the signaling information region include signaling information associated with the corresponding MPH frame, sub-frame, VSB frame, slot, and data group. Therefore, the data may differ in each data group.

Referring to FIG. 16A and FIG. 16B, the initialization data region corresponds to a region in which trellis memory initialization is performed in the trellis encoding module.

At this point, the signaling information region may be encoded at a coding rate stronger than ½ or ¼ (e.g., at a coding rate of ⅙ or ⅛), thereby enhancing the receiving performance.

Among the signaling information, the information associated with MPH frames may include sub-frame count information, slot count information, and also information on ensemble_id, SGN, NOG, and ETP, as shown in FIG. 23.

Herein, the sub-frame count information and the slot count information correspond to information for the synchronization of one MPH frame. The SGN and NOG information correspond to information for configuring an ensemble MAP (or ensemble MAP information) of the corresponding ensemble in one MPH frame.

The sub-frame count information indicates a counter value designating the number of each sub-frame within one MPH frame.

Furthermore, the slot count information indicates a counter value designating the number of each slot within one sub-frame.

Moreover, service or system information may also be transmitted to the signaling information region. Such information may be used for the purpose of accelerating service acquisition when the power of the receiving system is turned on, or when a broadcast service that is currently being viewed is changed (or switched). For example, information associated with the service included in each ensemble may be transmitted to the signaling information region. Herein, the information associated with the service may include service_id or major and minor channel numbers. Additionally, a text label for each service (e.g., short text information of FOX-TV1, WUSA-RADIO, etc.) and detailed information (i.e., PID or IP address or port number) on an elementary stream configuring each service may also be included in the information associated with the service.

When such information are transmitted from the transmitting system by means of the signaling information region, the receiving system may decode the transmitted information and be informed of the types of services existing in the ensemble that is currently being received. By using such information, the receiving system may also find (or detect) the ensemble_id corresponding to the ensemble including a requested (or desired) broadcast service. When the ensemble_id of a requested broadcast service is detected, the receiving system may be able to reduce power consumption by receiving only the corresponding ensemble. Herein, the above-described ensemble including the requested broadcast service may correspond to the ensemble that was most currently received (i.e., the last received ensemble). Furthermore, when an electronics service guide (ESG) is transmitted to the signaling information region, the receiving system may be capable of decoding, based upon a pre-decided time interval or a request, the signaling information included in data groups corresponding to ensembles other than the ensemble that is currently being received, thereby updating the contents of other services that are to be broadcasted in the future.

Figure 24:
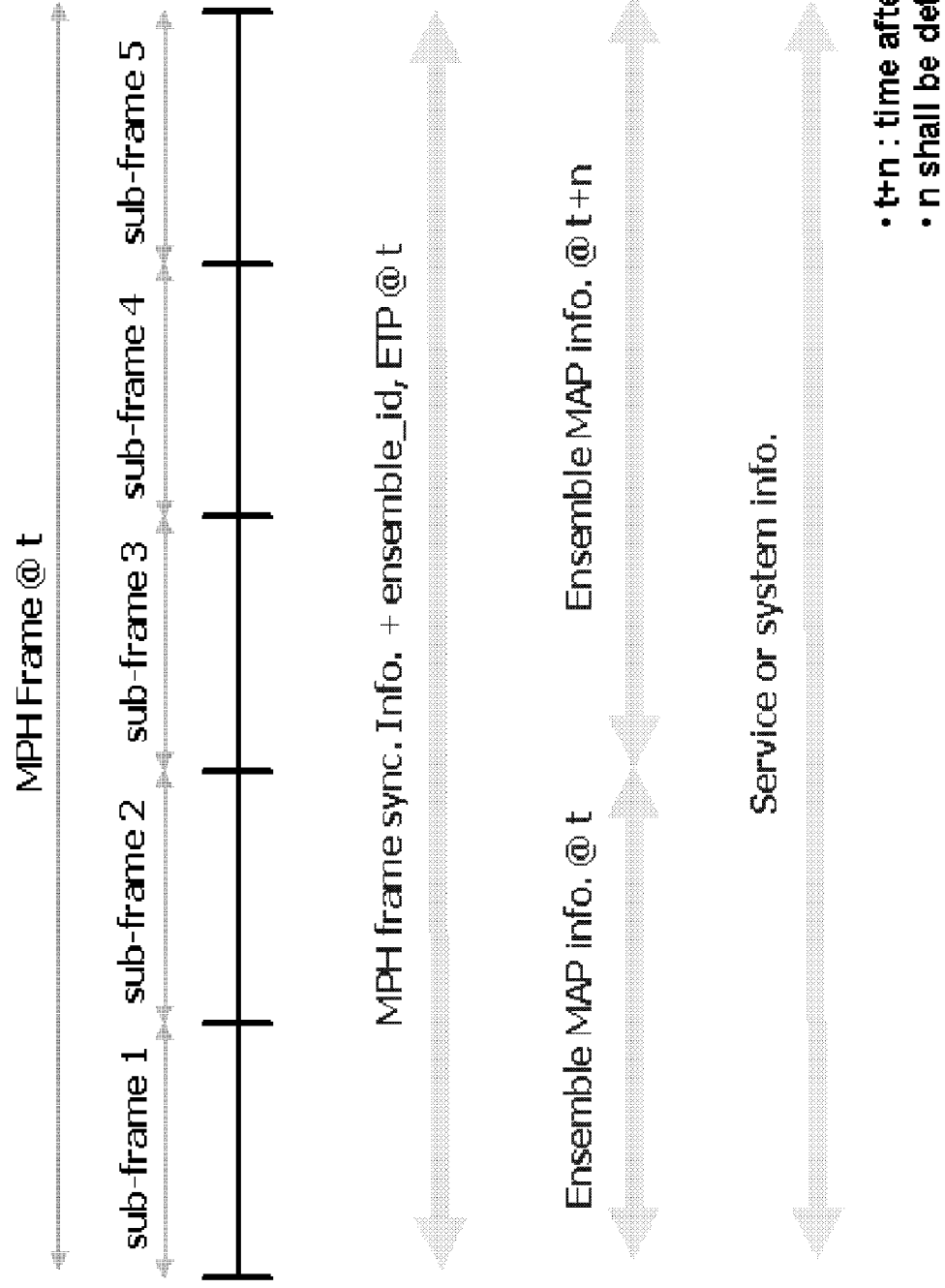
FIG. 24 illustrate an example of signaling information scenario being transmitted in signaling information region according to the present invention.

FIG. 24 illustrate examples of a signaling information scenario being transmitted to the signaling information region according to the present invention. More specifically, FIG. 24 respectively illustrate examples of transmitting signaling information of a current MPH frame, as well as signaling information of a future MPH frame, from a current MPH frame section. Referring to FIG. 24, @t represents a current point, and @t+n indicates a point after n number of MPH frames. Herein, the value of n is decided by an ETP, which corresponds to a cycle period for transmitting an ensemble. Herein, when ETP is equal to '00' (i.e., ETP=00), this indicates that a corresponding ensemble is transmitted in each MPH frame. Therefore, n is equal to '1' (i.e., n=1). Also, when ETP is equal to '01' (i.e., ETP=01), this indicates that a corresponding ensemble is transmitted in each 2 MPH frames. Therefore, n is equal to '2' (i.e., n=2). Similarly, when ETP is equal to '10' (i.e., ETP=10), this indicates that a corresponding ensemble is transmitted in each 3 MPH frames. Therefore, n is equal to '3' (i.e., n=3).

According to the present invention, the above-described signaling information may be inserted in the signaling information region of each data group assigned to one MPH frame and then transmitted. In this case, the signaling information of a current MPH frame or the signaling information of a future MPH frame may be transmitted based upon the sub-frame position. For example, since the sub-frame count information and the slot count information respectively indicate the position information corresponding to the sub-frame included in the current MPH frame and the position information corresponding to the slot included in the current sub-frame, the sub-frame count information and the slot count information of the current point are transmitted from all sub-frame sections.

Furthermore, ensemble MAP information, such as SGN and NOG information, may vary in ensemble units and the data group of each ensemble is equally divided and assigned to 5 sub-frames. Therefore, the ensemble MAP information of the current point may be transmitted up to the $N^{th}$ sub-frame (e.g., $2^{nd}$ sub-frame) within an MPH frame. Then, the ensemble MAP information of the next point may be transmitted starting from the $3^{rd}$ sub-frame. Finally, the service or system information of the current point may be transmitted from all sub-frame sections.

As described above, if the information of the next point is transmitted in advance within an MPH frame, the receiving system may repeatedly receive in advance important transmission parameters (e.g., FEC-associated information, ensemble MAP information, etc.) that are to be used in a future MPH frame. Thus, the receiving system can receive corresponding ensembles with more stability even when diverse interference occurs in the channel. Furthermore, since the receiving system can extract known data place information, the receiving system may estimate a signaling information region based upon the extracted known data place information. Thereafter, the receiving system may extract the signaling information from the estimated signaling information region and decode the extracted signaling information, thereby using the decoded signaling information to recover the mobile service data.

Figure 26:
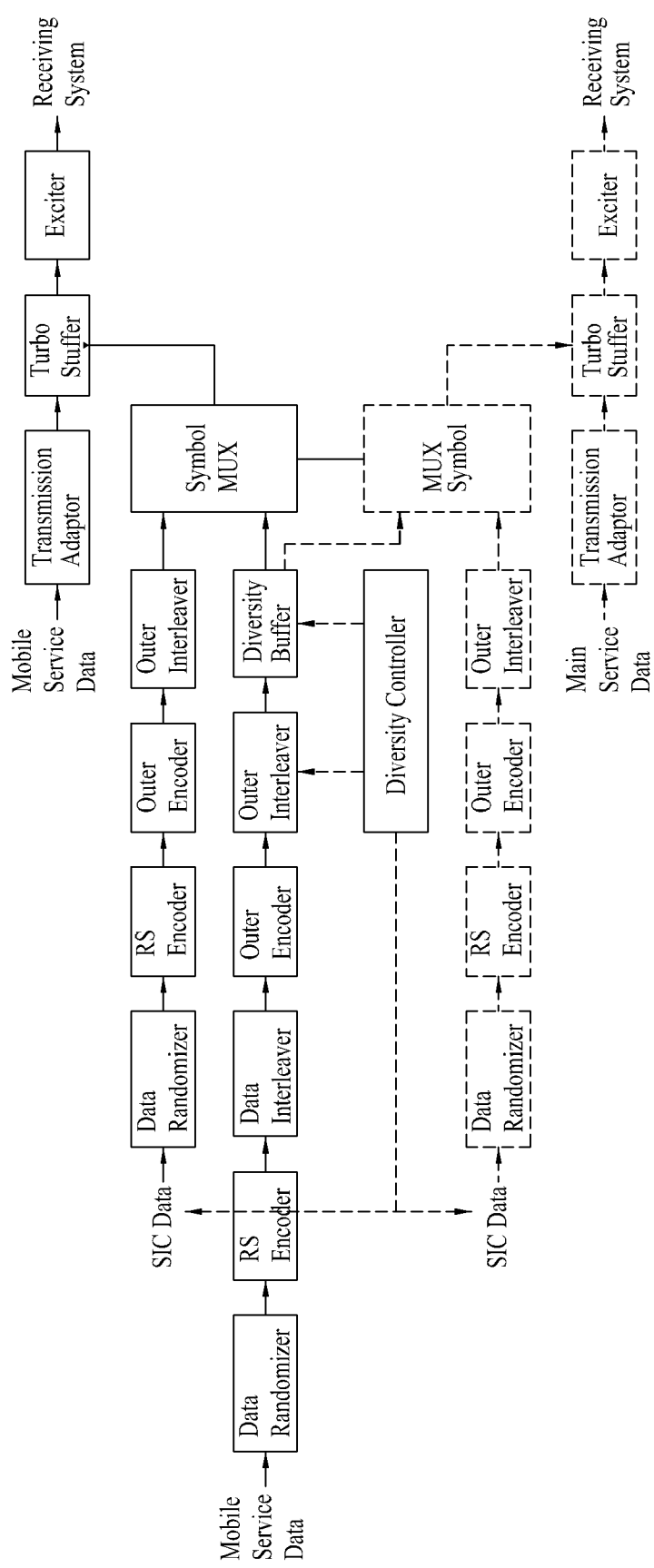
FIG. 26 illustrates a block diagram of a pre-processor according to another embodiment of the present invention.

FIG. 26 illustrates a block diagram showing the structure of the pre-processor according to another embodiment of the present invention. Herein, FIG. 26 shows an example for scattering and transmitting particularly the mobile service data in the time section.

More specifically, the mobile service data are randomized by the data randomizer 701 and then inputted to the RS encoder 702. The RS encoder 702 receives the randomized mobile service data and performs error correction encoding on the received randomized mobile service data. For example, the RS encoder 702 may perform error detection encoding on the error correction encoded mobile service data. Herein, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated. The RS encoding is one of forward error correction (FEC) methods.

The mobile service data being encoded by the RS encoder 702 for error correction are inputted to the data interleaver 703. Thus, an interleaving process scattering data along a time axis is performed. The interleaved mobile service data are inputted to the outer encoder 704, thereby being outer-encoded. The embodiment of the outer encoder 704 may correspond to the block processor. At this point, the outer encoder 704 is controlled by the diversity controller 700 so as to decide the coding rate. Then, after performing 1/N-rate encoding on one bit input, thereby forming an N-bit output, the encoded mobile service data are divided into a plurality of output masses with respect to the corresponding diversity degree value. The outer encoder 704 may independently perform trellis-encoding on the mobile service data of each output mass.

The mobile service data corresponding to each output mass of the outer encoder 704 are inputted to the outer interleaver 705. The outer interleaver 705 independently performs outer interleaving on the mobile service data corresponding to each output mass, so as to realign the data order, thereby outputting the processed data to the diversity buffer 706. Herein, the bit-unit interleaving and symbol-unit interleaving are performed as embodiments of the outer interleaving process. The output of the outer interleaver 705 is temporarily stored in the diversity buffer 706. Then, based upon the control of the diversity controller 700, the diversity buffer 706 outputs the mobile service data corresponding to each output mass to the symbol multiplexer 707, while taking into consideration the diversity method, the transmission unit, and the transmission cycle period.

For example, in case of time diversity transmission, each output mass stored in the diversity buffer 706 is outputted to a turbo stuffer 713 through the symbol multiplexer 707 at different timing points.

Meanwhile, the signaling information (or SIC (Signaling Information Channel)), such as transmission parameter and diversity processing information, is randomized by the data randomizer 708, error-correction encoded by the RS encoder 709, outer-encoded by the outer encoder 710, and interleaved by the outer interleaver 711, thereby being inputted to the symbol multiplexer 707. More specifically, the diversity processing information, which corresponds to one of the SIC data required by the receiving system for recovering the mobile service data transmitted by the transmitting system, are additionally loaded in the SIC or information of a higher layer and transmitted, so that the receiving system can adequately recover the diversity transmission. The SIC data including the diversity processing information may either be processed with both outer-encoding and trellis-coding, just as the mobile service data, thereby being outputted, or be processed with only one of the coding processes, thereby being outputted.

The symbol multiplexer 707 multiplexes the signaling information and mobile service data corresponding to each output mass in accordance with a pre-determined multiplexing rule, thereby outputting the multiplexed data to the turbo stuffer 713.

The turbo stuffer 713 combines the main service data being inputted through a transmission adaptor 712 with the output data of the symbol multiplexer 707, thereby outputting the combined data to the exciter 714. At this point, the turbo stuffer 713 may perform trellis-coding on the main service data and the mobile service data. Herein, the trellis-coding process may be performed prior to or after the symbol multiplexing process. The exciter 714 inserts a field synchronization signal, a segment synchronization signal, and a pilot in the output of the turbo stuffer 713, thereby modulating the processed data by a predetermined modulation method, such as the VSB method, and outputting the modulated data to the receiving system. Thus, the mobile service data corresponding to each output mass are assigned to different transmission sections, so as to be processed with time diversity transmission, as shown in FIG. 9(a).

Meanwhile, the blocks marked by dotted lines in FIG. 26 respectively correspond to blocks that are additionally required for scattering the mobile service data to two different frequencies and transmitting the scattered data as diversity information. More specifically, in order to scatter mobile service data to M number of different frequencies, M number of dotted blocks are required. The basic functions of each of these blocks are identical to the functions of the blocks marked in solid lines. However, the output frequency of the dotted exciter must be different from the output frequency of the solid line exciter 714.

Demodulating Unit within Receiving System

Figure 27:
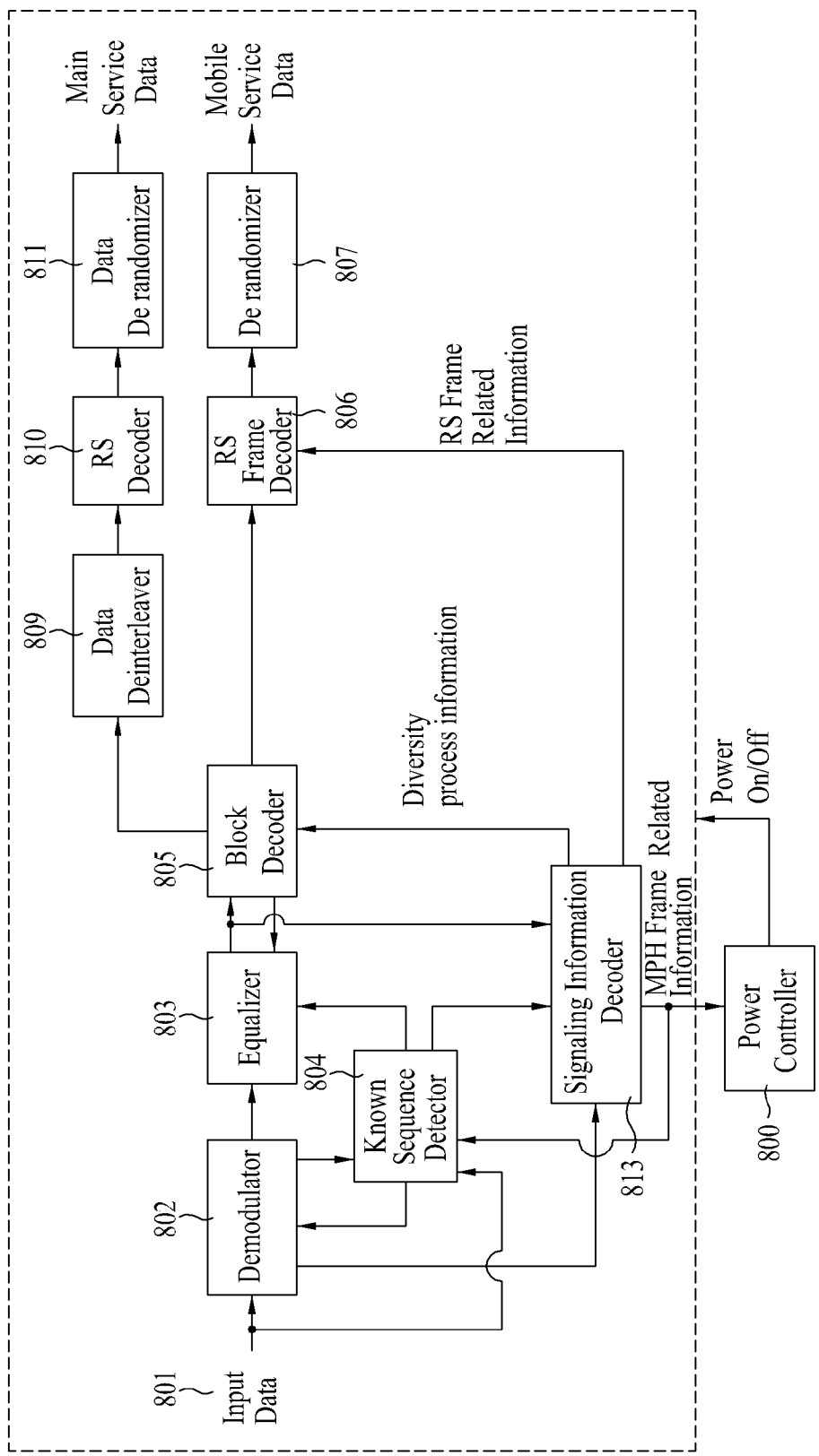
FIG. 27 illustrates a block diagram of a demodulating unit of a receiving system according to an embodiment of the present invention.

FIG. 27 illustrates an example of a demodulating unit in a receiving system according to the present invention. The demodulating unit of FIG. 27 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 27, the demodulating unit includes a demodulator 802, an equalizer 803, a known sequence detector 804, a block decoder 805, a RS frame decoder 806, and a derandomizer 807. The demodulating unit may further include a data deinterleaver 809, a RS decoder 810, and a data derandomizer 811. The demodulating unit may further include a signaling decoder 813. The receiving system also may further include a power controller 800 for controlling power supply of the demodulating unit.

Herein, for simplicity of the description of the present invention, the RS frame decoder 806, and the derandomizer 807 will be collectively referred to as a mobile service data processing unit. And, the data deinterleaver 809, the RS decoder 810, and the data derandomizer 811 will be collectively referred to as a main service data processing unit. For example, when a receiving system is for receiving mobile service data only, the main service data processor may be omitted in the structure of the receiving system.

More specifically, a frequency of a particular channel tuned by a tuner down converts to an intermediate frequency (IF) signal. Then, the down-converted data 801 outputs the down-converted IF signal to the demodulator 802 and the known sequence detector 804. At this point, the down-converted data 801 is inputted to the demodulator 802 and the known sequence detector 804 via analog/digital converter ADC (not shown). The ADC converts pass-band analog IF signal into pass-band digital IF signal.

The demodulator 802 performs self gain control, carrier recovery, and timing recovery processes on the inputted pass-band digital IF signal, thereby modifying the IF signal to a base-band signal. Then, the demodulator 802 outputs the newly created base-band signal to the equalizer 803 and the known sequence detector 804.

The equalizer 803 compensates the distortion of the channel included in the demodulated signal and then outputs the error-compensated signal to the block decoder 805.

At this point, the known sequence detector 804 detects the known sequence position information inserted by the transmitting end from the input/output data of the demodulator 802 (i.e., the data prior to the demodulation process or the data after the demodulation process). Thereafter, the position information along with the symbol sequence of the known data, which are generated from the detected position, is outputted to the demodulator 802, the equalizer 803, and the signaling decoder 813. Also, the known sequence detector 804 outputs a set of information to the block decoder 805. This set of information is used to allow the block decoder 805 of the receiving system to identify the mobile service data that are processed with additional encoding from the transmitting system and the main service data that are not processed with additional encoding.

In addition, although the connection status is not shown in FIG. 27, the information detected from the known sequence detector 804 may be used throughout the entire receiving system and may also be used in the RS frame decoder 806.

At this point, the transmitting system may periodically insert and transmit known data within a transmission frame, as shown in FIG. 16A.

Figure 28:
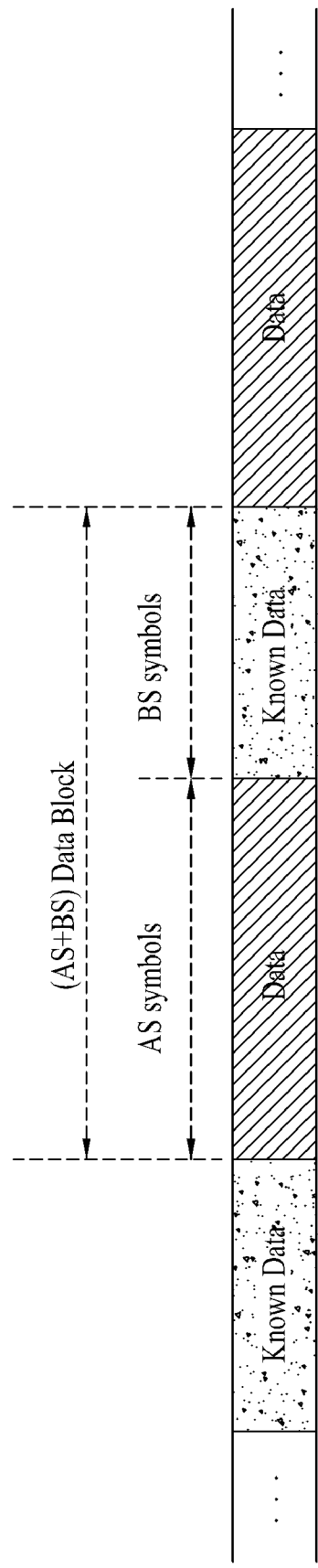
FIG. 28 illustrates a data structure showing an example of known data being periodically inserted in actual data according to the present invention.

FIG. 28 illustrates an example of known data sequence being periodically inserted and transmitted in-between actual data by the transmitting system. Referring to FIG. 28, AS represents the number of general data symbols, and BS represents the number of known data symbols. Therefore, BS number of known data symbols are inserted and transmitted at a period of (AS+BS) symbols. Herein, AS may correspond to mobile service data, main service data, or a combination of mobile service data and main service data. In order to be differentiated from the known data, data corresponding to AS will hereinafter be referred to as general data.

Referring to FIG. 28, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence.

Accordingly, when the known data are regularly inserted in-between the valid data as described above, the channel equalizer included in the digital broadcast receiver used the inserted known data as a training sequence, so as to be used either for an accurate decision value or for estimating an impulse response of a channel.

Meanwhile, when the same known data are regularly inserted, the known data interval may be used as a guard interval in a channel equalizer according to the present invention. Herein, the guard interval prevents interference that occurs between blocks due to a multiple path channel. This is because the known data of the known data section located at the end portion of the data block of the (AS+BS) symbol, shown in FIG. 28, may be considered to be copied and place before the data block.

The above-described structure is referred to as a cyclic prefix. This structure provides circular convolution to an impulse response in a time domain between a data block transmitted from the transmitting system and a channel. Accordingly, this facilitates the channel equalizer of a receiving system to perform channel equalization in a frequency domain by using a fast fourier transform (FFT) and an inverse fast fourier transform (IFFT).

More specifically, when viewed in the frequency domain, the data block received by the receiving system is expressed as a multiplication of the data block and the channel impulse response. Therefore, when performing the channel equalization, by multiplying the inverse of the channel in the frequency domain, the channel equalization may be performed more easily.

The known data detector 804 detects the position of the known data being periodically inserted and transmitted as described above. At the same time, the known data detector 804 may also estimate initial frequency offset during the process of detecting known data. In this case, the demodulator 802 may estimate with more accuracy carrier frequency offset from the information on the known data position (or known sequence position indicator) and initial frequency offset estimation value, thereby compensating the estimated carrier frequency offset.

Meanwhile, when the known data are transmitted in the same structure as that shown in FIG. 16A, the known sequence detector 804 initially detects the position of the second known data region using second known data, which the same pattern is repeated twice, included in the second known data region.

At this point, since the known sequence detector 804 is well-informed of the data group structure, when the position of the second known data region is detected, the known sequence detector 804 can estimate positions of the $1^{st}$ known data region and $3^{rd}$ to $6^{th}$ known data regions of a corresponding data group, by counting symbols or segments based upon the second known data region position. Also, when the corresponding data group includes a field synchronization segment, the known sequence detector 804 can further estimate the position of the field synchronization segment of the corresponding data group, which is positioned chronologically before the second known data region, by counting symbols or segments based upon the second known data region position. The known sequence detector 804 also may configure an ensemble map by inputting an MPH-related information from the signaling information decoder 813, and output the known data position information and field synchronization position information from the ensemble including the service which a user select based upon the ensemble map.

The estimated position information of the field synchronization segment and known data regions are provided to the demodulator 802 and the equalizer 803.

Also, the known sequence detector 804 can estimate an initial frequency offset using the known data inserted in the second known data region (i.e., ACQ known data region).

In this case, the demodulator 802 may estimate with more accuracy carrier frequency offset from the known data position information and the initial frequency offset estimation value, thereby compensating the estimated carrier frequency offset.

More specifically, the demodulator 802 may use the known data in order to detect the timing error. In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain.

The equalizer 803 may perform channel equalization by using a plurality of methods. An example of estimating a channel impulse response (CIR) so as to perform channel equalization will be given in the description of the present invention.

Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and/or the field synchronization data, so as to estimate the CIR, the present invention may be able to perform channel equalization with more stability.

Herein, the data group that is inputted for the equalization process is divided into regions A to D, as shown in FIG. 16A. More specifically, in the example of the present invention, each region A, B, C, and D are further divided into MPH blocks B4 to B7, MPH blocks B3 and B8, MPH blocks B2 and B9, MPH blocks B1 and B10, respectively.

More specifically, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data. For example, the data of the MPH block B3 including the field synchronization data performs channel-equalization using the CIR calculated from the field synchronization data area and the CIR calculated from the first known data area. Also, the data of the MPH blocks B1 and B2 performs channel-equalization using the CIR calculated from the field synchronization data area and the CIR calculated from the first known data area. Meanwhile, the data of the MPH blocks B4 to B6 not including the field synchronization data performs channel-equalization using CIRS calculated from the first known data area and the third known data area.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Power On/Off Control

The data demodulated in the demodulator 802 or the data equalized in the channel equalizer 803 is inputted to the signaling information decoder 813. The known data information detected in the known sequence detector 804 is inputted to the signaling information decoder 813.

The signaling information decoder 813 extracts and decodes signaling information from the inputted data, the decoded signaling information provides to blocks requiring the signaling information. For example, the diversity processing information may output to the block decoder 805, and the RS frame-associated information may output to the RS frame decoder 806. The MPH frame-associated information may output to the known sequence detector 804 and the power controller 800.

Herein, the MPH frame-associated information may include sub-frame count information, slot count information, ensemble_id information, SGN information, NoG information, ETP information and so on.

More specifically, the signaling information between first known data area and second known data area can know by using known data information being outputted in the known sequence detector 804. Therefore, the signaling information decoder 813 may extract and decode signaling information from the data being outputted in the demodulator 802 or the channel equalizer 803.

The power controller 800 may configure the ensemble map by inputting the MPH frame-associated information from the signaling information decoder 813, and controls power of the tuner and the demodulating unit depending upon the ensemble map.

According to the embodiment of the present invention, the power controller 800 turns the power on only during a slot to which a data group of the ensemble including user-selected mobile service is assigned. The power controller 800 then turns the power off during the remaining slots.

Figure 22:
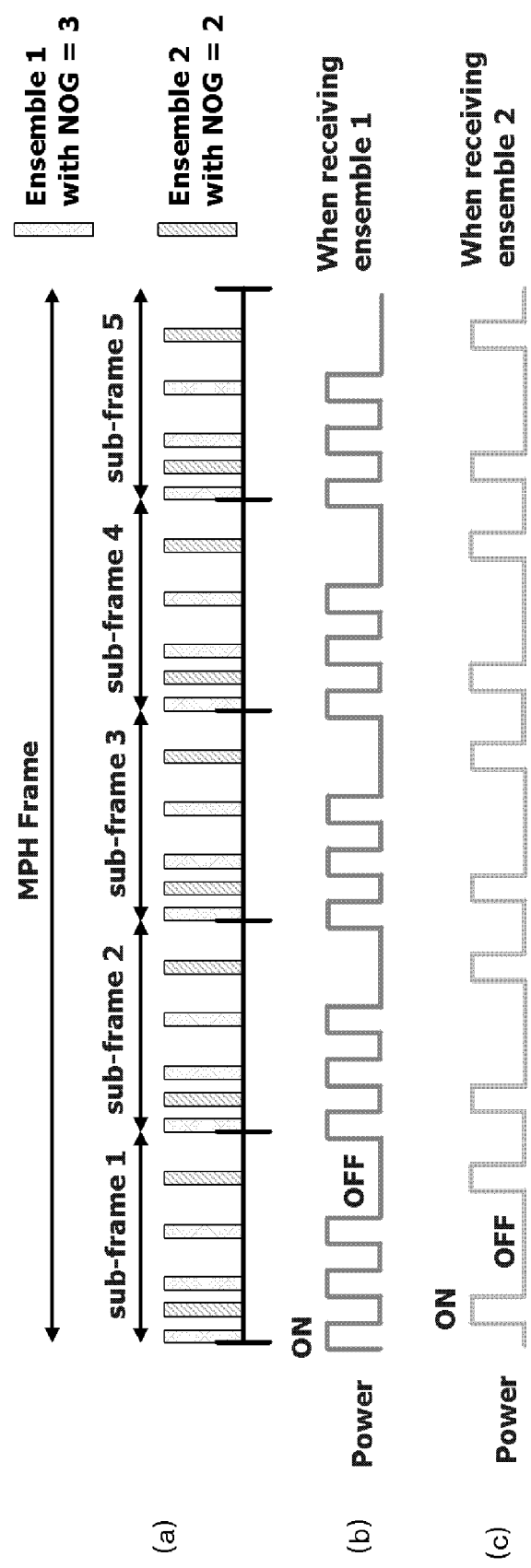
FIG. 22 illustrates an example of power saving when there are three ensembles in a MPH frame according to the present invention.

For example, it is assumed that data groups of a $1^{st}$ ensemble with NOG=3, a $2^{nd}$ ensemble with NOG=4 are assigned to one MPH frame, as shown in FIG. 22(*a*). It is also assumed that the user has selected a mobile service included in the $1^{st}$ ensemble using the keypad provided on the remote controller or terminal. In this case, the power controller 800 turns the power on only during slots that data groups of the $1^{st}$ ensemble is assigned, as shown in FIG. 2(*b*), and turns the power off during the remaining slots, thereby reducing power consumption.

Block Decoder

Meanwhile, if the data being inputted to the block decoder 805, after being channel-equalized by the equalizer 803, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder 805 correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 805 are then outputted to the RS frame decoder 806. More specifically, the block decoder 805 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 805 outputs the processed data to the RS frame decoder 806. Herein, the removal of the data may be performed before the block decoding process, or may be performed during or after the block decoding process.

Meanwhile, the data trellis-decoded by the block decoder 805 are outputted to the data deinterleaver 809. At this point, the data being trellis-decoded by the block decoder 805 and outputted to the data deinterleaver 809 may not only include the main service data but may also include the data within the RS frame and the signaling information. Furthermore, the RS parity data that are added by the transmitting system after the pre-processor 230 may also be included in the data being outputted to the data deinterleaver 809.

According to another embodiment of the present invention, data that are not processed with block decoding and only processed with trellis encoding by the transmitting system may directly bypass the block decoder 805 so as to be outputted to the data deinterleaver 809. In this case, a trellis decoder should be provided before the data deinterleaver 809. More specifically, if the inputted data correspond to the data having only trellis encoding performed thereon and not block encoding, the block decoder 805 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 805 outputs a soft decision value with respect to the inputted data.

In other words, if the inputted data correspond to data being processed with block encoding by the block processor 302 and being processed with trellis encoding by the trellis encoding module 606 in the transmitting system, the block decoder 805 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 805 to maximize its performance of decoding externally encoded data, the decoder of the internal code should output a soft decision value.

Figure 29:
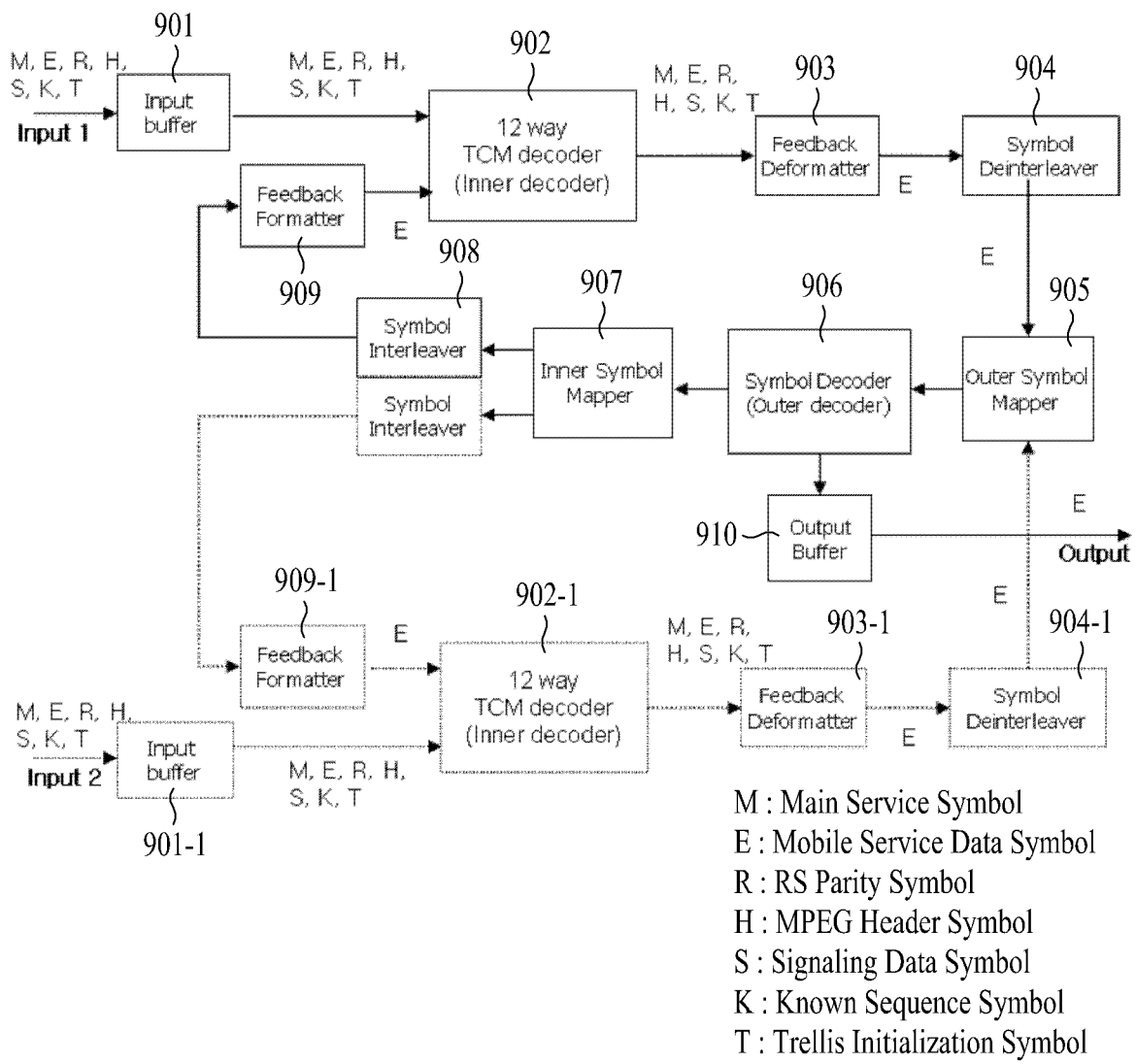
FIG. 29 illustrates a block diagram of a block decoder according to another embodiment of the present invention.

FIG. 29 illustrates a detailed block diagram of the block decoder 805 according to an embodiment of the present invention. Referring to FIG. 29, the block decoder 805 includes an input buffer 901, a trellis decoding unit (or 12-way trellis coded modulation (TCM) decoder or inner decoder) 902, a feedback deformatter 903, a symbol deinterleaver 904, an outer symbol mapper 905, a symbol decoder 906, an inner symbol mapper 907, a symbol interleaver 908, a feedback formatter 909, and an output buffer 910. Herein, just as in the transmitting system, the trellis decoding unit 902 may be viewed as an inner (or internal) decoder. And, the symbol decoder 906 may be viewed as an outer (or external) decoder.

Also, if the transmitting system divided the mobile service data into a plurality of output masses and performed diversity transmission, processing of the corresponding data should be performed by the input buffer, the trellis encoder, the feedback deformatter, the symbol deinterleaver, and the packet formatter, the number of which corresponds to the number of output masses. When the diversity degree is '2', the dotted-lined blocks of FIG. 29 correspond to the block decoder. More specifically, the block decoder of FIG. 29 including the dotted-lined blocks may decode mobile service data having the diversity degree of '2'. In case of the frequency diversity transmission, demodulators and equalizers are further required, the numbers of demodulators and equalizers corresponding to the diversity degree.

At this point, the diversity processing information on the diversity method and structure, which is transmitted from the transmitting system, is included in the signaling information or channel information of an upper layer and transmitted. Therefore, the data of each output mass may be inputted to the corresponding input buffer. More specifically, among the data being inputted to each input buffer 901 and 901-1, the mobile service data correspond to symbols belonging to each output mass mob A and mob B, which are transmitted as shown in FIG. 9(*a*), FIG. 9(*b*), and FIG. 9(*c*). For example, the mobile service data symbol of the output mass mob A is inputted to the input buffer 901, and the mobile service data symbol of the output mass mob B is inputted to the input buffer 901-1, and vice versa.

Since each of the output masses is encoded by an independent symbol interleaver, as shown in FIG. 10 to FIG. 12B, the block decoder also requires an independent symbol interleaver and an independent symbol deinterleaver.

Also, since the block processor of the transmitting system has divided and outputted the 1/N-rate encoded mobile service data to 2 output masses, an outer symbol mapper 905 groups the soft-decision value of the output symbol outputted from the two symbol deinterleavers 904 and 904-1, so as to configure one soft-decision value and output the one soft-decision value to the symbol decoder 906. Additionally, an inner symbol mapper 907 breaks-down (or divides) one soft-decision value outputted from the symbol decoder 906 into two soft-decision values, which are then respectively outputted to each symbol interleaver 908 and 908-1. In order to do so, the input buffers 901 and 901-1, the outer symbol mappers 905 and 905-1, and the inner symbol mappers 907 and 907-1 may receive the decoded diversity processing information from the signaling information decoder 813.

When excluding the portion marked in dotted lines of FIG. 29, the above-described diversity-specific block decoder may also be operated as a general block decoder. For example, even in a situation when the output mass mob A cannot be received due to the initial turning-on of the receiver or a change in the frequency channel, the block decoding function may be performed by using only the other output mass mob B. Therefore, the above-described diversity-specific block decoder is advantageous in that, even when any one of the output masses mob A or mob B is not completely received, data recovery can be performed by using just one output mass.

Hereinafter, the solid-lined blocks included in the block decoder of FIG. 29 will be described in detail. Since the functions and operations of the dotted-lined blocks are similar to those of the solid-lined blocks, detailed description of the same will be omitted for simplicity. More specifically, among the symbol values being channel-equalized and outputted from the equalizer 803, the input buffer 901 temporarily stores the mobile service data symbol (including RS parity data symbols added when performing RS-frame encoding and CRC data symbols) values of the corresponding output mass, which is block-encoded and diversity-transmitted. Then, the input buffer 901 repeatedly outputs the stored symbol values for M number of times to the trellis decoder 902 in a turbo decoding length (TDL) size for turbo decoding. The turbo decoding length (TDL) size may also be referred to as a turbo block. Herein, a TDL should include at least one MPH block size. The value of M corresponds to a number of repetitions of the pre-decided turbo decoding process.

Also, among the values of symbols being channel-equalized and outputted from the equalizer 803, the input symbol values corresponding to a section having no mobile service data symbols (including RS parity data symbols during RS frame encoding and CRC data symbols) included therein, bypass the input buffer 901 without being stored. More specifically, since trellis-encoding is performed on input symbol values of a section wherein block-encoding has not been performed, the input buffer 901 inputs the inputted symbol values of the corresponding section directly to the trellis decoding module 902 without performing any storage, repetition, and output processes.

The storage, repetition, and output processes of the input buffer 901 are controlled by the feedback controller (not shown). Herein, the feedback controller refers to diversity processing information, which is outputted from the signaling information decoder 813, in order to control the storage and output processes of the input buffer 901.

The trellis decoding unit 902 includes a 12-way TCM decoder. Herein, the trellis decoding unit 902 performs 12-way trellis decoding as inverse processes of the 12-way trellis encoder.

More specifically, the trellis decoding unit 902 receives a number of output symbols of the input buffer 901 and soft-decision values of the feedback formatter 909 equivalent to each TDL, so as to perform the TCM decoding process.

At this point, based upon the control of the feedback controller, the soft-decision values outputted from the feedback formatter 909 are matched with a number of mobile service data symbol places so as to be in a one-to-one (1:1) correspondence. Herein, the number of mobile service data symbol places is equivalent to the TDL being outputted from the input buffer 901.

More specifically, the mobile service data being outputted from the input buffer 901 are matched with the turbo decoded data being inputted, so that each respective data place can correspond with one another. Thereafter, the matched data are outputted to the trellis decoding unit 902. For example, if the turbo decoded data correspond to the third symbol within the turbo block, the corresponding symbol (or data) is matched with the third symbol included in the turbo block, which is outputted from the input buffer 901. Subsequently, the matched symbol (or data) is outputted to the trellis decoding unit 902.

In order to do so, while the regressive turbo decoding is in process, the feedback controller controls the input buffer 901 so that the input buffer 901 stores the corresponding turbo block data. Also, by delaying data (or symbols), the soft decision value (e.g., LLR) of the symbol outputted from the symbol interleaver 908 and the symbol of the input buffer 901 corresponding to the same place (or position) within the block of the output symbol are matched with one another to be in a one-to-one correspondence. Thereafter, the matched symbols are controlled so that they can be inputted to the TCM decoder through the respective path. This process is repeated for a predetermined number of turbo decoding cycle periods. Then, the data of the next turbo block are outputted from the input buffer 901, thereby repeating the turbo decoding process.

The output of the trellis decoding unit 902 signifies a degree of reliability of the transmission bits configuring each symbol. For example, in the transmitting system, since the input data of the trellis encoding module 606 correspond to two bits as one symbol, a log likelihood ratio (LLR) between the likelihood of a bit having the value of '1' and the likelihood of the bit having the value of '0' may be respectively outputted (in bit units) to the upper bit and the lower bit. Herein, the log likelihood ratio corresponds to a log value for the ratio between the likelihood of a bit having the value of '1' and the likelihood of the bit having the value of '0'. Alternatively, a LLR for the likelihood of 2 bits (i.e., one symbol) being equal to "00", "01", "10", and "11" may be respectively outputted (in symbol units) to all 4 combinations of bits (i.e., 00, 01, 10, 11). Consequently, this becomes the soft decision value that indicates the degree of reliability of the transmission bits configuring each symbol. A maximum a posteriori probability (MAP) or a soft-out Viterbi algorithm (SOVA) may be used as a decoding algorithm of each TCM decoder within the trellis decoding unit 902.

The output of the trellis decoding unit 902 is inputted to the feedback deformatter 903.

If the receiving system includes the main service data processor, the output of the trellis decoding unit 902 also is outputted to the data deinterleaver 809. At this time, the trellis decoding unit 902 performs a hard-decision process of the soft decision value that is trellis decoded and outputted from the trellis decoding unit 902, and groups 4 symbols into byte units, which are then outputted to the data deinterleaver 809. The data deinterleaver 809 receives mobile service data, known data, signaling information data, RS parity data, MPEG header, and so on as well as main service data.

Among the soft decision values of TDL size of the trellis decoding unit 902, the feedback deformatter 903 receives the soft decision values of BK size of corresponding to the mobile service data symbols (wherein symbols corresponding to signaling information, RS parity data symbols that are added during the encoding of the RS frame, and CRC data symbols are included). More specifically, the feedback deformatter 903 does not receive the soft decision values of the main service data, known data, signaling information data, RS parity data, and MPEG header and so on.

The feedback deformatter 903 changes the processing order of the soft decision values corresponding to the mobile service data symbols. This is an inverse process of an initial change in the processing order of the mobile service data symbols, which are generated during an intermediate step, wherein the output symbols outputted from the block processor 303 of the transmitting system are being inputted to the trellis encoding module 606 (e.g., when the symbols pass through the group formatter, the data deinterleaver, the packet formatter, and the data interleaver). Thereafter, the feedback deformatter 903 performs reordering of the process order of soft decision values corresponding to the mobile service data symbols and, then, outputs the processed mobile service data symbols to the symbol deinterleaver 904.

This is because a plurality of blocks exist between the block processor 303 and the trellis encoding module 606, and because, due to these blocks, the order of the mobile service data symbols being outputted from the block processor 303 and the order of the mobile service data symbols being inputted to the trellis encoding module 606 are not identical to one another. Therefore, the feedback deformatter 903 reorders (or rearranges) the order of the mobile service data symbols, so that the order of the mobile service data symbols being inputted to the symbol deinterleaver 904 matches the order of the mobile service data symbols outputted from the block processor 303 of the transmitting system. The reordering process may be embodied as one of software, middleware, and hardware.

Figure 30:
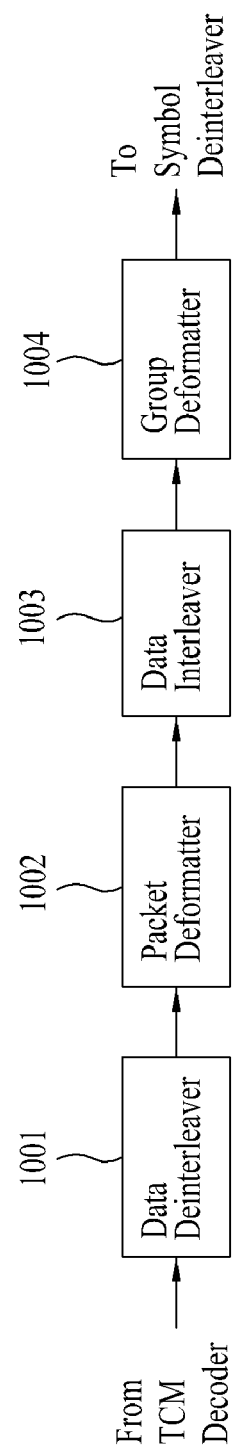
FIG. 30 illustrates a block diagram of a feedback deformatter according to another embodiment of the present invention.

FIG. 30 illustrates a detailed block diagram of the feedback deformatter 903 according to an embodiment of the present invention. Herein, the feedback deformatter 903 includes a data deinterleaver 1001, a packet deformatter 1002, a data interleaver 1003, and a group deformatter 1004.

Referring to FIG. 30, the soft decision value of the mobile service data symbol, which is inputted from the trellis decoding unit 902, is outputted to the data deinterleaver 1001 of the feedback deformatter 903 without modification. However, data place holders (or null data) are inserted in data places (e.g., main service data places, known data places, signaling information places, RS parity data places, and MPEG header places), thereby being outputted to the data deinterleaver 1001 of the feedback deformatter 903.

The data deinterleaver 1001 performs an inverse process of the data interleaver 603 included in the transmitting system. More specifically, the data deinterleaver 1001 deinterleaves the inputted data and outputs the deinterleaved data to the packet deformatter 1002.

The packet deformatter 1002 performs an inverse process of the packet formatter 308. More specifically, among the data that are deinterleaved and outputted from the data deinterleaver 1001, the packet deformatter 1002 removes the place holder corresponding to the MPEG header, which had been inserted to the packet formatter 308. The output of the packet deformatter 1002 is inputted to the data interleaver 1003, and the data interleaver 1003 interleaves the data being inputted, as an inverse process of the data deinterleaver included in the transmitting system. Accordingly, data having a data structure as shown in FIG. 16A, are outputted to the group deformatter 1004.

The group deformatter 1004 performs an inverse process of the group formatter included in the transmitting system. More specifically, the group formatter 1004 removes the place holders corresponding to the main service data, known data, signaling information data, and RS parity data. Then, the group formatter 1004 outputs only the reordered (or rearranged) mobile service data symbols to the symbol deinterleaver 904. According to another embodiment of the present invention, when the feedback deformatter 903 is embodied using a memory map, the process of inserting and removing place holder from data position which is not inputted may be omitted.

The symbol deinterleaver 904 performs deinterleaving on the mobile service data symbols having their processing orders changed and outputted from the feedback deformatter 903, as an inverse process of the symbol interleaving process of the symbol interleaver included in the transmitting system. The size of the block used by the symbol deinterleaver 904 during the deinterleaving process is identical to interleaving size of an actual symbol (i.e., BK) of the symbol interleaver, which is included in the transmitting system. This is because the turbo decoding process is performed between the trellis decoding unit 902 and the symbol decoder 906. Both the input and output of the symbol deinterleaver 904 correspond to soft decision values, and the deinterleaved soft decision values are outputted to the outer symbol mapper 905.

The operations of the outer symbol mapper 905 may vary depending upon the structure and coding rate of the symbol encoding unit 402 included in the transmitting system. For example, when data are ½-rate encoded by the symbol encoding unit 402 and then transmitted, the outer symbol mapper 905 directly outputs the input data without modification. In another example, when data are ¼-rate encoded by the symbol encoding unit 402 and then transmitted, the outer symbol mapper 905 converts the input data so that it can match the input data format of the symbol decoder 906.

At this point, when it is assumed that the block processor of the transmitting system divides the ¼-rate encoded mobile service data to two ½-rate output masses and diversity-outputs the divided output masses, the outer symbol mapper 906 configures one symbol soft decision value by combining the symbol soft decision values of the two symbol interleavers 904 and 904-1, and then outputs the combined symbol soft decision value to the symbol decoder 906. For this, the outer symbol mapper 905 may be inputted diversity processing information from the signaling information decoder 813.

The symbol decoder 906 (i.e., the outer decoder) receives the data outputted from the outer symbol mapper 905 and performs symbol decoding as an inverse process of the symbol encoding unit 402 included in the transmitting system. At this point, two different soft decision values are outputted from the symbol decoder 906. One of the outputted soft decision values corresponds to a soft decision value matching the output symbol of the symbol encoding unit 402 (hereinafter referred to as a "first decision value"). The other one of the outputted soft decision values corresponds to a soft decision value matching the input bit of the symbol encoding unit 402 (hereinafter referred to as a "second decision value").

More specifically, the first decision value represents a degree of reliability the output symbol (i.e., 2 bits) of the symbol encoding unit 402. Herein, the first soft decision value may output (in bit units) a LLR between the likelihood of 1 bit being equal to '1' and the likelihood of 1 bit being equal to '0' with respect to each of the upper bit and lower bit, which configures a symbol. Alternatively, the first soft decision value may also output (in symbol units) a LLR for the likelihood of 2 bits being equal to "00", "01", "10", and "11" with respect to all possible combinations. The first soft decision value is fed-back to the trellis decoding unit 902 through the inner symbol mapper 907, the symbol interleaver 908, and the feedback formatter 909. On the other hand, the second soft decision value indicates a degree of reliability the input bit of the symbol encoding unit 402 included in the transmitting system. Herein, the second soft decision value is represented as the LLR between the likelihood of 1 bit being equal to '1' and the likelihood of 1 bit being equal to '0'. Thereafter, the second soft decision value is outputted to the outer buffer 910. In this case, a maximum a posteriori probability (MAP) or a soft-out Viterbi algorithm (SOVA) may be used as the decoding algorithm of the symbol decoder 906.

The first soft-decision value being outputted from the symbol decoder 906 is inputted to the inner symbol mapper 907. The inner symbol mapper 907 converts the received first soft-decision value to match the input format of the trellis decoder 902, thereby outputting the converted first soft-decision value to the symbol interleaver 908. The operation of the inner symbol mapper 907 may also vary depending upon the structure and coding rate of the symbol encoding unit 402 included in the transmitting system. At this point, when it is assumed that the block processor of the transmitting system divides the ¼-rate encoded mobile service data to two ½-rate output masses and diversity-outputs the divided output masses, the inner symbol mapper 907 divides the one first soft-decision value outputted from the symbol decoder 906 into two soft-decision values and respectively outputs the divided soft-decision values to the symbol interleaver 908 and 908-1.

The symbol interleaver 908 performs symbol interleaving, as shown in FIG. 15, on the first soft decision value that is outputted from the inner symbol mapper 907. Then, the symbol interleaver 908 outputs the symbol-interleaved first soft decision value to the feedback formatter 909. Herein, the output of the symbol interleaver 908 also corresponds to a soft decision value.

With respect to the changed processing order of the soft decision values corresponding to the symbols that are generated during an intermediate step, wherein the output symbols outputted from the block processor 303 of the transmitting system are being inputted to the trellis encoding module (e.g., when the symbols pass through the group formatter, the data deinterleaver, the packet formatter, the RS encoder, and the data interleaver), the feedback formatter 909 alters (or changes) the order of the output values outputted from the symbol interleaver 908. Subsequently, the feedback formatter 908 outputs values to the trellis decoding unit 902 in the changed order.

The soft decision values outputted from the symbol interleaver 908 are matched with the positions of mobile service data symbols each having the size of TDL, which are outputted from the input buffer 901, so as to be in a one-to-one correspondence. Thereafter, the soft decision values matched with the respective symbol position are inputted to the trellis decoding unit 902. At this point, since the main service data symbols or the RS parity data symbols and known data symbols of the main service data do not correspond to the mobile service data symbols, the feedback formatter 909 inserts null data in the corresponding positions, thereby outputting the processed data to the trellis decoding unit 902. Additionally, each time the symbols having the size of TDL are turbo decoded, no value is fed-back by the symbol interleaver 908 starting from the beginning of the first decoding process. Therefore, the feedback formatter 909 is controlled by the feedback controller, thereby inserting null data into all symbol positions including a mobile service data symbol. Then, the processed data are outputted to the trellis decoding unit 902.

The output buffer 910 receives the second soft decision value from the symbol decoder 906 based upon the control of the feedback controller. Then, the output buffer 910 temporarily stores the received second soft decision value. Thereafter, the output buffer 910 outputs the second soft decision value to the RS frame decoder 806. For example, the output buffer 910 overwrites the second soft decision value of the symbol decoder 906 until the turbo decoding process is performed for M number of times. Then, once all M number of turbo decoding processes is performed for a single TDL, the corresponding second soft decision value is outputted to the RS frame decoder 806.

The feedback controller controls the number of turbo decoding and turbo decoding repetition processes of the overall block decoder, shown in FIG. 29.

At this point, the number of regressive turbo decoding rounds between the trellis decoding unit 902 and the symbol decoder 906 may be defined while taking into account hardware complexity and error correction performance. Accordingly, if the number of rounds increases, the error correction performance may be enhanced. However, this may lead to a disadvantageous of the hardware becoming more complicated (or complex).

Meanwhile, the data deinterleaver 809, the RS decoder 810, and the data derandomizer 811 correspond to blocks required for receiving the main service data. Therefore, the above-mentioned blocks may not be necessary (or required) in the structure of a receiving system for receiving mobile service data only. The data deinterleaver 809 performs an inverse process of the data interleaver included in the transmitting system. In other words, the data deinterleaver 809 deinterleaves the main service data outputted from the block decoder 805 and outputs the deinterleaved main service data to the RS decoder 810. The data being inputted to the data deinterleaver 809 include main service data, as well as mobile service data, known data, RS parity data, and an MPEG header.

The RS decoder 810 performs a systematic RS decoding process on the deinterleaved data and outputs the processed data to the data derandomizer 811.

The data derandomizer 811 receives the output of the RS decoder 810 and generates a pseudo random data byte identical to that of the randomizer included in the transmitting system. Thereafter, the data derandomizer 811 performs a bitwise exclusive OR (XOR) operation on the generated pseudo random data byte, thereby inserting the MPEG synchronization bytes to the beginning of each packet so as to output the data in 188-byte main service data packet units.

Figure 31:
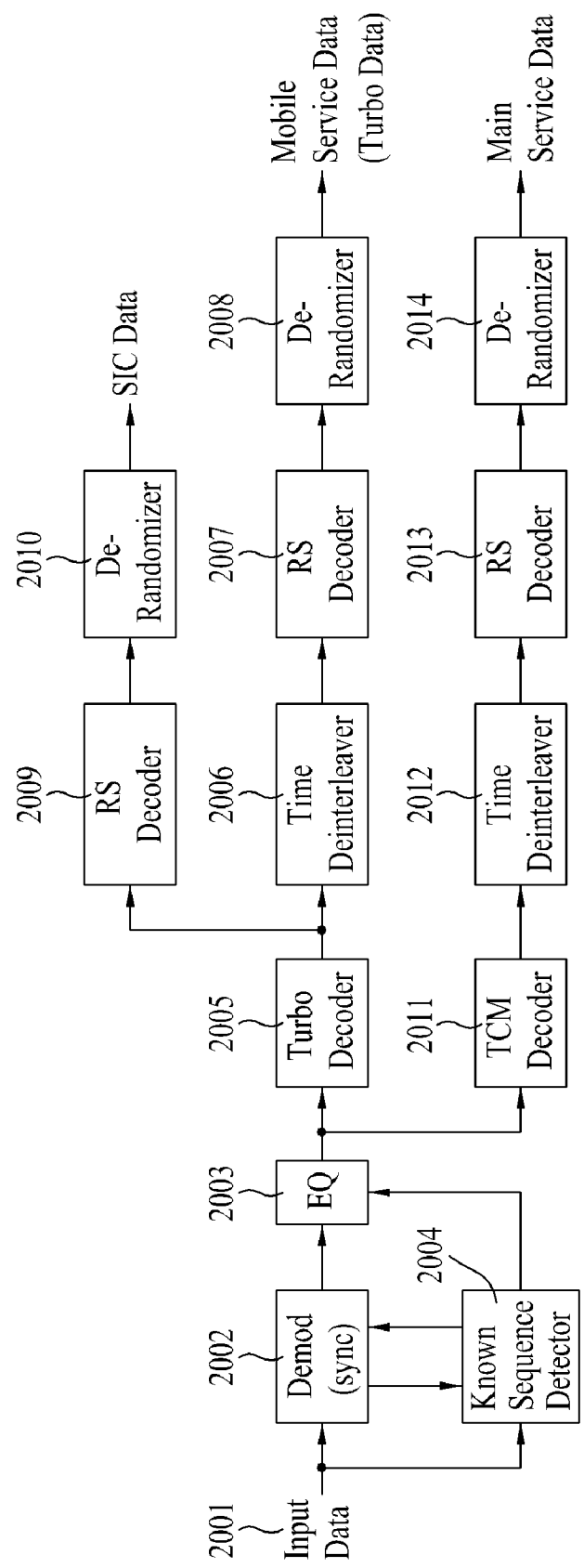
FIG. 31 illustrates a block diagram of a demodulating unit of a receiving system according to another embodiment of the present invention.

FIG. 31 illustrates the demodulating unit within the receiving system according to another embodiment of the present invention. The demodulating unit of FIG. 31 includes demodulator 2002, an equalizer 2003, a known sequence detector (or a known data detector) 2004, a turbo decoder

2005, a time interleaver 2006, a RS decoder 2007, and a derandomizer 2008. The demodulating unit may further include an RS decoder 2009 and a derandomizer 2010. The demodulating unit may further include a TCM decoder 2011, a time interleaver 2012, RS decoder 2013, and derandomizer 2014. More specifically, when a tuner tunes to a frequency of a specific channel having main service data and mobile service data multiplexed therein. Thereafter, the tuned frequency of the specific physical channel is down-converted to an intermediate frequency (IF) signal, thereby being inputted to the demodulator 2002. The demodulator 2002 performs self-gain control, carrier recovery, and timing recovery processes on the inputted IF signal, thereby modifying the inputted IF signal to a baseband signal. Then, the demodulator 2002 outputs the baseband signal to the equalizer 2003.

The known sequence detector 2004 detects the known sequence place inserted by the transmitting system from the input/output data of the demodulator 2002 (i.e., the data prior to the demodulation process or the data after the demodulation process). Thereafter, the known sequence detector 2004 outputs the place information along with the symbol sequence of the known data, which are generated from the detected place, to the demodulator 2002 and the equalizer 2003. Also, the known sequence detector 2004 may detect MPH-associated information from the output of the demodulator 2002, thereby configuring tan ensemble map. Then, the known sequence detector 2004 refers to the ensemble map, so as to output known data place information and field synchronization place information in the ensemble including a user-selected service. The MPH-associated information may include sub-frame count information, slot count information, ensemble_id information, SGN information, NOG information, ETP information, and so on.

The known sequence detector further includes a power controller (not shown) and may refer to the ensemble map so as to control the power of the tuner and the demodulating unit. For example, the power controller turns the power on, so as to receive data, only during a section having a data group of an ensemble including user-requested mobile service allocated (or assigned) thereto. Alternatively, the power controller turns the power off during the remaining sections, thereby reducing excessive power consumption. Furthermore, the known sequence detector 2004 outputs information enabling the turbo decoder 2005 and the TCM decoder 2011 to identify the mobile service data that have been additionally encoded by the transmitting system, and the main service data that have not been processed with additional encoding. The known sequence detector 2004 outputs such identification information to the turbo decoder 2005 and the TCM decoder 2011.

The demodulator 2002 uses the known data symbol sequence during the timing and/or carrier recovery, thereby enhancing the demodulating performance. Similarly, the equalizer 2003 uses the known data so as to enhance the equalizing performance. For example, a channel impulse response (CIR) may be estimated, so as to perform channel equalization. Then, in accordance with a predetermined method, the equalizer 2003 compensates the distortion on the channel, the distortion being included in the demodulated signal, thereby outputting the distortion-compensated data to the turbo decoder 2005 and the TCM decoder 2011.

Among the inputted data, the turbo decoder 2005 performs turbo-decoding only on the mobile service data and the SIC data. Also, according to an embodiment of the present invention, the block decoder of FIG. 27 may be applied as the turbo decoder 2005. The SIC data corresponds to signaling information, such as a transmission parameter. If the mobile service data are diversity-transmitted, the signaling information including the diversity processing information should be decoded before being inputted to the turbo decoder 2005. Furthermore, the decoded diversity processing information is provided to the turbo decoder 2005. Accordingly, the turbo decoder 2005 refers to the diversity processing information, so as to turbo-decode the mobile service data back to the initial state prior to dispersion, the mobile service data being dispersed and transmitted to time sections and/or frequency sections.

At this point, the turbo-decoded SIC data are outputted to the RS decoder 2009, and the turbo-decoded mobile service data are outputted to the time deinterleaver 2006. The RS decoder 2009 corrects the error that has occurred in the turbo-decoded SIC data and, then, outputs the error-corrected SIC data to the derandomizer 2010. Thereafter, the derandomizer 2010 performs derandomizing on the error-corrected SIC data. According to an embodiment of the present invention, the RS decoder 2009 RS-decodes the turbo-decoded SIC data so as to perform error correction. At this point, at least one of the parity data and the CRC data may be used for the error correction process.

The time deinterleaver 2006 performs time-deinterleaving on the turbo-decoded mobile service data, as an inverse process of the transmitting system. Thereafter, the time deinterleaver 2006 recovers the data scattered along the time axis back to the initial state, thereby outputting the recovered data to the RS decoder 2007. According to an embodiment of the present invention, the RS decoder 2007 RS-decodes the deinterleaved mobile service data, so as to perform the error correction process.

Among the inputted data, the TCM decoder 2011 performs TCM decoding on the main service data, thereby outputting the processed main service data to the time deinterleaver 2012. The time deinterleaver 2012 performs time-deinterleaving on the TCM-decoded main service data as an inverse process of the transmitting system, thereby outputting the processed main service data to the RS decoder 2013. The RS decoder 2013 corrects the error that has occurred in main service data and, then, outputs the error-corrected main service data to the derandomizer 2014. According to an embodiment of the present invention, the RS decoder 2013 RS-decodes the deinterleaved main service data so as to perform error correction. The derandomizer 2014 then derandomizes the error-corrected main service data.

Figure 32:
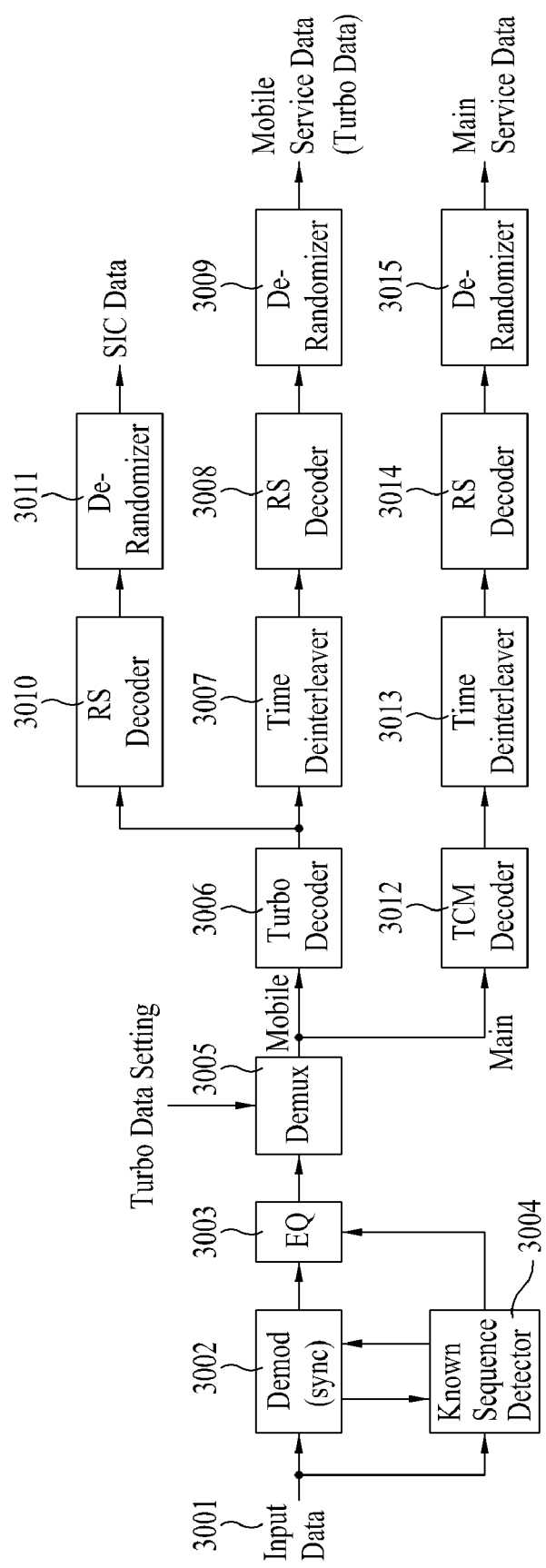
FIG. 32 illustrates a block diagram of a demodulating unit of a receiving system according to another embodiment of the present invention.

FIG. 32 illustrates the demodulating unit within the receiving system according to another embodiment of the present invention.

The demodulating unit of FIG. 32 includes demodulator 3002, an equalizer 3003, a known sequence detector (or a known data detector) 3004, a demultiplexer 3005, a turbo decoder 3006, a time interleaver 3007, a RS decoder 3008, and a derandomizer 3009. The demodulating unit may further include an RS decoder 3010 and a derandomizer 3011. The demodulating unit may further include a TCM decoder 3012, a time interleaver 3013, an RS decoder 3014, and derandomizer 3015.

More specifically, when a tuner tunes to a frequency of a specific channel having main service data and mobile service data multiplexed therein. Thereafter, the tuned frequency of the specific physical channel is down-converted to an intermediate frequency (IF) signal, thereby being inputted to the demodulator 3002. The demodulator 3002 performs self-gain control, carrier recovery, and timing recovery processes on the inputted IF signal, thereby modifying the inputted IF signal to a baseband signal. Then, the demodulator 3002 outputs the baseband signal to the equalizer 3003.

The known sequence detector 3004 detects the known sequence place inserted by the transmitting system from the input/output data of the demodulator 3002 (i.e., the data prior to the demodulation process or the data after the demodulation process). Thereafter, the known sequence detector 3004 outputs the place information along with the symbol sequence of the known data, which are generated from the detected place, to the demodulator 3002 and the equalizer 3003. Also, the known sequence detector 3004 may detect MPH-associated information from the output of the demodulator 3002, thereby configuring an ensemble map. Then, the known sequence detector 3004 refers to the ensemble map, so as to output known data place information and field synchronization place information in the ensemble including a user-selected service. The MPH-associated information may include sub-frame count information, slot count information, ensemble_id information, SGN information, NOG information, ETP information, and so on.

The demodulating unit further includes a power controller (not shown) and may refer to the ensemble map so as to control the power of the tuner and the demodulating unit. For example, the power controller turns the power on, so as to receive data, only during a section having a data group of an ensemble including user-requested mobile service allocated (or assigned) thereto. Alternatively, the power controller turns the power off during the remaining sections, thereby reducing excessive power consumption.

The demodulator 3002 uses the known data symbol sequence during the timing and/or carrier recovery, thereby enhancing the demodulating performance. Similarly, the equalizer 3003 uses the known data so as to enhance the equalizing performance. For example, a channel impulse response (CIR) may be estimated, so as to perform channel equalization. Then, in accordance with a predetermined method, the equalizer 3003 compensates the distortion on the channel, the distortion being included in the demodulated signal, thereby outputting the distortion-compensated data to the demultiplexer 3005.

The demultiplexer 3005 may divide mobile service data and main service data from the equalized data according to a turbo data setting information. The mobile service data (including SIC data) divided by the demultiplexer 3005 outputs to the turbo decoder 3006. Alternatively, the main service data divided by the demultiplexer 3005 outputs to the TCM decoder 3012. Herein, it is assumed that the SIC data corresponds to signaling information such as transmission parameter, and is transmitted after turbo-coding as the mobile service data by the transmitting system.

The turbo decoder 3006 performs turbo-decoding on the mobile service data and the SIC data outputted from the demultiplexer 3005. Also, according to an embodiment of the present invention, the block decoder of FIG. 27 may be applied as the turbo decoder 3006. If the mobile service data are diversity-transmitted, the signaling information including the diversity processing information should be decoded before being inputted to the turbo decoder 3006. Furthermore, the decoded diversity processing information is provided to the turbo decoder 3006. Accordingly, the turbo decoder 3006 refers to the diversity processing information, so as to turbo-decode the mobile service data back to the initial state prior to dispersion, the mobile service data being dispersed and transmitted to time sections and/or frequency sections.

At this point, the turbo-decoded SIC data are outputted to the RS decoder 3010, and the turbo-decoded mobile service data are outputted to the time deinterleaver 3007.

The RS decoder 3010 corrects the error that has occurred in the turbo-decoded SIC data and, then, outputs the error-corrected SIC data to the derandomizer 3011. Thereafter, the derandomizer 3011 performs derandomizing on the error-corrected SIC data. According to an embodiment of the present invention, the RS decoder 3010 RS-decodes the turbo-decoded SIC data so as to perform error correction. At this point, at least one of the parity data and the CRC data may be used for the error correction process.

The time deinterleaver 3007 performs time-deinterleaving on the turbo-decoded mobile service data, as an inverse process of the transmitting system. Thereafter, the time deinterleaver 3007 recovers the data scattered along the time axis back to the initial state, thereby outputting the recovered data to the RS decoder 3008. According to an embodiment of the present invention, the RS decoder 3008 RS-decodes the deinterleaved mobile service data, so as to perform the error correction process.

The TCM decoder 3012 performs TCM decoding on the main service data outputted from the demultiplexer 3005, thereby outputting the TCM-decoded main service data to the time deinterleaver 3013. The time deinterleaver 3013 performs time-deinterleaving on the TCM-decoded main service data as an inverse process of the transmitting system, thereby outputting the processed main service data to the RS decoder 3014. The RS decoder 3014 corrects the error that has occurred in main service data and, then, outputs the error-corrected main service data to the derandomizer 3015. According to an embodiment of the present invention, the RS decoder 3014 RS-decodes the deinterleaved main service data so as to perform error correction. The derandomizer 3015 then derandomizes the error-corrected main service data.

Figure 33:
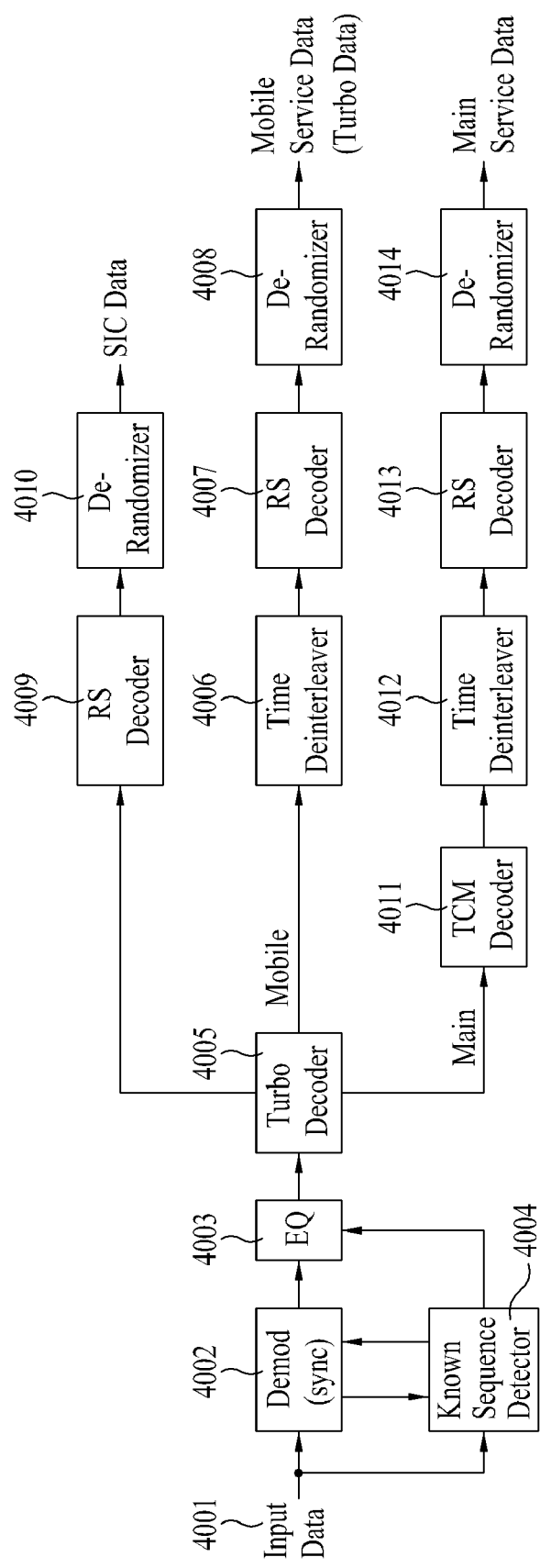
FIG. 33 illustrates a block diagram of a demodulating unit of a receiving system according to another embodiment of the present invention.

FIG. 33 illustrates the demodulating unit within the receiving system according to another embodiment of the present invention.

The demodulating unit of FIG. 33 includes demodulator 4002, an equalizer 4003, a known sequence detector (or a known data detector) 4004, a turbo decoder 4005, a time interleaver 4006, a RS decoder 4007, and a derandomizer 4008. The demodulating unit may further include an RS decoder 4009 and a derandomizer 4010. The demodulating unit may further include a TCM decoder 4011, a time interleaver 4012, RS decoder 4013, and derandomizer 4014.

More specifically, when a tuner tunes to a frequency of a specific channel having main service data and mobile service data multiplexed therein. Thereafter, the tuned frequency of the specific physical channel is down-converted to an intermediate frequency (IF) signal, thereby being inputted to the demodulator 4002. The demodulator 4002 performs self-gain control, carrier recovery, and timing recovery processes on the inputted IF signal, thereby modifying the inputted IF signal to a baseband signal. Then, the demodulator 4002 outputs the baseband signal to the equalizer 4003.

The known sequence detector 4004 detects the known sequence place inserted by the transmitting system from the input/output data of the demodulator 4002 (i.e., the data prior to the demodulation process or the data after the demodulation process). Thereafter, the known sequence detector 4004 outputs the place information along with the symbol sequence of the known data, which are generated from the detected place, to the demodulator 4002 and the equalizer 4003. Also, the known sequence detector 4004 may detect MPH-associated information from the output of the demodulator 4002, thereby configuring an ensemble map. Then, the known sequence detector 4004 refers to the ensemble map, so as to output known data place information and field synchronization place information in the ensemble including a user-selected service. The MPH-associated information may include sub-frame count information, slot count information, ensemble_id information, SGN information, NOG information, ETP information, and so on.

The demodulating unit further includes a power controller (not shown) and may refer to the ensemble map so as to control the power of the tuner and the demodulating unit. For example, the power controller turns the power on, so as to receive data, only during a section having a data group of an ensemble including user-requested mobile service allocated (or assigned) thereto. Alternatively, the power controller turns the power off during the remaining sections, thereby reducing excessive power consumption.

Furthermore, the known sequence detector 4004 outputs information enabling the turbo decoder 4005 to identify the mobile service data that have been additionally encoded by the transmitting system, and the main service data that have not been processed with additional encoding. The known sequence detector 4004 outputs such identification information to the turbo decoder 4005.

The demodulator 4002 uses the known data symbol sequence during the timing and/or carrier recovery, thereby enhancing the demodulating performance. Similarly, the equalizer 4003 uses the known data so as to enhance the equalizing performance. For example, a channel impulse response (CIR) may be estimated, so as to perform channel equalization. Then, in accordance with a predetermined method, the equalizer 4003 compensates the distortion on the channel, the distortion being included in the demodulated signal, thereby outputting the distortion-compensated data to the turbo decoder 4005.

When the inputted data corresponds to the mobile service data and the SIC data, the turbo decoder 4005 performs turbo-decoding on the mobile service data and the SIC data. Alternatively, when the inputted data corresponds to the main service data, the turbo decoder 4005 outputs directly the main service data to the TCM decoder 4011.

Also, according to an embodiment of the present invention, the block decoder of FIG. 27 may be applied as the turbo decoder 4005. The SIC data corresponds to signaling information, such as a transmission parameter. If the mobile service data are diversity-transmitted, the signaling information including the diversity processing information should be decoded before being inputted to the turbo decoder 4005.

Furthermore, the turbo-decoded diversity processing information is provided to the turbo decoder 4005. Accordingly, the turbo decoder 4005 refers to the diversity processing information, so as to turbo-decode the mobile service data back to the initial state prior to dispersion, the mobile service data being dispersed and transmitted to time sections and/or frequency sections.

At this point, the turbo-decoded SIC data are outputted to the RS decoder 4009, and the turbo-decoded mobile service data are outputted to the time deinterleaver 4006.

The RS decoder 4009 corrects the error that has occurred in the turbo-decoded SIC data and, then, outputs the error-corrected SIC data to the derandomizer 4010. Thereafter, the derandomizer 4010 performs derandomizing on the error-corrected SIC data. According to an embodiment of the present invention, the RS decoder 4009 RS-decodes the turbo-decoded SIC data so as to perform error correction. At this point, at least one of the parity data and the CRC data may be used for the error correction process.

The time deinterleaver 4006 performs time-deinterleaving on the turbo-decoded mobile service data, as an inverse process of the transmitting system. Thereafter, the time deinterleaver 4006 recovers the data scattered along the time axis back to the initial state, thereby outputting the recovered data to the RS decoder 4007. According to an embodiment of the present invention, the RS decoder 4007 RS-decodes the deinterleaved mobile service data, so as to perform the error correction process.

The TCM decoder 4011 performs TCM decoding on the main service data outputted from the turbo decoder 4005, thereby outputting the TCM-decoded main service data to the time deinterleaver 4012. The time deinterleaver 4012 performs time-deinterleaving on the TCM-decoded main service data as an inverse process of the transmitting system, thereby outputting the processed main service data to the RS decoder 4013. The RS decoder 4013 corrects the error that has occurred in main service data and, then, outputs the error-corrected main service data to the derandomizer 4014. According to an embodiment of the present invention, the RS decoder 4013 RS-decodes the deinterleaved main service data so as to perform error correction. The derandomizer 4014 then derandomizes the error-corrected main service data.

General Receiving System

Figure 34:
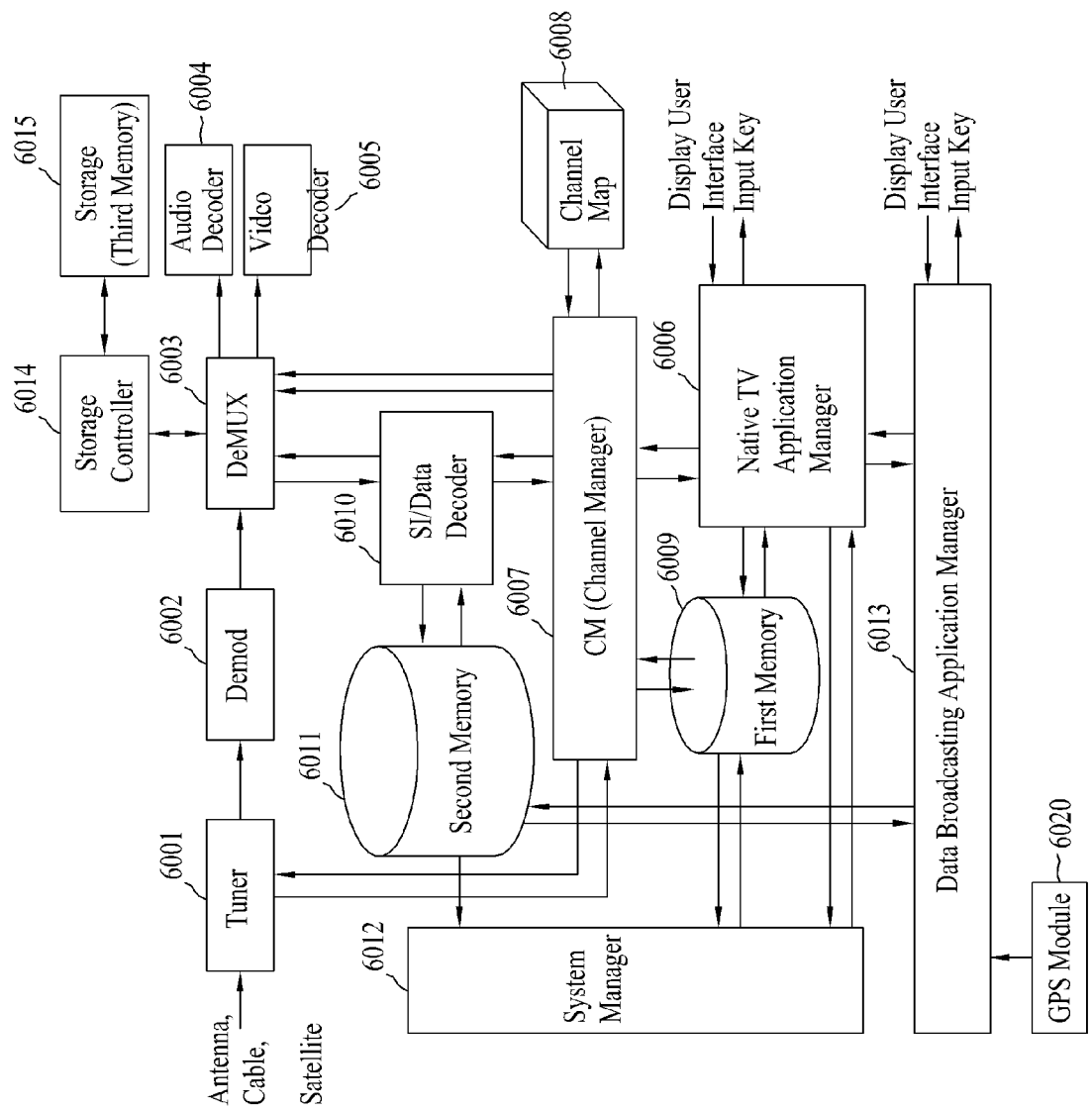
FIG. 34 illustrates a block diagram of a receiving system according to an embodiment of the present invention.

FIG. 34 illustrates a block diagram showing a structure of a receiving system according to an embodiment of the present invention. Herein, the demodulating unit of FIG. 29, and FIG. 31 to FIG. 33 may be applied in the receiving system. Referring to FIG. 34, the receiving system includes a tuner 6001, a demodulating unit 6002, a demultiplexer 6003, an audio decoder 6004, a video decoder 6005, a native TV application manager 6006, a channel manager 6007, a channel map 6008, a first memory 6009, an SI and/or data decoder 6010, a second memory 6011, a system manager 6012, a data broadcast application manager 6013, a storage controller 6014, a third memory 6015, and a GPS module 6020. Herein, the first memory 6009 corresponds to a non-volatile random access memory (NVRAM) (or a flash memory). The third memory 6015 corresponds to a large-scale storage device, such as a hard disk drive (HDD), a memory chip, and so on.

The tuner 6001 tunes a frequency of a specific channel through any one of an antenna, cable, and satellite. Then, the tuner 6001 down-converts the tuned frequency to an intermediate frequency (IF), which is then outputted to the demodulating unit 6002. At this point, the tuner 6001 is controlled by the channel manager 6007. Additionally, the result and strength of the broadcast signal of the tuned channel are also reported to the channel manager 6007. The data that are being received by the frequency of the tuned specific channel include main service data, mobile service data, and table data for decoding the main service data and mobile service data.

According to the embodiment of the present invention, audio data and video data for mobile broadcast programs may be applied as the mobile service data. Such audio data and video data are compressed by various types of encoders so as to be transmitted to a broadcasting station. In this case, the video decoder 6004 and the audio decoder 6005 will be provided in the receiving system so as to correspond to each of the encoders used for the compression process. Thereafter, the decoding process will be performed by the video decoder 6004 and the audio decoder 6005. Then, the processed video and audio data will be provided to the users. Examples of the encoding/decoding scheme for the audio data may include AC 3, MPEG 2 AUDIO, MPEG 4 AUDIO, AAC, AAC+, HE AAC, AAC SBR, MPEG-Surround, and BSAC. And, examples of the encoding/decoding scheme for the video data may include MPEG 2 VIDEO, MPEG 4 VIDEO, H.264, SVC, and VC-1.

Depending upon the embodiment of the present invention, examples of the mobile service data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the mobile service data may correspond to meta data. For example, the meta data be written in XML format so as to be transmitted through a DSM-CC protocol.

The demodulating unit 6002 performs VSB-demodulation and channel equalization on the signal being outputted from the tuner 6001, thereby identifying the main service data and the mobile service data. Thereafter, the identified main service data and mobile service data are outputted in TS packet units. An example of the demodulating unit 6002 is shown in FIG. 27 and FIG. 31 to FIG. 33. Therefore, the structure and operation of the demodulator will be described in detail in a later process. However, this is merely exemplary and the scope of the present invention is not limited to the example set forth herein. In the embodiment given as an example of the present invention, only the mobile service data packet outputted from the demodulating unit 6002 is inputted to the demultiplexer 6003. In this case, the main service data packet is inputted to another demultiplexer (not shown) that processes main service data packets. Herein, the storage controller 6014 is also connected to the other demultiplexer in order to store the main service data after processing the main service data packets. The demultiplexer of the present invention may also be designed to process both mobile service data packets and main service data packets in a single demultiplexer.

The storage controller 6014 is interfaced with the demultipelxer so as to control instant recording, reserved (or pre-programmed) recording, time shift, and so on of the mobile service data and/or main service data. For example, when one of instant recording, reserved (or pre-programmed) recording, and time shift is set and programmed in the receiving system (or receiver) shown in FIG. 34, the corresponding mobile service data and/or main service data that are inputted to the demultiplexer are stored in the third memory 6015 in accordance with the control of the storage controller 6014. The third memory 6015 may be described as a temporary storage area and/or a permanent storage area. Herein, the temporary storage area is used for the time shifting function, and the permanent storage area is used for a permanent storage of data according to the user's choice (or decision).

When the data stored in the third memory 6015 need to be reproduced (or played), the storage controller 6014 reads the corresponding data stored in the third memory 6015 and outputs the read data to the corresponding demultiplexer (e.g., the mobile service data are outputted to the demultiplexer 6003 shown in FIG. 34). At this point, according to the embodiment of the present invention, since the storage capacity of the third memory 6015 is limited, the compression encoded mobile service data and/or main service data that are being inputted are directly stored in the third memory 6015 without any modification for the efficiency of the storage capacity. In this case, depending upon the reproduction (or reading) command, the data read from the third memory 6015 pass trough the demultiplexer so as to be inputted to the corresponding decoder, thereby being restored to the initial state.

The storage controller 6014 may control the reproduction (or play), fast-forward, rewind, slow motion, instant replay functions of the data that are already stored in the third memory 6015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 6014 compression encodes the inputted data and stored the compression-encoded data to the third memory 6015. In order to do so, the storage controller 6014 may include an encoder, wherein the encoder may be embodied as one of software, middleware, and hardware. Herein, an MPEG encoder may be used as the encoder according to an embodiment of the present invention. The encoder may also be provided outside of the storage controller 6014.

Meanwhile, in order to prevent illegal duplication (or copies) of the input data being stored in the third memory 6015, the storage controller 6014 scrambles (or encrypts) the input data and stores the scrambled (or encrypted) data in the third memory 6015. Accordingly, the storage controller 6014 may include a scramble algorithm (or encryption algorithm) for scrambling the data stored in the third memory 6015 and a descramble algorithm (or decryption algorithm) for descrambling (or decrypting) the data read from the third memory 6015. The scrambling method may include using an arbitrary key (e.g., control word) to modify a desired set of data, and also a method of mixing signals.

Meanwhile, the demultiplexer 6003 receives the real-time data outputted from the demodulating unit 6002 or the data read from the third memory 6015 and demultiplexes the received data. In the example given in the present invention, the demultiplexer 6003 performs demultiplexing on the mobile service data packet. Therefore, in the present invention, the receiving and processing of the mobile service data will be described in detail. However, depending upon the many embodiments of the present invention, not only the mobile service data but also the main service data may be processed by the demultiplexer 6003, the audio decoder 6004, the video decoder 6005, the native TV application manager 6006, the channel manager 6007, the channel map 6008, the first memory 6009, the SI and/or data decoder 6010, the second memory 6011, a system manager 6012, the data broadcast application manager 6013, the storage controller 6014, the third memory 6015, and the GPS module 6020. Thereafter, the processed data may be used to provide diverse services to the users.

The demultiplexer 6003 demultiplexes mobile service data and system information (SI) tables from the mobile service data packet inputted in accordance with the control of the SI and/or data decoder 6010. Thereafter, the demultiplexed mobile service data and SI tables are outputted to the SI and/or data decoder 6010 in a section format. In this case, it is preferable that data for the data service are used as the mobile service data that are inputted to the SI and/or data decoder 6010. In order to extract the mobile service data from the channel through which mobile service data are transmitted and to decode the extracted mobile service data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT).

The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number.

The VCT is configured by including at least one of a table_id field, a section_syntax_indicator field, a private_indicator field, a section_length field, a transport_stream_id field, a version_number field, a current_next_indicator field, a section_number field, a last_section_number field, a protocol_version field, and a num_channels_in_section field. The VCT syntax further includes a first 'for' loop repetition statement that is repeated as much as the num_channels_in_section field value. The first repetition statement may include at least one of a short_name field, a major_channel_number field, a minor_channel_number field, a modulation_mode field, a carrier_frequency field, a channel_TSID field, a program_number field, an ETM_location field, an access_controlled field, a hidden field, a service_type field, a source_id field, a descriptor_length field, and a second 'for' loop statement that is repeated as much as the number of descriptors included in the first repetition statement. Herein, the second repetition statement will be referred to as a first descriptor loop for simplicity. The descriptor descriptors( ) included in the first descriptor loop is separately applied to each virtual channel.

Furthermore, the VCT syntax may further include an additional_descriptor_length field, and a third 'for' loop statement that is repeated as much as the number of descriptors additionally added to the VCT. For simplicity of the description of the present invention, the third repetition statement will be referred to as a second descriptor loop. The descriptor additional_descriptors( ) included in the second descriptor loop is commonly applied to all virtual channels described in the VCT.

As described above, the table_id field indicates a unique identifier (or identification) (ID) that can identify the information being transmitted to the table as the VCT. More specifically, the table_id field indicates a value informing that the table corresponding to this section is a VCT. For example, a 0xC8 value may be given to the table_id field.

The version_number field indicates the version number of the VCT. The section_number field indicates the number of this section. The last_section_number field indicates the number of the last section of a complete VCT. And, the num_channel_in_section field designates the number of the overall virtual channel existing within the VCT section. Furthermore, in the first 'for' loop repetition statement, the short_name field indicates the name of a virtual channel. The major_channel_number field indicates a 'major' channel number associated with the virtual channel defined within the first repetition statement, and the minor_channel_number field indicates a 'minor' channel number. More specifically, each of the channel numbers should be connected to the major and minor channel numbers, and the major and minor channel numbers are used as user reference numbers for the corresponding virtual channel.

The program_number field is shown for connecting the virtual channel having an MPEG-2 program association table (PAT) and program map table (PMT) defined therein, and the program_number field matches the program number within the PAT/PMT. Herein, the PAT describes the elements of a program corresponding to each program number, and the PAT indicates the PID of a transport packet transmitting the PMT. The PMT described subordinate information, and a PID list of the transport packet through which a program identification number and a separate bit sequence, such as video and/or audio data configuring the program, are being transmitted.

The service_type field indicates the service type provided in a corresponding virtual channel. It is provided that the service_type field should only indicate an analog television, a digital television, digital audio data, and digital video data. Also, according to the embodiment of the present invention, it may be provided that a mobile broadcast program should be designated to the service_type field. The service_type field, which is parsed by the SI and/or data decoder 6010 may be provided to a receiving system, as shown in FIG. 34, and used accordingly. According to other embodiments of the present invention, the parsed service_type field may also be provided to each of the audio decoder 6004 and video decoder 6005, so as to be used in the decoding process.

The source_id field indicates a program source connected to the corresponding virtual channel. Herein, a source refers to a specific source, such as an image, a text, video data, or sound. The source_-id field value has a unique value within the transport stream transmitting the VCT. Meanwhile, a service location descriptor may be included in a descriptor loop (i.e., descriptor{ }) within a next 'for' loop repetition statement. The service location descriptor may include a stream type, PID, and language code for each elementary stream.

The service location descriptor may include a descriptor_tag field, a descriptor_length field, and a PCR_PID field. Herein, the PCR_PID field indicates the PID of a transport stream packet within a program specified by a program_number field, wherein the transport stream packet includes a valid PCR field. Meanwhile, the service location descriptor includes a number_elements field so as to indicate a number of PIDs used in the corresponding program. The number of repetition of a next 'for' descriptor loop repetition statement can be decided, depending upon the value of the number_elements field. The 'for' loop repetition statement includes a stream_type field, an elementary_PID field, and an ISO_639_language_code field. Herein, the stream_type field indicates the stream type of the corresponding elementary stream (i.e., video/audio data). The elementary_PID field indicates the PID of the corresponding elementary stream. The ISO_639_language_code field indicates a language code of the corresponding elementary stream.

ISO/IEC 11172 Video, ITU-T Rec. H.262|ISO/IEC 13818-2 Video or ISO/IEC 11172-2 constrained parameter video stream, ISO/IEC 11172 Audio, ISO/IEC 13818-3 Audio, ITU-T Rec. H.222.0|ISO/IEC 13818-1 private_sections, ITU-T Rec. H.222.0|ISO/IEC 13818-1 PES packets containing private data, ISO/IEC 13522 MHEG, ITU-T Rec. H.222.0|ISO/IEC 13818-1 Annex A DSM CC, ITU-T Rec. H.222.1, ISO/IEC 13818-6 type A, ISO/IEC 13818-6 type B, ISO/IEC 13818-6 type C, ISO/IEC 13818-6 type D, ISO/IEC 13818-1 auxiliary, and so on may be applied as the stream type. Meanwhile, according to the embodiment of the present invention, MPH video stream: Non-hierarchical mode, MPH audio stream: Non-hierarchical mode, MPH Non-A/V stream: Non-hierarchical mode, MPH High Priority video stream: Hierarchical mode, MPH High Priority audio stream: Hierarchical mode, MPH Low Priority video stream: Hierarchical mode, MPH Low priority audio stream: Hierarchical mode, and so on may further be applied as the stream type.

As described above, "MPH" corresponds to the initials of "mobile", "pedestrian", and "handheld" and represents the opposite concept of a fixed-type system. Therefore, the MPH video stream: Non-hierarchical mode, the MPH audio stream: Non-hierarchical mode, the MPH Non-A/V stream: Non-hierarchical mode, the MPH High Priority video stream: Hierarchical mode, the MPH High Priority audio stream: Hierarchical mode, the MPH Low Priority video stream: Hierarchical mode, and the MPH Low priority audio stream: Hierarchical mode correspond to stream types that are applied when mobile broadcast programs are being transmitted and received. Also the Hierarchical mode and the Non-hierarchical mode each correspond to values that are used in stream types having different priority levels. Herein, the priority level is determined based upon a hierarchical structure applied in any one of the encoding or decoding method.

Therefore, when a hierarchical structure-type codec is used, a field value including the hierarchical mode and the non-hierarchical mode is respectively designated so as to identify each stream. Such stream type information is parsed by the SI and/or data decoder 6010, so as to be provided to the video and audio decoders 6004 and 6005. Thereafter, each of the video and audio decoders 6004 and 6005 uses the parsed stream type information in order to perform the decoding process. Other stream types that may be applied in the present invention may include MPEG 4 AUDIO, AC 3, AAC, AAC+, BSAC, HE AAC, AAC SBR, and MPEG-S for the audio data, and may also include MPEG 2 VIDEO, MPEG 4 VIDEO, H.264, SVC, and VC-1 for the video data.

Furthermore, in fields using the hierarchical mode and the non-hierarchical mode, such as the MPH video stream: Non-hierarchical mode and the MPH audio stream: Non-hierarchical mode, examples of using the MPEG 4 AUDIO, AC 3, AAC, AAC+, BSAC, HE AAC, AAC SBR, and MPEG-S for the audio data, and the MPEG 2 VIDEO, MPEG 4 VIDEO, H.264, SVC, and VC-1 for the video data may also be respectively used as replacements for each of the audio stream and the video stream may be considered as other embodiments of the present invention and may, therefore, be included in the scope of the present invention. Meanwhile, the stream_type field may be provided as one of the fields within the PMT. And, in this case, it is apparent that such stream_type field includes the above-described syntax. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.).

Finally, the DCCT/DCCSCT transmits information associated with automatic (or direct) channel change. And, the MGT transmits the versions and PID information of the above-mentioned tables included in the PSIP. Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the mobile service data, at least one of the PAT and PMT included in the PSI, and the VCT included in the PSIP is required. For example, the PAT may include the system information for transmitting the mobile service data, and the PID of the PMT corresponding to the mobile service data (or program number). The PMT may include the PID of the TS packet used for transmitting the mobile service data. The VCT may include information on the virtual channel for transmitting the mobile service data, and the PID of the TS packet for transmitting the mobile service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, when the mobile service data correspond to audio data and video data, it is preferable that the mobile service data included (or loaded) in a payload within a TS packet correspond to PES type mobile service data. According to another embodiment of the present invention, when the mobile service data correspond to the data for the data service (or data service data), the mobile service data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge the reception of the data broadcast program including mobile service data. At this point, the mobile service data may be transmitted by a data/object carousel method. The data/object carousel method corresponds to repeatedly transmitting identical data on a regular basis.

At this point, according to the control of the SI and/or data decoder 6010, the demultiplexer 6003 performs section filtering, thereby discarding repetitive sections and outputting only the non-repetitive sections to the SI and/or data decoder 6010. The demultiplexer 6003 may also output only the sections configuring desired tables (e.g., VCT or EIT) to the SI and/or data decoder 6010 by section filtering. Herein, the VCT or EIT may include a specific descriptor for the mobile service data. However, the present invention does not exclude the possibilities of the mobile service data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 6003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 6003 may output only an application information table (AIT) to the SI and/or data decoder 6010 by section filtering. The AIT includes information on an application being operated in the receiver for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 6011 by the SI and/or data decoder 6010.

The SI and/or data decoder 6010 parses the DSM-CC section configuring the demultiplexed mobile service data. Then, the mobile service data corresponding to the parsed result are stored as a database in the second memory 6011. The SI and/or data decoder 6010 groups a plurality of sections having the same table identification (table_id) so as to configure a table, which is then parsed. Thereafter, the parsed result is stored as a database in the second memory 6011. At this point, by parsing data and/or sections, the SI and/or data decoder 6010 reads all of the remaining actual section data that are not section-filtered by the demultiplexer 6003. Then, the SI and/or data decoder 6010 stores the read data to the second memory 6011. The second memory 6011 corresponds to a table and data/object carousel database storing system information parsed from tables and mobile service data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT. When the VCT is parsed, information on the virtual channel to which mobile service data are transmitted may be obtained.

Also, according to the present invention, the SI and/or data decoder 6010 parses the SLD of the VCT, thereby transmitting the stream type information of the corresponding elementary stream to the audio decoder 6004 or the video decoder 6005. In this case, the corresponding audio decoder

6004 or video decoder 6005 uses the transmitted stream type information so as to perform the audio or video decoding process. Furthermore, according to the present invention, the SI and/or data decoder 6010 parses an AC-3 audio descriptor, an MPEG 2 audio descriptor, an MPEG 4 audio descriptor, an AAC descriptor, an AAC+ descriptor, an HE AAC descriptor, an AAC SBR descriptor, an MPEG surround descriptor, a BSAC descriptor, an MPEG 2 video descriptor, an MPEG 4 video descriptor, an H.264 descriptor, an SVC descriptor, a VC-1 descriptor, and so on, of the EIT, thereby transmitting the audio or video codec information of the corresponding event to the audio decoder 6004 or video decoder 6005. In this case, the corresponding audio decoder 6004 or video decoder 6005 uses the transmitted audio or video codec information in order to perform an audio or video decoding process.

The obtained application identification information, service component identification information, and service information corresponding to the data service may either be stored in the second memory 6011 or be outputted to the data broadcasting application manager 6013. In addition, reference may be made to the application identification information, service component identification information, and service information in order to decode the data service data. Alternatively, such information may also prepare the operation of the application program for the data service. Furthermore, the SI and/or data decoder 6010 controls the demultiplexing of the system information table, which corresponds to the information table associated with the channel and events. Thereafter, an A/V PID list may be transmitted to the channel manager 6007.

The channel manager 6007 may refer to the channel map 6008 in order to transmit a request for receiving system-related information data to the SI and/or data decoder 6010, thereby receiving the corresponding result. In addition, the channel manager 6007 may also control the channel tuning of the tuner 6001. Furthermore, the channel manager 6007 may directly control the demultiplexer 6003, so as to set up the A/V PID, thereby controlling the audio decoder 6004 and the video decoder 6005.

The audio decoder 6004 and the video decoder 6005 may respectively decode and output the audio data and video data demultiplexed from the main service data packet. Alternatively, the audio decoder 6004 and the video decoder 6005 may respectively decode and output the audio data and video data demultiplexed from the mobile service data packet. Meanwhile, when the mobile service data include data service data, and also audio data and video data, it is apparent that the audio data and video data demultiplexed by the demultiplexer 6003 are respectively decoded by the audio decoder 6004 and the video decoder 6005. For example, an audio-coding (AC)-3 decoding algorithm, an MPEG-2 audio decoding algorithm, an MPEG-4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied to the audio decoder 6004. Also, an MPEG-2 video decoding algorithm, an MPEG-4 video decoding algorithm, an H.264 decoding algorithm, an SVC decoding algorithm, and a VC-1 decoding algorithm may be applied to the video decoder 6005. Accordingly, the decoding process may be performed.

Meanwhile, the native TV application manager 6006 operates a native application program stored in the first memory 6009, thereby performing general functions such as channel change. The native application program refers to software stored in the receiving system upon shipping of the product. More specifically, when a user request (or command) is transmitted to the receiving system through a user interface (UI), the native TV application manger 6006 displays the user request on a screen through a graphic user interface (GUI), thereby responding to the user's request. The user interface receives the user request through an input device, such as a remote controller, a key pad, a jog controller, an a touchscreen provided on the screen, and then outputs the received user request to the native TV application manager 6006 and the data broadcasting application manager 6013. Furthermore, the native TV application manager 6006 controls the channel manager 6007, thereby controlling channel-associated operations, such as the management of the channel map 6008, and controlling the SI and/or data decoder 6010. The native TV application manager 6006 also controls the GUI of the overall receiving system, thereby storing the user request and status of the receiving system in the first memory 6009 and restoring the stored information.

The channel manager 6007 controls the tuner 6001 and the SI and/or data decoder 6010, so as to managing the channel map 6008 so that it can respond to the channel request made by the user. More specifically, channel manager 6007 sends a request to the SI and/or data decoder 6010 so that the tables associated with the channels that are to be tuned are parsed. The results of the parsed tables are reported to the channel manager 6007 by the SI and/or data decoder 6010. Thereafter, based on the parsed results, the channel manager 6007 updates the channel map 6008 and sets up a PID in the demultiplexer 6003 for demultiplexing the tables associated with the data service data from the mobile service data.

The system manager 6012 controls the booting of the receiving system by turning the power on or off. Then, the system manager 6012 stores ROM images (including downloaded software images) in the first memory 6009. More specifically, the first memory 6009 stores management programs such as operating system (OS) programs required for managing the receiving system and also application program executing data service functions. The application program is a program processing the data service data stored in the second memory 6011 so as to provide the user with the data service. If the data service data are stored in the second memory 6011, the corresponding data service data are processed by the above-described application program or by other application programs, thereby being provided to the user. The management program and application program stored in the first memory 6009 may be updated or corrected to a newly downloaded program. Furthermore, the storage of the stored management program and application program is maintained without being deleted even if the power of the system is shut down. Therefore, when the power is supplied, the programs may be executed without having to be newly downloaded once again.

The application program for providing data service according to the present invention may either be initially stored in the first memory 6009 upon the shipping of the receiving system, or be stored in the first memory 6009 after being downloaded. The application program for the data service (i.e., the data service providing application program) stored in the first memory 6009 may also be deleted, updated, and corrected. Furthermore, the data service providing application program may be downloaded and executed along with the data service data each time the data service data are being received.

When a data service request is transmitted through the user interface, the data broadcasting application manager 6013 operates the corresponding application program stored in the first memory 6009 so as to process the requested data, thereby providing the user with the requested data service. And, in order to provide such data service, the data broadcasting application manager 6013 supports the graphic user interface (GUI). Herein, the data service may be provided in the form of text (or short message service (SMS)), voice message, still image, and moving image. The data broadcasting application manager 6013 may be provided with a platform for executing the application program stored in the first memory 6009. The platform may be, for example, a Java virtual machine for executing the Java program. Hereinafter, an example of the data broadcasting application manager 6013 executing the data service providing application program stored in the first memory 6009, so as to process the data service data stored in the second memory 6011, thereby providing the user with the corresponding data service will now be described in detail.

Assuming that the data service corresponds to a traffic information service, the data service according to the present invention is provided to the user of a receiver that is not equipped with an electronic map and/or a GPS system in the form of at least one of a text (or short message service (SMS)), a voice message, a graphic message, a still image, and a moving image. In this case, when a GPS module 6020 is mounted on the receiving system, as shown in FIG. 34, the GPS module 6020 receives satellite signals transmitted from a plurality of low earth orbit satellites and extracts the current position (or location) information (e.g., longitude, latitude, altitude), thereby outputting the extracted information to the data broadcasting application manager 6013.

At this point, it is assumed that the electronic map including information on each link and nod and other diverse graphic information are stored in one of the second memory 6011, the first memory 6009, and another memory that is not shown. More specifically, according to the request made by the data broadcasting application manager 6013, the data service data stored in the second memory 6011 are read and inputted to the data broadcasting application manager 6013. The data broadcasting application manager 6013 translates (or deciphers) the data service data read from the second memory 6011, thereby extracting the necessary information according to the contents of the message and/or a control signal. In other words, the data broadcasting application manager 6013 uses the current position information and the graphic information, so that the current position information can be processed and provided to the user in a graphic format.

Figure 35:
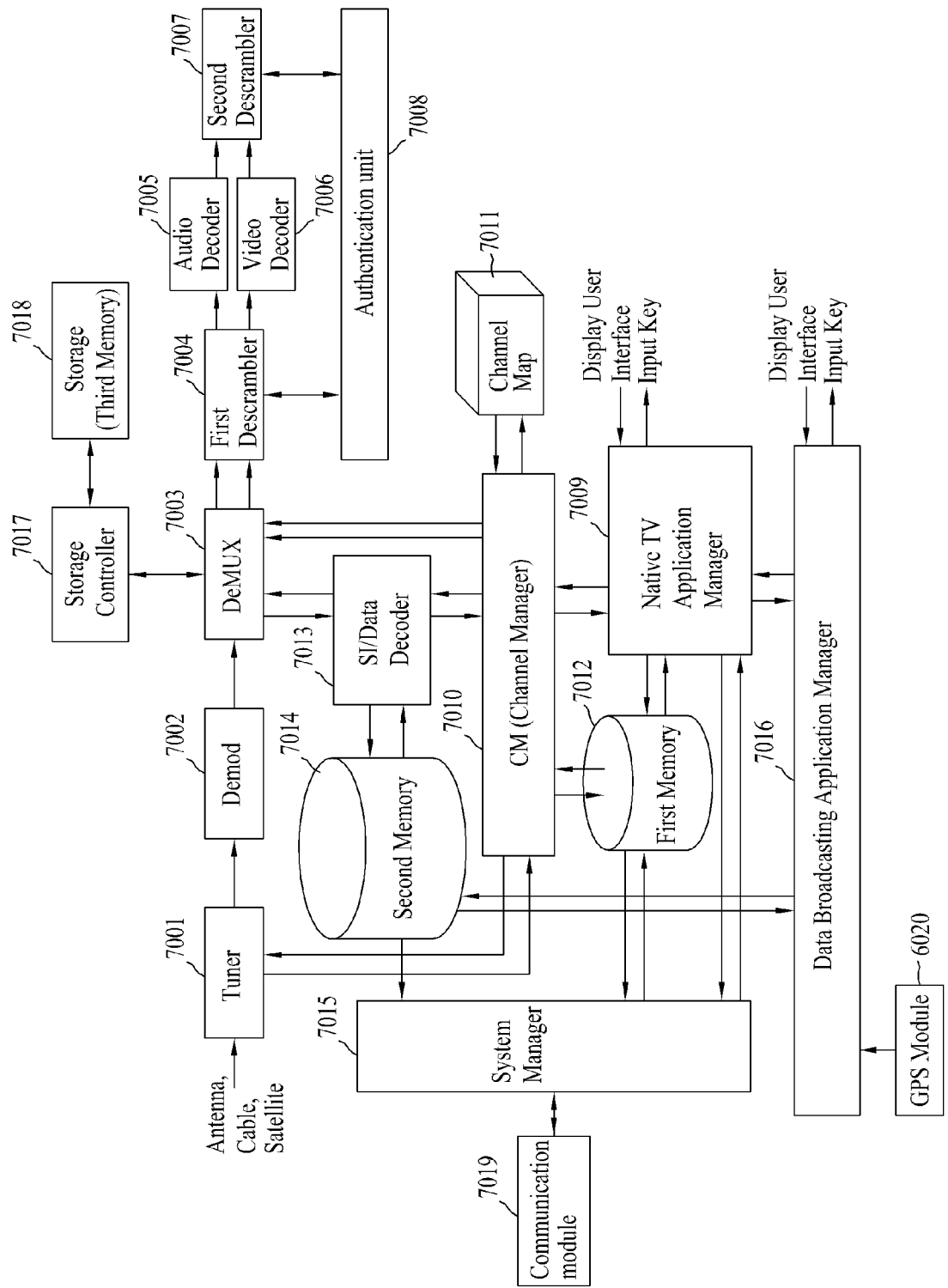
FIG. 35 illustrates a block diagram of a receiving system according to another embodiment of the present invention.

FIG. 35 illustrates a block diagram showing the structure of a digital broadcast (or television) receiving system according to another embodiment of the present invention. Referring to FIG. 35, the receiving system includes a tuner 7001, a demodulating unit 7002, a demultiplexer 7003, a first descrambler 7004, an audio decoder 7005, a video decoder 7006, a second descrambler 7007, an authentication unit 7008, a native TV application manager 7009, a channel manager 7010, a channel map 7011, a first memory 7012, a data decoder 7013, a second memory 7014, a system manager 7015, a data broadcasting application manager 7016, a storage controller 7017, a third memory 7018, a telecommunication module 7019, and a GPS module 7020. Herein, the third memory 7018 is a mass storage device, such as a hard disk drive (HDD) or a memory chip. Also, during the description of the digital broadcast (or television or DTV) receiving system shown in FIG. 35, the components that are identical to those of the receiving system of FIG. 34 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 7004 and 7007, and the authentication means will be referred to as an authentication unit 7008. Such naming of the corresponding components is merely exemplary and is not limited to the terms suggested in the description of the present invention. For example, the units may also be referred to as a decryptor. Although FIG. 35 illustrates an example of the descramblers 7004 and 7007 and the authentication unit 7008 being provided inside the receiving system, each of the descramblers 7004 and 7007 and the authentication unit 7008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 7008, the scrambled broadcasting contents are descrambled by the descramblers 7004 and 7007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 7008 and the descramblers 7004 and 7007 will now be described in detail. The receiving system receives the scrambled broadcasting contents through the tuner 7001 and the demodulating unit 7002. Then, the system manager 7015 decides whether the received broadcasting contents have been scrambled. Herein, the demodulating unit 7002 may be included as a demodulating means according to embodiment of the present invention as described in FIG. 27 and FIG. 31 to FIG. 33. However, the present invention is not limited to the examples given in the description set forth herein. If the system manager 7015 decides that the received broadcasting contents have been scrambled, then the system manager 7015 controls the system to operate the authentication unit 7008. As described above, the authentication unit 7008 performs an authentication process in order to decide whether the receiving system according to the present invention corresponds to a legitimate host entitled to receive the paid broadcasting service. Herein, the authentication process may vary in accordance with the authentication methods.

For example, the authentication unit 7008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 7008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 7008 performs the authentication process by determining the conformity between the address of the corresponding receiving system and the system information of the receiving system that is mapped with the IP address. In other words, if the authentication unit 7008 determines that the two types of information conform to one another, then the authentication unit 7008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 7008 of the receiving system extracts the identification information of the receiving system and the identification information included in the EMM of the broadcasting service that is being received. Then, the authentication unit 7008 determines whether the identification information conform to each other, so as to perform the authentication process. More specifically, if the authentication unit 7008 determines that the information conform to each other, then the authentication unit 7008 eventually determines that the receiving system is entitled to receive the request broadcasting service.

In yet another example, the authentication unit 7008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 7015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 7015 transmits the payment information to the remote transmitting system through the telecommunication module 7019.

The authentication unit 7008 authenticates the corresponding receiving system and/or the external module. Then, if the authentication process is successfully completed, the authentication unit 7008 certifies the corresponding receiving system and/or the external module as a legitimate system and/or module entitled to receive the requested paid broadcasting service. In addition, the authentication unit 7008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 7008, the receiving system may descramble the scrambled broadcasting contents received from the transmitting system. At this point, the descrambling process is performed by the first and second descramblers 7004 and 7007. Herein, the first and second descramblers 7004 and 7007 may be included in an internal module or an external module of the receiving system.

The receiving system is also provided with a common interface for communicating with the external module including the first and second descramblers 7004 and 7007, so as to perform the descrambling process. More specifically, the first and second descramblers 7004 and 7007 may be included in the module or in the receiving system in the form of hardware, middleware or software. Herein, the descramblers 7004 and 7007 may be included in any one of or both of the module and the receiving system. If the first and second descramblers 7004 and 7007 are provided inside the receiving system, it is advantageous to have the transmitting system (i.e., at least any one of a service provider and a broadcast station) scramble the corresponding data using the same scrambling method.

Alternatively, if the first and second descramblers 7004 and 7007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 7015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 7012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 7008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 7008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 7015, then the memory card is verified and determined to be a normal memory card that may be used in the receiving system. At this point, the CAS software may either be installed in the first memory 7012 upon the shipping of the present invention, or be downloaded to the first memory 7012 from the transmitting system or the module or memory card, as described above. Herein, the descrambling function may be operated by the data broadcasting application manger 7016 as an application program.

Thereafter, the CAS software parses the EMM/ECM packets outputted from the demultiplexer 7003, so as to verify whether the receiving system is entitled to receive the corresponding data, thereby obtaining the information required for descrambling (i.e., the CW) and providing the obtained CW to the descramblers 7004 and 7007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 7004 and 7007. Each of the descramblers 7004 and 7007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 7004 and 7007 may be included in the module either in the form of hardware or in the form of software. In this case, the scrambled data that being received are descrambled by the module and then demodulated. Also, if the scrambled data that are being received are stored in the third memory 7018, the received data may be descrambled and then stored, or stored in the memory at the point of being received and then descrambled later on prior to being played (or reproduced). Thereafter, in case scramble/descramble algorithms are provided in the storage controller 7017, the storage controller 7017 scrambles the data that are being received once again and then stores the re-scrambled data to the third memory 7018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 7019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 7019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 7019 may also be configured. Also, the PDU may be configured in the Java application of the receiving system and then outputted to the telecommunication module 7019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 7019.

The broadcasting data being transmitted and received through the above-described wireless data network may include data required for performing the function of limiting data reception. Meanwhile, the demultiplexer 7003 receives either the real-time data outputted from the demodulating unit 7002 or the data read from the third memory 7018, thereby performing demultiplexing. In this embodiment of the present invention, the demultiplexer 7003 performs demultiplexing on the enhanced data packet. Similar process steps have already been described earlier in the description of the present invention. Therefore, a detailed of the process of demultiplexing the enhanced data will be omitted for simplicity.

The first descrambler 7004 receives the demultiplexed signals from the demultiplexer 7003 and then descrambles the received signals. At this point, the first descrambler 7004 may receive the authentication result received from the authentication unit 7008 and other data required for the descrambling process, so as to perform the descrambling process. The audio decoder 7005 and the video decoder 7006 receive the signals descrambled by the first descrambler 7004, which are then decoded and outputted. Alternatively, if the first descrambler 7004 did not perform the descrambling process, then the audio decoder 7005 and the video decoder 7006 directly decode and output the received signals. In this case, the decoded signals are received and then descrambled by the second descrambler 7007 and processed accordingly.

As described above, the digital broadcasting system and data processing method according to the present invention have the following advantages. More specifically, the digital broadcasting system and data processing method according to the present invention is robust against (or resistant to) any error that may occur when transmitting mobile service data through a channel. And, the present invention is also highly compatible to the conventional system. Moreover, the present invention may also receive the mobile service data without any error even in channels having severe ghost effect and noise.

By inserting known data in specific positions (or places) within a data region, the present invention may enhance the receiving performance of the receiving system in an environment undergoing frequent channel changes.

Also, by diversifying and transmitting mobile service data by time and/or frequency, the present invention is made to be more robust against the burst noise than that of the related art.

Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system comprising:
   a receiving unit configured to receive a broadcast signal comprising data groups composed of data blocks, the data groups comprising first mobile service data, second mobile service data, signaling information and known data sequences;
   a demodulator configured to demodulate the received broadcast signal;
   a signaling decoder configured to decode the signaling information from the demodulated broadcast signal;
   a block decoder configured to turbo-decode at least the first or second mobile service data from the demodulated broadcast signal; and
   a Reed-Solomon (RS) frame decoder configured to:
      build an RS frame comprising the turbo-decoded at least the first or second mobile service data; and
      perform error-correction decoding on the built RS frame, wherein:
   the first mobile service data are received via a first frequency;
   the second mobile service data are received via a second frequency that is different from the first frequency; and
   the signaling information is included in a fourth data block of the data blocks and comprises a first-assigned data group number for a plurality of data groups.

2. The receiving system of claim 1, wherein the block decoder comprises:
   at least one input buffer configured to:
      store at least the first or second mobile service data, and
      repeatedly output the stored at least the first or second mobile service data in block sizes for turbo-decoding;
   at least one inner decoder configured to:
      match corresponding data of the at least the first or second mobile service data being turbo-decoded with data being output from the corresponding input buffer, and
      perform trellis decoding on the matched data;
   at least one symbol deinterleaver configured to block-interleave in symbol units soft-decision values of the trellis-decoded data;
   an outer symbol mapper configured to group the block-interleaved soft-decision values from the at least one symbol deinterleaver into a single soft-decision value;
   an outer decoder configured to receive the single soft-decision value from the outer symbol mapper and perform symbol decoding on the received single soft-decision value;
   at least one inner symbol mapper configured to divide the symbol-decoded single soft-decision value from the outer decoder into two or more soft-decision values and convert the divided soft-decision values into an input format of the at least one inner decoder;
   at least a symbol interleaver configured to block-interleave in symbol units the converted soft-decision values from the at least one inner symbol mapper and output the block-interleaved data to the at least one inner decoder; and
   an output buffer configured to store data corresponding to the symbol-decoded single soft-decision value from the outer decoder and output the stored data.

3. The receiving system of claim 2, wherein the at least one inner decoder is further configured to:
   match the turbo-decoded data and the data output from the at least one input buffer to a same position within a corresponding block, and
   perform turbo-decoding on the matched data.

4. The receiving system of claim 2, further comprising:
   at least one feedback formatter configured to output null data instead of data output from the at least one symbol deinterleaver to the at least one inner decoder when the data output from the at least one input buffer to the at least one inner decoder do not correspond to the first or second mobile service data.

5. The receiving system of claim 4, wherein the at least one feedback formatter is further configured to output the null data at the beginning of a first decoding process instead of data output from the at least one symbol interleaver to the at least one inner decoder when the block size data are turbo-decoded.

6. The receiving system of claim 1, wherein:
   at least the first or second mobile service data are encoded at a coding rate of 1/N;
   N is an integer; and
   the 1/N-rate encoded at least first or second mobile service data are divided into the received first and second mobile service data.

7. The receiving system of claim 1, wherein the first mobile service data and the second mobile service data are identical.

8. The receiving system of claim 1, wherein the first mobile service data and the second mobile service data are different.

9. The receiving system of claim 1, wherein:
   the known data sequences comprise a first, a second, a third, a fourth, a fifth and a sixth known data sequence; and
   the first, third, fourth, fifth and sixth known data sequences are spaced 16 segments apart.

10. The receiving system of claim 9, wherein:
    the second known data sequence includes a first K-symbol sequence and a second K-symbol sequence; and
    the first and second K-symbol sequences comprise a first pattern.

11. The receiving system of claim 10, wherein:
    the first, third, fourth, fifth and sixth known data sequences include an M-symbol sequence;
    the M-symbol sequence comprises a second pattern that is different from the first pattern; and
    a value of M is greater than a value of K.

12. The receiving system of claim 9, further comprising an equalizer configured to equalize the demodulated broadcast signal according to the first, third, fourth, fifth and sixth known data sequences of the known data sequences.

13. A data processing method of a receiving system, the method comprising:
    receiving a broadcast signal comprising data groups composed of data blocks, the data groups comprising first mobile service data, second mobile service data, signaling information and known data sequences;
    demodulating the received broadcast signal;
    decoding the signaling information in the demodulated broadcast signal;
    turbo-decoding at least the first or second mobile service data from the demodulated broadcast signal;

building a Reed-Solomon (RS) frame including the turbo-decoded at least the first or second mobile service data; and performing error-correction decoding on the built RS frame, wherein:

the first mobile service data are received via a first frequency;

the second mobile service data are received via a second frequency other than the first frequency; and the signaling information is included in a fourth data block of the data blocks and comprises a first-assigned data group number for a plurality of data groups.

14. The method of claim 13, wherein:

at least the first or second mobile service data are encoded at a coding rate of 1/N N is an integer; and the 1/N-rate encoded mobile service data divided into the received first and second mobile service data.

15. The method of claim 13, wherein the first mobile service data and the second mobile service data are identical.

16. The method of claim 13, wherein the first mobile service data and the second mobile service data are different.

17. The method of claim 13, wherein:

the known data sequences comprise a first, a second, a third, a fourth, a fifth and a sixth known data sequence; and the first, third, fourth, fifth and sixth known data sequences are spaced 16 segments apart.

18. The method of claim 17, wherein:

the second known data sequence includes a first K-symbol sequence and a second K-symbol sequence; and the first and second K-symbol sequences comprise a first pattern.

19. The method of claim 18, wherein:

the first, third, fourth, fifth and sixth known data sequences include an M-symbol sequence;

the M-symbol sequence comprises a second pattern that is different from the first pattern; and a value of M is greater than a value of K.

20. The method of claim 17 further comprising equalizing the demodulated broadcast signal according to the first, third, fourth, fifth and sixth known data sequences of the known data sequences.

* * * * *